(12) United States Patent
Nagumo

(10) Patent No.: US 8,723,903 B2
(45) Date of Patent: May 13, 2014

(54) DRIVE DEVICE, LED ARRAY, LED HEAD, AND IMAGE FORMING APPARATUS PROVIDED THEREWITH

(75) Inventor: Akira Nagumo, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 13/412,721

(22) Filed: Mar. 6, 2012

(65) Prior Publication Data

US 2012/0163868 A1 Jun. 28, 2012

Related U.S. Application Data

(62) Division of application No. 11/987,719, filed on Dec. 4, 2007, now Pat. No. 8,149,259.

(30) Foreign Application Priority Data

Dec. 5, 2006 (JP) ................................. 2006-328494

(51) Int. Cl.
*B41J 2/385* (2006.01)
*B41J 2/00* (2006.01)

(52) U.S. Cl.
USPC ............................ 347/148; 347/130; 347/132

(58) Field of Classification Search
USPC .......................................... 347/130, 132, 148
See application file for complete search history.

(56) References Cited

U.S. PATENT DOCUMENTS

| | | | |
|---|---|---|---|
| 5,097,271 A * | 3/1992 | Lee et al. | 347/209 |
| 5,126,759 A | 6/1992 | Small et al. | |
| 5,532,723 A * | 7/1996 | Nagahata et al. | 347/209 |
| 6,028,472 A | 2/2000 | Nagumo | |
| 6,297,842 B1 * | 10/2001 | Koizumi et al. | 347/237 |
| 7,136,086 B2 | 11/2006 | Omae | |
| 2001/0048459 A1* | 12/2001 | Sakai et al. | 347/233 |
| 2006/0268094 A1* | 11/2006 | Shintani | 347/203 |

FOREIGN PATENT DOCUMENTS

| | | |
|---|---|---|
| EP | 581330 B1 | 3/1996 |
| JP | 06-021512 A | 1/1994 |
| JP | 07-302812 A | 11/1995 |
| JP | 10-035011 | 2/1998 |
| JP | 2001-138567 | 5/2001 |
| JP | 2003-025634 A | 1/2003 |
| JP | 2003-054041 A | 2/2003 |
| JP | 2004-071684 A | 3/2004 |

* cited by examiner

*Primary Examiner* — Alessandro Amari
*Assistant Examiner* — Kendrick Liu
(74) *Attorney, Agent, or Firm* — Rabin & Berdo, P.C.

(57) ABSTRACT

A drive device for outputting a drive signal for driving a plurality of light emitting elements time-divisionally, the drive device includes a plurality of input terminals receiving input of a drive control signal for the light emitting elements, and a plurality of output terminals connected to the light emitting elements, for outputting the drive signal based on the drive control signal input into the input terminals, in which the input terminals and the output terminals are arranged substantially in a line.

23 Claims, 48 Drawing Sheets

DRIVE DEVICE, LED ARRAY, LED HEAD, AND IMAGE FORMING APPARATUS PROVIDED THEREWITH

CROSS-REFERENCE TO RELATED APPLICATIONS

This application is a divisional of application Ser. No. 11/987,719, filed on Dec. 4, 2007. Furthermore, this application claims the benefit of priority of Japanese application 2006-328494, filed Dec. 5, 2006. The disclosures of these prior U.S. and Japanese applications are incorporated herein by reference.

BACKGROUND OF THE INVENTION

1. Field of the Invention

The present invention relates to a drive device, an LED array, an LED head, and an image forming apparatus provided therewith.

2. Description of Related Art

Conventionally, an electrophotographic image forming apparatus such as a printer is provided with an exposure head having a plurality of pairs of light-emitting element array chips and corresponding drive devices, the light-emitting element being manufactured by arranging a plurality of arrays of light-emitting elements such as an LED (Light Emitting Diode) or the like. Arrays of the light-emitting array chips and the drive devices are arranged in a direction perpendicular to a direction of array of drive elements to reduce the entire size of the exposure head.

This type of image forming apparatus is required to improve image quality in recent years, followed by high-density mounting of light-emitting elements and drive elements, leading to further narrowing of a pitch between electrode pads for the purpose of connection between the light-emitting elements and the drive elements. Japanese Unexamined Patent Application Publication Nos. 2001-138567 and H10-35011 disclose a light-emitting element array or a drive circuit such as described above.

To be more specific, drive circuits described in Japanese Unexamined Patent Application Publication No. 2001-138567 are structured such that drive devices are provided at one end with electrode pads for connecting the drive devices to light-emitting element arrays, and at the other end with electrode pads for a power source, control signals, and the like in order to provide intervals for wire bonding or the like.

Light-emitting element arrays described in Japanese Unexamined Patent Application Publication No. H10-35011 are structured to decrease the number of electrode pads by forming in a matrix form, wires for connecting drive circuits to an anode terminal side of or a cathode terminal side of light-emitting array chips. The light-emitting element arrays are also structured such that only a target light-emitting element is driven under control of each corresponding drive circuit.

The art described above accomplishes narrowing of a pitch between the electrode pads in a direction of arrays of the light-emitting elements but has problems in that downsizing cannot be achieved in a direction perpendicular to a direction of light-emitting element arrays and arrays of the drive devices, that is, perpendicular to a direction of arrays of the drive elements.

The present invention has been made in consideration of the above situation, and has as its object to achieve downsizing of a drive device, an LED array, an LED head, and an image apparatus provided therewith by achieving downsizing in a direction perpendicular to a direction of the of the light-emitting element arrays in the drive circuit as described above.

SUMMARY OF THE INVENTION

According to one aspect of the present invention, a drive device, which outputs a drive signal for driving a plurality of light emitting elements time-divisionally, includes a plurality of input terminals receiving input of a drive control signal for the light emitting elements, and a plurality of output terminals connected to the light emitting elements, for outputting the drive signal based on the drive control signal input into the input terminals. The input terminals and the output terminals are arranged substantially in a line.

With this structure, since the input terminals and the output terminals are arranged substantially in a line, a substrate to be provided with the drive device is shortened in a direction of short sides by the length corresponding to the width of the input terminal or the output terminal.

According to the present invention, the drive device can be downsized as a whole in the direction perpendicular to the direction of the light-emitting element arrays.

BRIEF DESCRIPTION OF THE DRAWINGS

This invention may take physical form in certain parts and arrangements of parts, a preferred embodiment and method of which will be described in detail in this specification and illustrated in the accompanying drawings which form a part hereof, and wherein.

DESCRIPTION OF THE PREFERRED EMBODIMENTS

Hereinafter, detailed embodiments of this invention will be explained with reference to the drawings.

Figure 1:
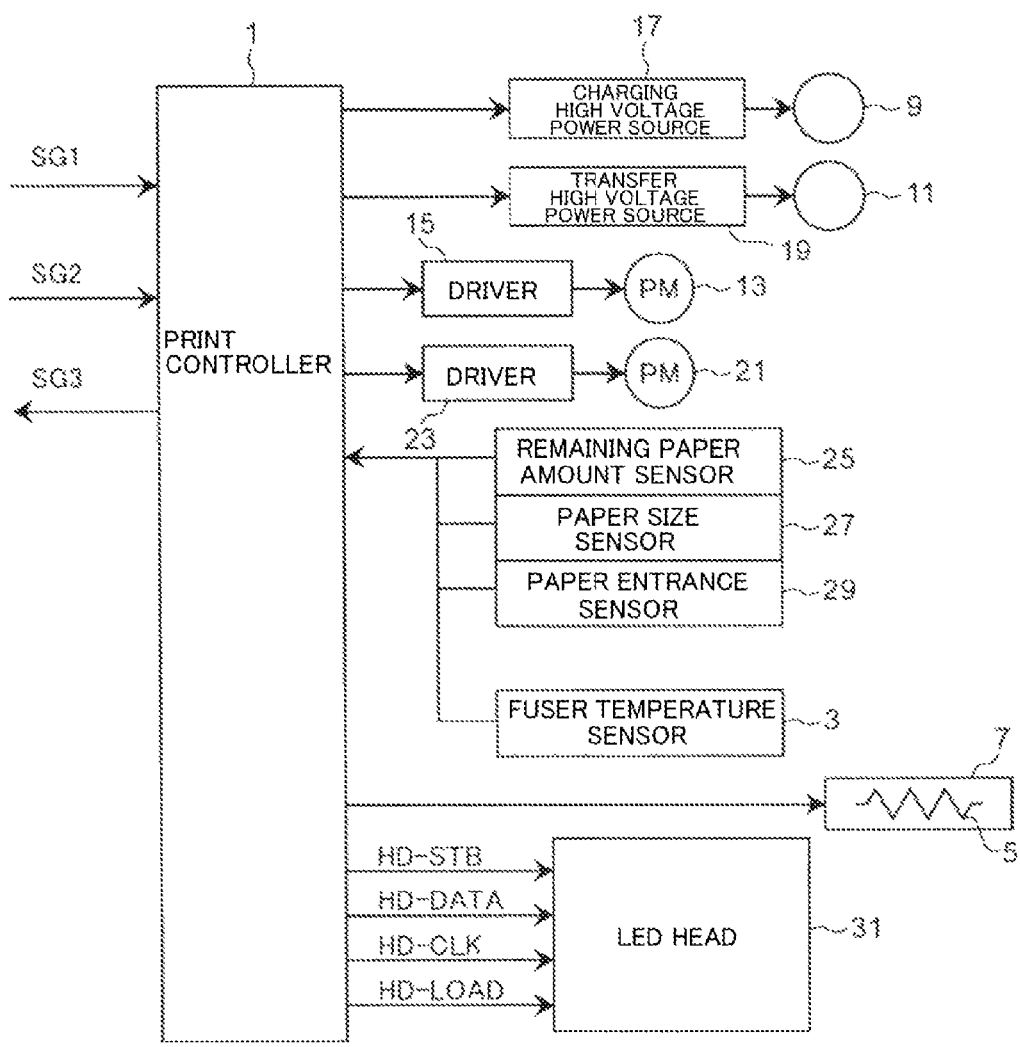
FIG. 1 is a block diagram of an image forming apparatus according to a first embodiment, for illustrating a structure of the image forming apparatus.

An image forming apparatus according to a first embodiment, as shown in FIG. 1, has a print controller 1. The print controller 1 receives image information from an information processing apparatus, not shown, and controls each unit to form images on a paper based on the image information. The print controller 1 is composed of a microprocessor, a ROM (Read Only Memory), a RAM (Random Access Memory), an input/output port, a timer, and the like. The print controller 1 executes overall sequenced control of the image forming apparatus based on a control signal SG1 input from the information processing apparatus, not shown, and a video signal SG2 composed of a one-dimensional arrangement of bitmap data. Specifically, the print controller 1 uses a fuser temperature sensor 3 to detect a surface temperature of a fuser 7 housing a heater 5 based on the control signal SG1. The print controller 1 maintains the surface temperature of the fuser 7 at a temperature at which a developer image can be fused to the paper serving as a recording medium by turning the heater 5 on or off based on the detected temperature.

The image forming apparatus has a develop/transfer process motor 13 for driving a charge roller 9 for charging an image carrier, not shown, and a transfer unit 11 for transferring a developed developer image onto the paper. The develop/transfer process motor 13 serves as a drive source for inputting driving force into each unit composing the charge roller 9 and the transfer unit 11. The develop/transfer process motor 13 is driven under control of a driver 15. The driver 15 controls the driving of the develop/transfer process motor 13 under control of the print controller 1. To be more specific, the print controller 1 drives the develop/transfer process motor 13 via the driver 15 and also charges the charge roller 9 using a high voltage power source 17 for use in charging the charge roller 9. At this time, the print controller 1 charges the transfer unit 11 using a high voltage power source 10 for use in charging the transfer unit 19.

The image forming apparatus has a paper feeding motor 21 for inputting driving force into each unit for feeding the paper along a predetermined medium feeding path. The paper feeding motor 21 is driven under control of a driver 23. The driver 23 drives the paper feeding motor 21 under control of the print controller 1. To be more specific, the print controller 1 detects a remaining amount of papers stacked on a stacker, not shown, using a remaining paper amount sensor 25, and detects a size of the paper using a paper size sensor 27. The print controller 11 then determines as to the presence and the size of the paper based on the detection results and feeds the paper along the medium feeding path by driving the paper feeding motor 21 using the driver 23. Where the paper is conveyed up to a paper entrance sensor 29, the print controller 1 measures a timing at which the paper passes between a development device, not shown, for performing a development process and the transfer unit 11 based on the detection result of the paper entrance sensor 29. Based on the measured result, the print controller 1 sends a timing signal SG3 requesting input of the video signal SG2 to the information processing apparatus that input the control signal SG1.

Upon input of the video signal SG2 from the information processing apparatus, the print controller 1 generates a printing data signal HD-DATA based on the video signal SG2 and inputs the printing data signal HD-DATA into an LED head 31 for exposing the image carrier, not shown, to form the latent image thereon based on the video signal SG2. Herein, the video signal SG2 input from the information processing apparatus is defined as a video signal corresponding to a single line of a developer image to be printed on the paper. The information processing apparatus sends the video signal SG2 corresponding to the single line of the developer image to the image forming apparatus at each time of receiving the timing signal SG3 sent from the image forming apparatus.

The LED head 31 is formed by arranging a plurality of LED elements in a line, in which each of the LED elements corresponds to a one-dot latent image formed by exposing the image carrier. Where the video signal SG2 is input into the print controller 1, the print controller 1 generates the printing data signal HD-DATA based on the video signal SG2 and inputs this signal into the LED head 31. The print controller 1 inputs the printing data signal HD-DATA into the LED head 31 and also inputs a latch signal HD-LOAD into the LED head 31.

After latching the printing data signal HD-DATA into the LED head 31 based on the latch signal HD-LOAD, the print controller 1 controls light emission by the LED elements, described later, provided to the LED head 31 by inputting a negative logic strobe signal HD-STB-N into the LED head 31.

As described above, where the LED elements, described later, provided to the LED head 31 emit light to expose the image carrier to form the electrostatic latent image thereon, a developing device, not shown, affixes developer having been applied with a predetermined bias voltage onto the electrostatic latent image to develop a developer image on the image carrier. The transfer unit 11 transfers the developer image having been developed on the image carrier onto the paper.

The paper is thereafter fed to the fuser 7 disposed downstream in the medium feeding path. The fuser 7 melts the developer image having been transferred onto the paper, using heat generated by the heater 5, thereby fusing the developer image onto the paper. The paper having the developer image fused onto a surface thereof is then fed further downstream in the medium feeding path and ejected onto the stacker, not shown, thereby being provided to a user.

Hereinafter, a structure of the LED head 31 will be described in detail.

The LED head 31 has, for example, a 600 dpi (dots per inch) resolution that can perform exposure enough to form the electrostatic latent image corresponding to a paper size of A4. The LED head 31 is composed of 4992 LED elements arranged in an array forma. For convenience of explanation, the following is a detailed description of a structure of the partial LED head 31.

Figure 2:
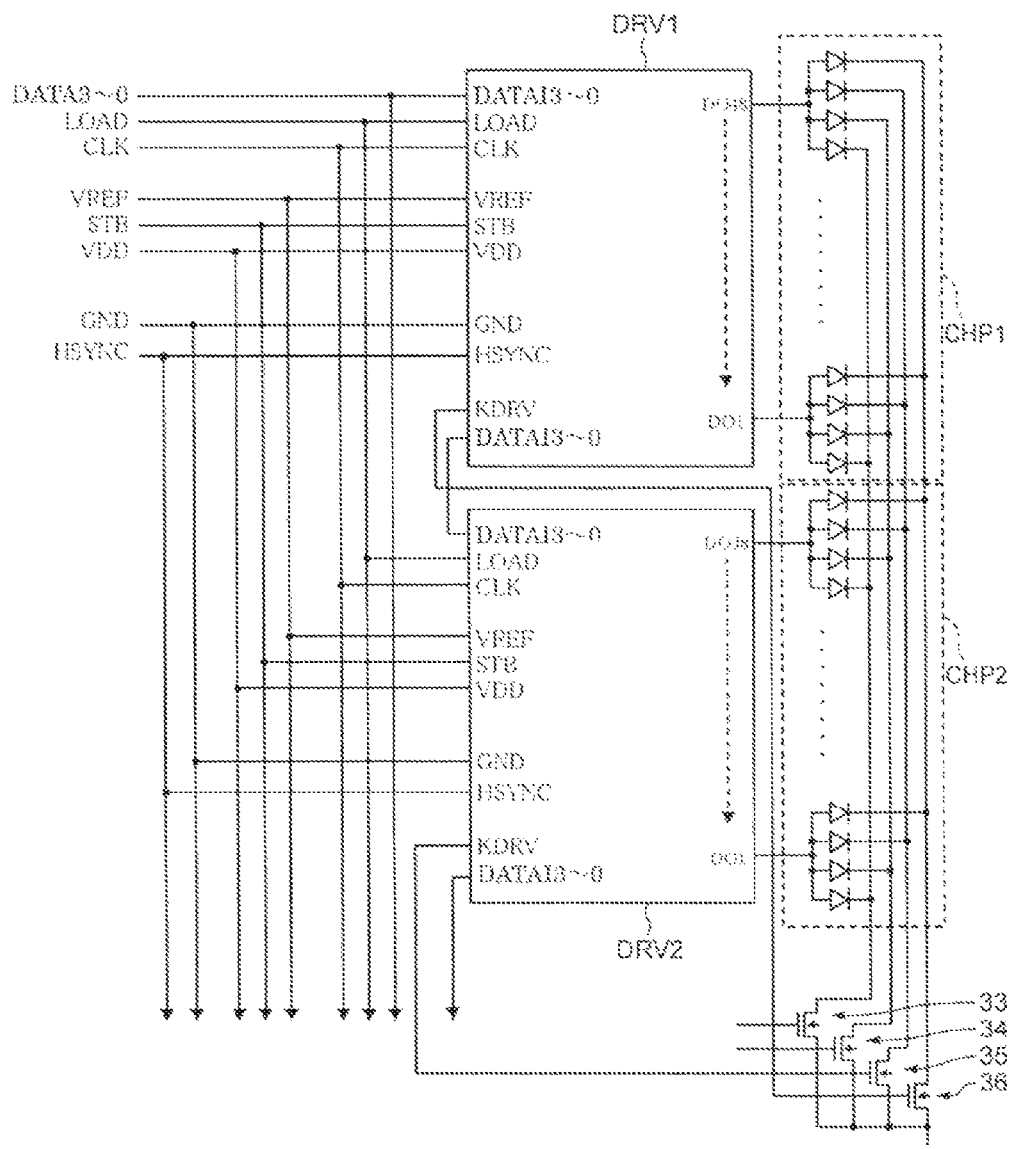
FIG. 2 is a block diagram of an LED head of the image forming apparatus, for illustrating a structure of the LED head.

As shown in FIG. 2, the LED head 31 is provided with LED chips CHP1, CHP2, . . . , CHP 26 each composed of LED elements in an array form. The 192 LED elements, LED1, LED2, . . . , LED 192, for example, are arranged in each single LED chip CHP1, CHP2, . . . , CHP 26, and the LED head 31 is provided with, for example, 26 such LED chips. Furthermore, the LED head 31 is provided with 26 driver ICs DRV1, DRV2, . . . , DRV26 serving as drive devices for independently controlling each of the LED chips CHP1, CHP2, . . . , CHP 26.

The driver ICs DRV1, DRV2, . . . , DRV26 receive the printing data signal SG1 input from the print controller 1 and drive the LED elements LED1, LED2, . . . , LED 192 time-divisionally based on a clock signal HD-CLK input from the print controller 1. The LED elements LED1, LED2, . . . , LED 192 are disposed on a predetermined print wire substrate with equal pitches in a main scanning direction of the LED head 31. The driver ICs DRV1, DRV2, . . . , DRV26 are composed of substantially identical circuits, and each of the driver ICs DRV1, DRV2, . . . , DRV26 is connected to the adjacent driver IC in a cascading manner. The driver ICs DRV1, DRV2, . . . , DRV26 are each provided with a terminal HSYNC, a terminal CLK, a terminal LOAD, a terminal STB, and a terminal VREF into which a synchronization signal HD-HSYNC, the clock signal HD-CLK, the latch signal HD-LOAD, the strobe signal HD-STB, and a reference voltage VREF are input respectively from the print controller 1.

The video signal SG1 to be input into the driver IC DRV1 is composed of printing data signals HD-DATA3~0, and the print controller 1 inputs these printing data signals HD-DATA3~0 into the driver IC DRV1 through terminals DATAI3~0. The input printing data signals HD-DATA3~0 are input through four data lines and pieces of the printing data corresponding four dots are concurrently shifted into the driver IC DRV1 based on the clock signal HD-CLK. Terminals KDRV through which the driver ICs DRV1, DRV2 output the signals are connected to gate electrodes of N-type MOS (Metal-Oxide Semiconductor) transistors 33, 34, 35, 36. The N-type MOS (Metal-Oxide Semiconductor) transistors 33, 34, 35, 36 divide the LED elements LED1, LED2, . . . , LED192 substantially into four groups and also serve as a switching section for performing time-divisional driving.

To be more specific, described in the first embodiment is a structure in which the LED elements LED1, LED2, . . . , LED192 are divided into and driven in four groups, i.e., a first group composed of LED elements LED1, LED5, . . . , LED 185, LED189 being numbered beginning at the top in a data shift direction; a second group composed of a second group is composed of LED elements LED2, LED6, . . . , LED 186, LED190; a third group composed of LED elements LED3, LED7, . . . , LED 187, LED191; and a fourth group composed of LED elements LED4, LED8, . . . , LED 188, LED192. Therefore, four driver ICs are necessary to control switch terminals of a common cathode of the LED elements belonging to each of the aforementioned groups. The LED head 31 is structured such that driving of the first group of LED elements is controlled by controlling the gate electrode of the N-type MOS transistor 36 based on a drive signal output from the terminal KDRV of the driver IC DRV1; driving of the second group of LED elements is controlled by controlling the gate electrode of the N-type MOS transistor 35 based on a drive signal output from the terminal KDRV of the driver IC DRV2; driving of the third group of LED elements is controlled by controlling the gate electrode of the N-type MOS transistor 34 based on a drive signal output from the terminal KDRV of the driver IC DRV3, not shown; and driving of the fourth group of LED elements is controlled by controlling the gate electrode of the N-type MOS transistor 33 based on a drive signal output from the terminal KDRV of the driver IC DRV4, not shown.

The LED chips CHP1, CHP2, . . . , CHP 26 are disposed on the same print wire substrate on which the driver ICs DRV1, DRV2, . . . , DRV26 are disposed, in a manner to correspond to the driver ICs DRV1, DRV2, . . . , DRV26, respectively. The LED head 31 is structured such that the LED chips CHP1, CHP2, . . . , CHP 26 are connected to the corresponding driver IC DRV1, DRV2, . . . , DRV26, respectively. In each of LED chips CHP1, CHP2, . . . , CHP 26, the anode terminals of the n-th, the n+1-th, the n+2-th, and the n+3-th LED elements are connected, and the thusly formed connected portion is connected to output terminals DO1, DO2, . . . , DO48 of the driver ICs DRV1, DRV2, . . . , DRV26. Here, n is an integer expressed as n=1, 5, 9, . . . , and furthermore, n may also be expressed as n=4m−3, where m is set to a positive integer.

The cathode terminals of the LED elements belonging to the first group disposed in the LED chips CHP1, CHP2, . . . , CHP26 are connected to each other and to a drain terminal of the N-type MOS transistor 36. The cathode terminals of the LED elements belonging to the second group disposed in the LED chips CHP1, CHP2, . . . , CHP26 are connected to each other and to a drain terminal of the N-type MOS transistor 35.

The cathode terminals of the LED elements belonging to the third group disposed in the LED chips CHP1, CHP2, ..., CHP26 are connected to each other and to a drain terminal of the N-type MOS transistor 34. The cathode terminals of the LED elements belonging to the fourth group disposed in the LED chips CHP1, CHP2, ..., CHP26 are connected to each other and to a drain terminal of the N-type MOS transistor 33.

The N-type MOS transistors 33, 34, 35, 36 serve as a switching section for performing time-divisional driving of the first, second, third, and fourth LED element groups. Specifically, the N-type MOS transistors 33, 34, 35, 36 turn the LED elements on or off based on the drive signal input from the driver IC. Furthermore, source electrodes of the N-type MOS transistors 33, 34, 35, 36 are connected to a ground. The drain terminal of the N-type MOS transistor 33 is connected to the cathode terminals of the LED elements in the fourth group. The drain terminal of the N-type MOS transistor 34 is connected to the cathode terminals of the LED elements in the third group. The drain terminal of the N-type MOS transistor 35 is connected to the cathode terminals of the LED elements in the second group. The drain terminal of the N-type MOS transistor 36 is connected to the cathode terminals of the LED elements in the first group.

Figure 3:
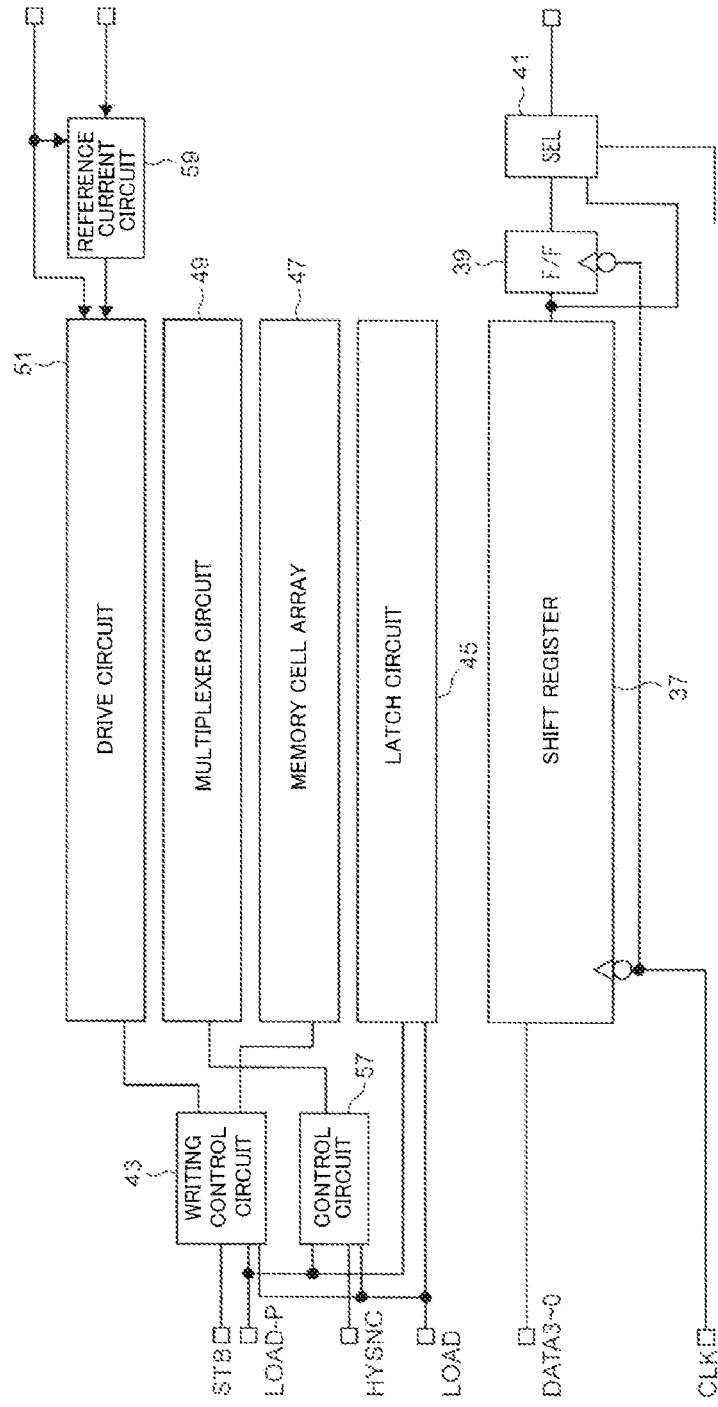
FIG. 3 is a block diagram of a driver of the LED head, for illustrating a structure of the driver.

As shown in FIG. 3, the driver ICs DRV1, DRV2, ..., DRV26 are each provided with a shift register circuit 37 for temporarily storing data, a flip-flop (F/F) circuit 39, a selector (SEL) circuit 41 for selecting and outputting an input signal, a writing control circuit 43 for controlling writing of light quantity adjustment data input from the print control unit 1, a latch circuit 45 composed of multiple latch elements in an array form, a memory cell array 47 composed of memory cells in an array form, a multiplexer array 49 provided with a selector function, a drive circuit 51 for inputting signals into the anode terminals of the LED elements LED1, LED2, ..., LED192 based on signals output from the latch circuit 45 and the multiplexer 49, a control circuit 57 for controlling the multiplexer array 49, and a reference current circuit 59 for generating a reference current.

Figure 4:
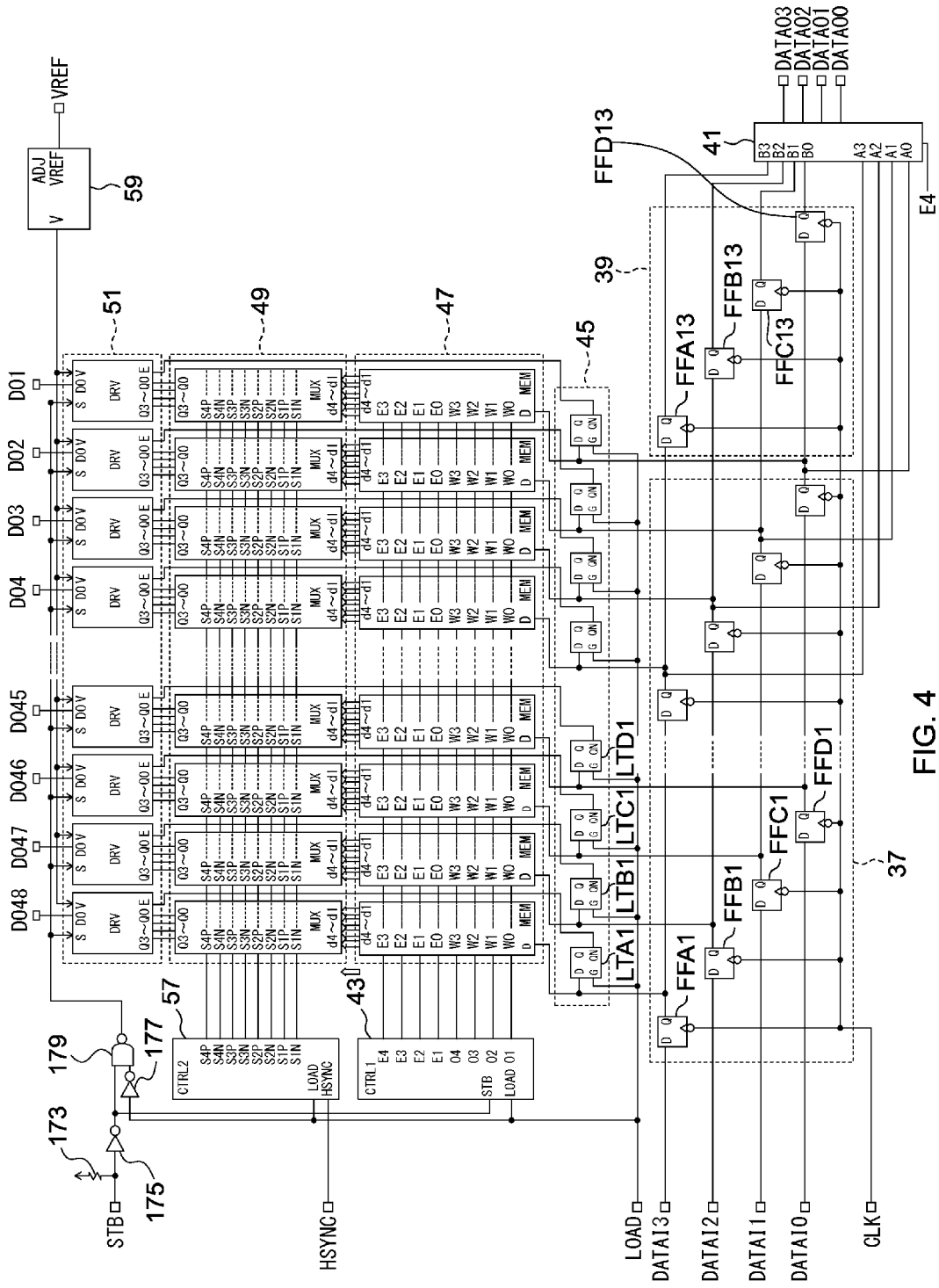
FIG. 4 is a circuit diagram of the driver.

The shift register circuit 37 has a 12-stage structure, as shown in FIG. 4. Specifically, the shift register circuit 37 is composed of 48 flip-flop circuits FFA1~FFA12, FFB1~FFB12, FFC1~FFC12, FFD1~FFD12 connected in a cascading manner. Printing data signals HD-DATA3~0 from the terminals DATAI3~0 and the clock signal HD-CLK from the print controller 1 are input into the flip-flop circuits FFA1~FFA12, FFB1~FFB12, FFC1~FFC12, FFD1~FFD12, respectively. The flip-flop circuits FFA1~FFA12, FFB1~FFB12, FFC1~FFC12, FFD1~FFD12 input the printing data signals HD-DATA3~0 into the latch circuit 45 and the memory cell array 47 based on the clock signal HD-CLK. Furthermore, printing data signals HD-DATA3~0 with a width of four bits are input from the terminals DATAI3, DATAI2, DATAI1, DATAI0 into the flip-flop circuits HAL FFB1, FFC1, FFD1, respectively, from among the flip-flop circuits FFA1~FFA12, FFB1~FFB12, FFC1~FFC12, FFD1~FFD12.

The flip-flop circuits FFA12, FFB12, FFC12, FFD12 are connected respectively in a cascading manner to flip-flop circuits FFA13, FFB13, FFC13, FFD13, which compose the flip-flop circuit 39. The flip-flop circuits FFA12, FFB12, FFC12, FFD12 are connected to the selector circuit 41. Thus, the shift register circuit 37 and the flip-flop circuit 39 form a shift register circuit composed of 12×26 stages or 13×26 stages as the whole LED head 31. In such a shift register circuit, the number of shift stages can be switched by connecting output terminals of the shift register circuit with 12×26 stages and output terminals of the shift register with 13×26 stages to input terminals of the selector circuit 41, respectively. The number of shift stages can be switched based on a selector switching signal E4 input from a control circuit CTRL1 composing the control circuit 57.

The selector circuit 41 inputs either one of signals input from the shift register circuit 37 composed of 12×26 stages or 13×26 stages as the whole LED head 31 as the printing data signals HD-DATA3~0 into the adjacent terminals DATAI3~0 of the driver IC based on the selector switching signal E4. The selector circuit 41 has terminals A3, A2, A1, A0 through which the printing data signals HD-DATA3~0 are input from the shift register circuit 37 with 12×26 stages, and terminals B3, B2, B1, B0 through which the printing data signals HD-DATA3~0 are input from the flip-flop circuit 39. The selector circuit 41 selects the printing data signals HD-DATA3~0 input from the terminals A3, A2, A1, A0 or the printing data signals HD-DATA3~0 input from the terminals B3, B2, B1, B0. The selector circuit 41 then inputs the printing data signals HD-DATA3~0 from terminals Y3, Y2, Y1, Y0 through terminals DATAO3, DATAO2, DATAO1, DATAO0 to the adjacent terminals DATAI3, DATAI2, DATAI1, DATAI0 of the driver IC. The selector switching signal E4 for switching the selector is input into the selector circuit 41. Upon reception of input of the selector switching signal E4, the selector circuit 41 switches the signal, which is to be output from the self-terminals Y3, Y2, Y1, Y0, based on the type of the selector switching signal E4. Specifically, in the case of input of the selector switching signal E4 being as a high-level signal, the selector circuit 41 sets signals, which are to be output from the self-terminals Y3, Y2, Y1, Y0, to signals input from the terminals A3, A2, A1, A0. In the case of input of the selector switching signal E4 being as a low-level signal, the selector circuit 41 sets signals, which are to be output from the self-terminals Y3, Y2, Y1, Y0, to signals input from the terminals B2, B2, B1, B0.

The writing control circuit 43 serves as a circuit that controls operation for storing the printing data signals DATA3~0 having been input from the flip-flop circuits FFA1~FFA12, FFB1~FFB12, FFC1~FFC12, FFD1~FFD12 into the memory cell array 47 based on the strobe signal HD-STB and the latch signal HD-LOAD input from the print controller 1. The printing data signals DATA3~0 stored in the memory cell array 47 are input into the multiplexer array 49. The writing control circuit 43 described above has a terminal STB into which the strobe signal HD-STB is input, a terminal LOAD into which the latch signal LOAD is input, terminals W3, W2, W1, W0, and terminals E3, E2, E1, E0 into which a drive signal for driving a memory cell array 47 to be described alter is input.

The control circuit 57 inputs into the multiplexer array 49 a switching signal for switching the signal to be input from the multiplexer array 49 into the drive circuit 51. The control circuit 57 has a terminal HSYNC into which the synchronization signal HD-HSYNC is input, a terminal LOAD into which the latch signal HD-LOAD is input, and terminals S1N, S1P, S2N, S2P, S3N, S3P, S4N, S4P through which switching signals S1N, S1P, S2N, S2P, S3N, S3P, S4N, S4P are selectively input as a high-level signal or a low-level signal into the multiplexer array 49.

The latch circuit 45 latches based on the latch signal LOAD, the printing data signals DATA3~0 input from the print controller 1. The latch circuit 45 is composed of 48 latch circuits LTA1~LTA12, LTB1~LTB12, LTC1~LTC12, LTD1~LTD12. Upon input of the latch signal HD-LOAD into the terminal LOAD, the latch circuits LTA1~LTA12, LTB1~LTB12, LTC1~LTC12, LTD1~LTD12 are activated based on the latch signal HD-LOAD. The latch circuits LTA1~LTA12, LTB1~LTB12, LTC1~LTC12, LTD1~LTD12 are respectively connected to the flip-flop circuits FFA1~FFA12, FFB1~FFB12, FFC1~FFC12, FFD1~FFD12. In a latch condition, the latch circuits LTA1~LTA12, LTB1~LTB12, LTC1~LTC12, LTD1~LTD12 latch the printing data signals HD-DATA3~0 input from the flip-flop circuits FFA1~FFA12, FFB1~FFB12, FFC1~FFC12, FFD1-FFD12. Specifically, each of the latch circuits LTA1~LTA12, LTB1~LTB12, LTC1~LTC12, LTD1~LTD12 serves as a circuit DLatch having a terminal GF into which the latch signal HD-LOAD is input, a terminal D into which the printing data signals HD-DATA3~0 are input, and output terminals Q, QN. The terminals D of these latch circuits LTA1~LTA12, LTB1~LTB12, LTC1~LTC12, LTD1~LTD12 are connected to the corresponding terminals Q of the flip-flop circuits FFA1~FFA12, FFB1~FFB12, FFC1~FFC12, FFD1~FFD12 composing the shift register circuit 37. The terminals G of the latch circuits LTA1~LTA12, LTB1~LTB12, LTC1~LTC12, LTD1~LTD12 are connected to the terminal LOAD. The terminals QN of the latch circuits LTA1~LTA12, LTB1~LTB12, LTC1~LTC12, LTD1~LTD12 are connected to the input terminals of the corresponding drive circuit 51 so that the latch circuits LTA1~LTA12, LTB1~LTB12, LTC1~LTC12, LTD1~LTD12 input the printing data signals HD-DATA3~0 to the corresponding drive circuit 51 based on the latch signal LOAD input from the terminals G.

Figure 5:
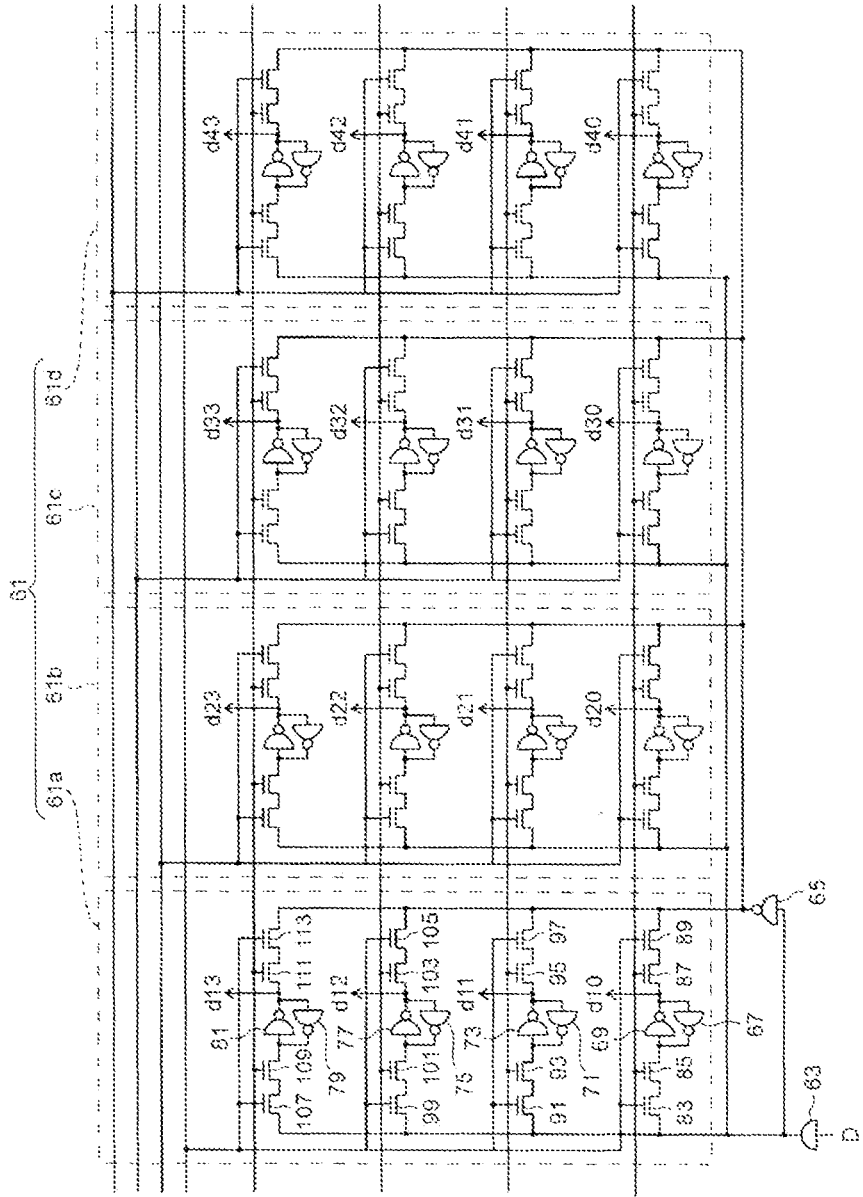
FIG. 5 is a circuit diagram of a memory circuit of the driver, for illustrating a configuration of the memory circuit.

The memory cell array 47 stores the printing data signals DATA3~0 input from the flip-flop circuits FFA1~FFA12, FFB1~FFB12, FFC1~FFC12, FFD1~FFD12. The memory cell array 47 is structured by arranging 48 memory cell circuits 61 as shown in FIG. 5.

Each of the memory cell circuits 61 is composed of 4 memory circuits 61a, 61b, 61c, 61d each having the same structure. Each of the memory circuits 61a, 61b, 61c, 61d stores adjustment data signals bit3, bit2, bit1, bit0 for adjusting the light quantity variation, input into the terminals DATAI3~0. The adjustment data signals bit3, bit2, bit1, bit0 stored in each of the memory circuits 61a, 61b, 61c, 61d are input into the multiplexer array 49.

The memory circuits 61a, 61b, 61c, 61d have a buffer circuit 63, inverters 65, 67, 69, 71, 73, 75, 77, 79, 81, N-type MOS transistors 83, 85, 87, 89, 91, 93, 95, 97, 99, 101, 103, 105, 107, 109, 111, 113, and a terminal D into which the printing data signals DATA3~0 are input from flip-flop circuits FFA1~FFA12, FFB1~FFB12, FFC1~FFC12, FFD1~FFD12. Input into these memory circuits 61a, 61b, 61c, 61d through the terminals W3, W2, W1, W0, is a selection signal for designating a circuit to store the adjustment data signals bit3, bit2, bit1, bit0. Furthermore, input into the memory circuits 61a, 61b, 61c, 61d through the terminals E1, E2, E3, E4, is a writing signal to store the adjustment data signals bit3, bit2, bit1, bit0. The memory circuits 61a, 61b, 61c, 61d store the adjustment data signal bit3 to be output to the terminal d10 using the series-connected N-type MOS transistors 83, 85, 87, 89 and the series-connected inverters 67, 69; the adjustment data signal bit2 to be output to the terminal d11 using the series-connected N-type MOS transistors 91, 93, 95, 97 and the series-connected inverters 71, 73; the adjustment data signal bit1 to be output to the terminal d12 using the series-connected N-type MOS transistors 99, 101, 103, 105 and the series-connected inverters 75, 77; and the adjustment data signal bit0 to be output to the terminal d13 using the series-connected N-type MOS transistors 107, 109, 111, 113 and the series-connected inverters 79, 81. An input terminal of the buffer circuit 63 is connected to the terminal D while the output terminal is connected to first terminals of the N-type MOS transistors 83, 91, 99, 107 and an input terminal of the inverter 65. An output terminal of the inverter 65 is connected to second terminals of the NH-type transistors 89, 97, 105, and 113.

Figure 6:
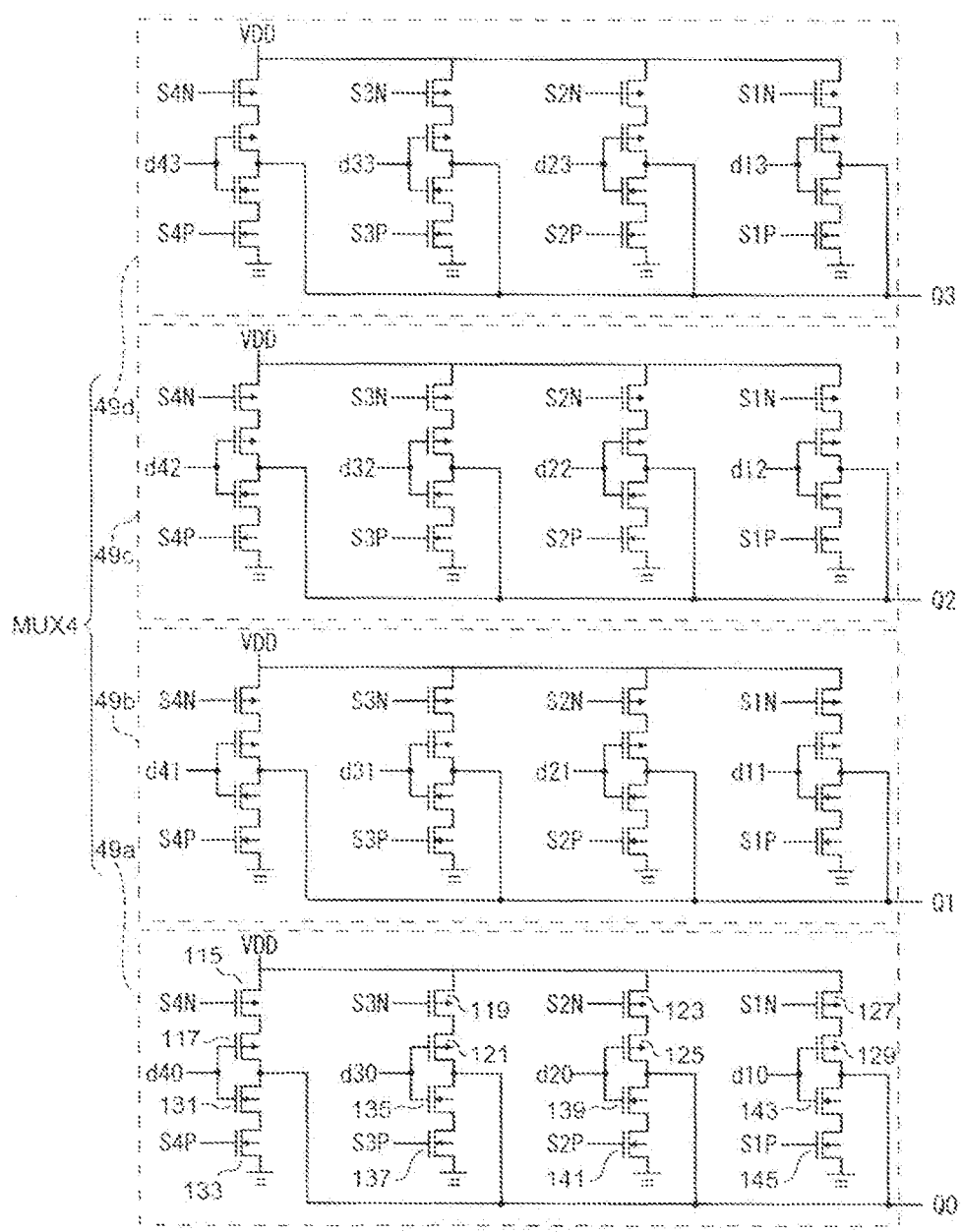
FIG. 6 is a circuit diagram of a multiplexer circuit of the driver, for illustrating a configuration of the multiplexer circuit.

The multiplexer array 49 receives input of the adjust data signals bit3, bit2, bit1, bit0 from the corresponding memory cell circuit 61 from among the memory cell circuits 61 each storing the adjust data signals bit3, bit2, bit 1, bit0, thereby outputting the received signals to the drive circuit 51. Specifically, the multiplexer array 49 has a selector function to switch a read-source from among the memory circuits 61a, 61b, 61c, 61d each storing the adjustment data signals bit 3, bit2, bit1, bit0, based on the switching signals S1N, S1P, S2N, S2P, S3N, S3P, S4N, S4P input from the control circuit 57. The multiplexer array 49 is structured by arranging 12 multiplexer groups MUX4 each having four multiplexer circuits 49a, 49b, 49c, 49d set to a first group, as shown in FIG. 6. Since these multiplexer circuits 49a, 49b, 49c, 49d have the same structure, a structure of the multiplexer circuit 49d is explained in detail hereinafter.

The multiplexer circuit 49d outputs the adjustment data signal bit3 from a terminal Q3, from among the adjustment data signals of four bits necessary to form a one-dot latent image. The signal to be output from the terminal Q3 is selected from among signals output from the output terminal d13 of the memory circuit 61a, the output terminal d23 of the memory circuit 61b, the output terminal d33 of the memory circuit 61c, and the output terminal d43 of the memory circuit 61d, thereby being output from the output terminal Q3. The signal to be output from the terminal Q2 is selected from among signals output from the output terminal d12 of the memory circuit 61a, the output terminal d22 of the memory circuit 61b, the output terminal d32 of the memory circuit 61c, and the output terminal d42 of the memory circuit 61d. The signal to be output from the terminal Q1 is selected from among signals output from the output terminal d11 of the memory circuit 61a, the output terminal d21 of the memory circuit 61b, the output terminal d31 of the memory circuit 61c, and the output terminal d41 of the memory circuit 61d. The signal to be output from the terminal Q0 is selected from among signals output from the output terminal d10 of the memory circuit 61a, the output terminal d20 of the memory circuit 61b, the output terminal d30 of the memory circuit 61c, and the output terminal d40 of the memory circuit 61d.

The multiplexer circuit 49a has P-type MOS transistors 115, 117, . . . , 129 and N-type MOS transistors 131, 133, . . . , 145. Specifically, the multiplexer circuit 49a is formed such that the P-type MOS transistors 115, 117 and the N-type MOS transistors 131, 133 are arranged in series, the P-type MOS transistors 119, 121 and the N-type MOS transistors 135, 137 are arranged in series, the P-type MOS transistors 123, 125 and the N-type MOS transistors 139, 141 are arranged in series, the P-type MOS transistors 127, 129 and the N-type MOS transistors 143, 145 are arranged in series, and these series-arranged P-type MOS transistors 115, 117, . . . , 129 and N-type MOS transistors 131, 133, . . . , 145 are arranged in parallel. In the P-type MOS transistors 115, 117 and the N-type MOS transistors 131, 133 that are arranged in series, the P-type MOS transistor 115 has a gate electrode connected to the terminal S4N of the control circuit 57, a first terminal connected to a power source VDD, and a second terminal connected to a first terminal of the P-type MOS transistor 117. The P-type MOS transistor 117 has a gate electrode connected to the output terminal d40 of the memory circuit 61d, the first terminal connected to the second terminal of the P-type MOS transistor 115, a second terminal connected to the output terminal Q0. The N-type MOS transistor 131 has a gate electrode connected to the output terminal d40 of the memory circuit 61*d*, a first terminal connected to a second terminal of the N-type MOS transistor 133, and a second terminal connected to the output terminal Q0. The N-type MOS transistor 133 has a gate terminal connected to the terminal S4P of the control circuit 57, a first terminal connected to a ground, and the second terminal connected to the first terminal of the N-type MOS transistor 131.

In the P-type MOS transistors 119, 121, and the N-type MOS transistors 135, 137 that are arranged in series, the P-type MOS transistor 119 has a gate electrode connected to the terminal S3N of the control circuit 57, a first terminal connected to the power source VDD, and a second terminal connected to a first terminal of the P-type MOS transistor 121. The P-type MOS transistor 121 has a gate electrode connected to the output terminal d30 of the memory circuit 61*c*, the first terminal connected to the second terminal of the P-type MOS transistor 119, and a second terminal connected to the output terminal Q0. The N-type MOS transistor 135 has a gate electrode connected to the output terminal d30 of the memory circuit 61*c*, a first terminal connected to a second terminal of the N-type MOS transistor 137, and a second terminal connected to the output terminal Q0. The N-type MOS transistor 137 has a gate terminal connected to the terminal S3P of the control circuit 57, a first terminal connected to a ground, and the second terminal connected to the first terminal of the N-type MOS transistor 135.

In the P-type MOS transistors 123, 125, and the N-type MOS transistors 139, 141 that are arranged in series, the P-type MOS transistor 123 has a gate electrode connected to the terminal S2N of the control circuit 57, a first terminal connected to the power source VDD, and a second terminal connected to a first terminal of the P-type MOS transistor 125. The P-type MOS transistor 125 has a gate electrode connected to the output terminal d20 of the memory circuit 61*b*, the first terminal connected to the second terminal of the P-type MOS transistor 123, and a second terminal connected to the output terminal Q0. The N-type MOS transistor 139 has a gate electrode connected to the output terminal d20 of the memory circuit 61*b*, a first terminal connected to a second terminal of the N-type MOS transistor 141, and a second terminal connected to the output terminal Q0. The N-type MOS transistor 141 has a gate terminal connected to the terminal S2P of the control circuit 57, a first terminal connected to a ground, and the second terminal connected to the first terminal of the N-type MOS transistor 139.

In the P-type MOS transistors 127, 129, and the N-type MOS transistors 143, 145 that are arranged in series, the P-type MOS transistor 127 has a gate electrode connected to the terminal S1N of the control circuit 57, a first terminal connected to the power source VDD, and a second terminal connected to a first terminal of the P-type MOS transistor 129. The P-type MOS transistor 129 has a gate electrode connected to the output terminal d10 of the memory circuit 61*a*, the first terminal connected to the second terminal of the P-type MOS transistor 127, and a second terminal connected to the output terminal Q0. The N-type MOS transistor 143 has a gate electrode connected to the output terminal d10 of the memory circuit 61*a*, a first terminal connected to a second terminal of the N-type MOS transistor 145, and a second terminal connected to the output terminal Q0. The N-type MOS transistor 145 has a gate terminal connected to the terminal S1P of the control circuit 57, a first terminal connected to a ground, and the second terminal connected to the first terminal of the N-type MOS transistor 143.

Figure 7:
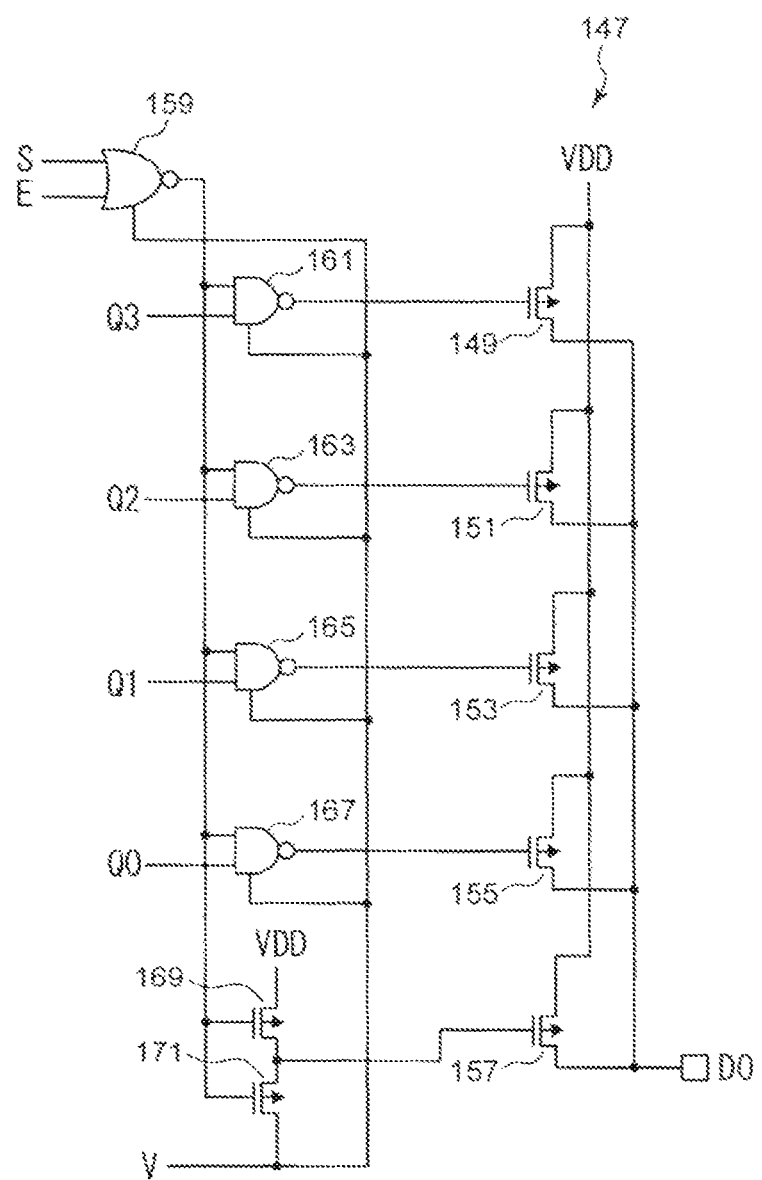
FIG. 7 is a circuit diagram of a drive circuit of the driver, for illustrating a configuration of the drive circuit.

The drive circuit 51 outputs drive signals for driving the LED elements LED1, LED2, . . . , LED192 through output terminals D01, D02, . . . , D048 based on the printing data signals HD-DATA3~0 input from the latch circuit 45 and the adjustment data signals bit3~0 input from the multiplexer circuit 49. The drive circuit 51 is composed of 48 LED drive circuits 147 with the structure as shown in FIG. 7. The LED drive circuit 147 has P-type MOS transistors 149, 151, . . . , 157, a NOR circuit 159, NAND circuits 161, 163, 165, 167, a P-type MOS transistor 169, and an N-type MOS transistor 171. In the P-type MOS transistors 149, 151, . . . , 155, gate electrodes are respectively connected to output terminals of the NAND circuits 161, 163, 165, 167, in which first terminals are connected to a power source VDD and second terminals are connected to a terminal DO. The P-type MOS transistor 157 has the gate electrode connected to the P-type MOS transistor 169 and the N-type MOS transistor 171, the first terminal connected to the power source VDD, and the second terminal connected to the terminal DO. The P-type MOS transistor 105 has the gate electrode connected to an output terminal of the NOR circuit 159, the first terminal connected to the terminal VD, and the second terminal connected to the gate electrode of the N-type MOS transistor 157. The NOR circuit 159 has a terminal S into which an on/off command signal for driving of the LED element is input from the NAND circuit to be described later, and a terminal E into which the printing data signals DATA3~0 latched into the latch circuits LTA1~LTA12, LTB1~LTB12, LTC1~LRC12, LTD1~LDT12. The NOR circuit 159 inputs a NOR operation result of signals, which have been input into the terminals S, E, into the input terminals of the NAND circuit 161, 163, 165, 167, the P-type MOS transistor 169, and the N-type MOS transistor 171. The NAND circuit 161 has the input terminal connected to the output terminal of the NOR circuit 159 and to the terminal Q3 of the multiplexer circuit 49, and the output terminal connected to the gate electrode of the P-type MOS transistor 149. In a similar manner, the NAND circuit 163 has the input terminal connected to the output terminal of the NOR circuit 159 and to the terminal Q2 of the multiplexer circuit 49, and the output terminal connected to the gate electrode of the P-type MOS transistor 151. In a similar manner, the NAND circuit 165 has the input terminal connected to the output terminal of the NOR circuit 159 and to the terminal Q1 of the multiplexer circuit 49, and the output terminal connected to the gate electrode of the P-type MOS transistor 153. In a similar manner, the NAND circuit 167 has the input terminal connected to the output terminal of the NOR circuit 159 and to the terminal Q1 of the multiplexer circuit 49, and the output terminal connected to the gate electrode of the P-type MOS transistor 155. The LED drive circuit 147 is formed such that an inverter circuit connected to the power source VDD and to the terminal V is formed by arranging the P-type MOS transistor 169 and the N-type MOS transistor 171 in series.

Referring back to FIG. 4, the reference current circuit 59 serves as a control voltage generating circuit. Upon receipt of a reference voltage input through the terminal VREF, the reference current circuit 59 generates and outputs a control voltage to the drive circuit 51 through the terminal V to enable the drive circuit 51 to generate a predetermined drive current based on the input reference voltage.

The LED head 31 has a pull-up resistor 173 which pulls up the strobe signal HD-STB having been input into the terminal STB, an inverter circuit 175, an inverter circuit 177, and a NAND circuit 179. A signal output from the NAND circuit 179 is input in an S terminal of the LED drive circuit 147.

To be more specific, the NAND circuit 179 receives the strobe the NAND circuit 179 input through the inverter circuit 175 and the latch signal HD-LOAD input through the inverter circuit 177. The NAND circuit 179 outputs a drive command signal with respect to the drive circuit 51 based on these signals.

The image forming apparatus is explained in detail with reference to FIG. 8 with respect to operation to execute printing with use of the LED head 31

Figure 8:
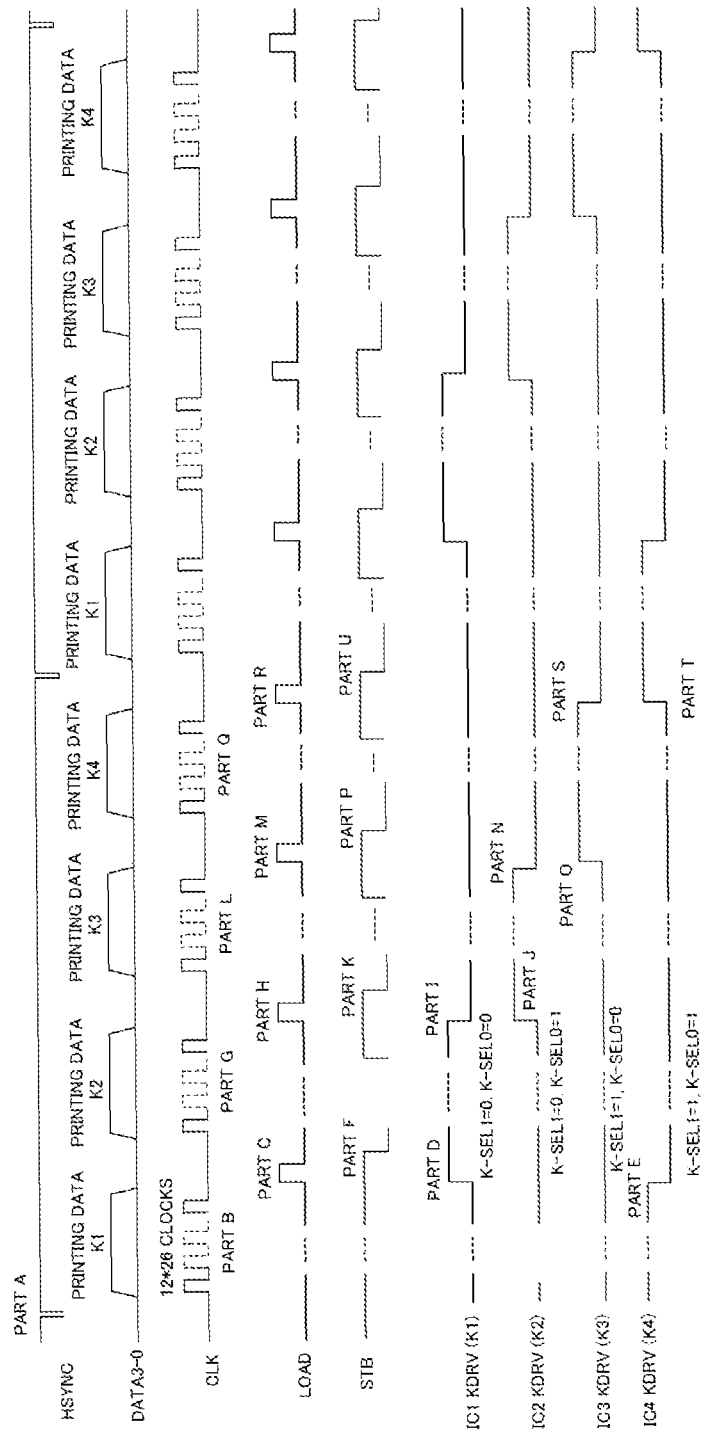
FIG. 8 is a view illustrating operation of the driver.

In part A of FIG. 8, the print controller 1 inputs a synchronization signal HD-HSYNC-N into the LED head 31 prior to driving of the LED heads LED$_1$1, LED$_1$2, . . . , LED$_1$ 192. In part B, the print controller 1 subsequently inputs the printing data signals DATA 3~0 in synchronization with the clock signal CLK into the LED head 31. The printing data signals DATA3~0 input from the print controller 1 at this time are set to a first signal at the time of time-divisional driving, for example, printing data K1 for driving the LED elements in the first group. In the LED head 31, 26 driver ICs DRV1, DRV2, . . . , DRV26 are connected to each other in a cascading manner. Each of the driver ICs DRV1, DRV2, . . . , DRV26 has 4 data input terminals allowing the printing data signals DATA3~0 corresponding to 4 pixels to be transferred concurrently based on the clock signals CLK with 1 pulse. Therefore, the number of clock pulses necessary for transfer of the printing data signals 3~0 corresponding to the single line is 312, which is determined by calculation of 48/4×26.

Among the printing data signals DATA3~0 corresponding to the single line, the print controller 1 inputs the latch signal HD-LOAD into the LED head 31 in part C after completing transfer of the printing data K1. Accordingly, the printing data K1 is latched into the latch circuit 45. At this time, the driver IC DRV1 causes the signal output from the terminal KDRV to transition to its high-level state, thereby switching the N-type MOS transistor 36 to an ON-state in part D. The driver IC DRV4 causes the signal output from the terminal KDRV to transition to its low-level state, thereby switching the N-type MOS transistor 33 to an OFF-state in part E. Herein, where the N-type MOS transistor 36 is switched to an ON-state and the other N-type MOS transistors 33, 34, 35 are switched to an OFF-state, a flow path from the cathode terminals of the N-type MOS transistors 33, 34, 35 to a ground is interrupted, thereby switching the LED elements in the second, third, and fourth groups to an OFF-state. On the other hand, the N-type MOS transistor 36 is switched to the ON-state at that time, causing a flow path from the cathode terminal of the N-type MOS transistor 36 to a ground, and the LED elements in the first group are selectively switched to the ON-state according to the signals output from the output terminals D01, D02, . . . , D048. Upon switching the LED element to the ON-state, the image carrier, not shown, is irradiated with light from the LED elements, so that the image carrier holds an electrostatic latent image thereon based on the printing data K1.

The print controller 1 then inputs the strobe signal HD-STB into the LED head 31 to give the drive circuit a print starting command in part F.

The print controller 1 inputs into the LED head 31 the printing data K2 for driving the LED elements in the second group in synchronization with the clock signal CLK in part G. After completing transfer of the printing data K2, the print controller 1 inputs the latch signal HD-LOAD into the LED head 31 in part H. Accordingly, the printing data K2 is latched into the latch circuit 45. Next, the driver IC DRV1 causes the signal output from the terminal KDRV to transition to its low-level state, thereby switching the N-type MOS transistor 36 to an OFF state in part I. The driver IC DRV2 causes the signal output from the terminal KDRV to its high-level state, thereby switching the N-type MOS transistor 35 to an ON state in part J. Subsequently, the print controller 1 inputs the strobe signal HD-STB into the LED head 31 to give the drive circuit 51 the print starting command in part K.

The print controller 1 inputs into the LED head 31 the printing data K3 for driving the LED elements in the third group in synchronization with the clock signal CLK in part L. After completing transfer of the printing data K3, the print controller 1 inputs the latch signal HD-LOAD into the LED head 31 in part M. Accordingly, the printing data K3 is latched into the latch circuit 45. Next, the driver IC DRV2 causes the signal output from the terminal KDRV to transition to its low-level state, thereby switching the N-type MOS transistor 35 to an OFF state in part N. The driver IC DRV3 causes the signal output from the terminal KDRV to its high-level state, thereby switching the N-type MOS transistor 34 to an ON state in part O. Subsequently, the print controller 1 inputs the strobe signal HD-STB into the LED head 31 to give the drive circuit 51 the print starting command in part P.

The print controller 1 inputs into the LED head 31 the printing data K4 for driving the LED elements in the fourth group in synchronization with the clock signal CLK in part Q. After completing transfer of the printing data K4, the print controller 1 inputs the latch signal HD-LOAD into the LED head 31 in part R. Accordingly, the printing data K4 is latched into the latch circuit 45. Next, the driver IC DRV3 causes the signal output from the terminal KDRV to transition to its low-level state, thereby switching the N-type MOS transistor 34 to an OFF state in part S. The driver IC DRV4 causes the signal output from the terminal KDRV to its high-level state, thereby switching the N-type MOS transistor 35 to an ON state in part T. Subsequently, the print controller 1 inputs the strobe signal HD-STB into the LED head 31 to give the drive circuit 51 the print starting command in part U.

The LED head 31 executes the control operation described above so that the image carrier, not shown, holds an electrostatic latent image corresponding to the single line based on the printing data signals DATA3~0. The LED head 31 subsequently repeats the same control operation.

Figure 9:
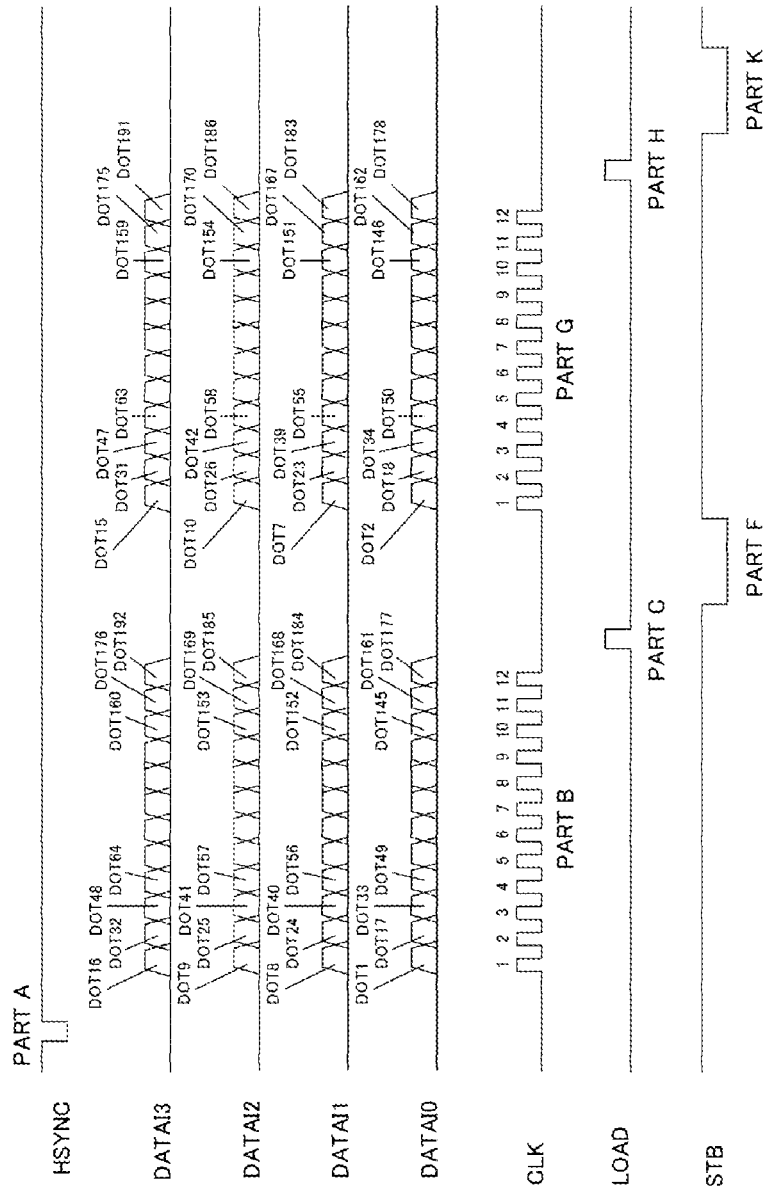
FIG. 9 is an enlarged view of essential parts in FIG. 8.
Figure 10:
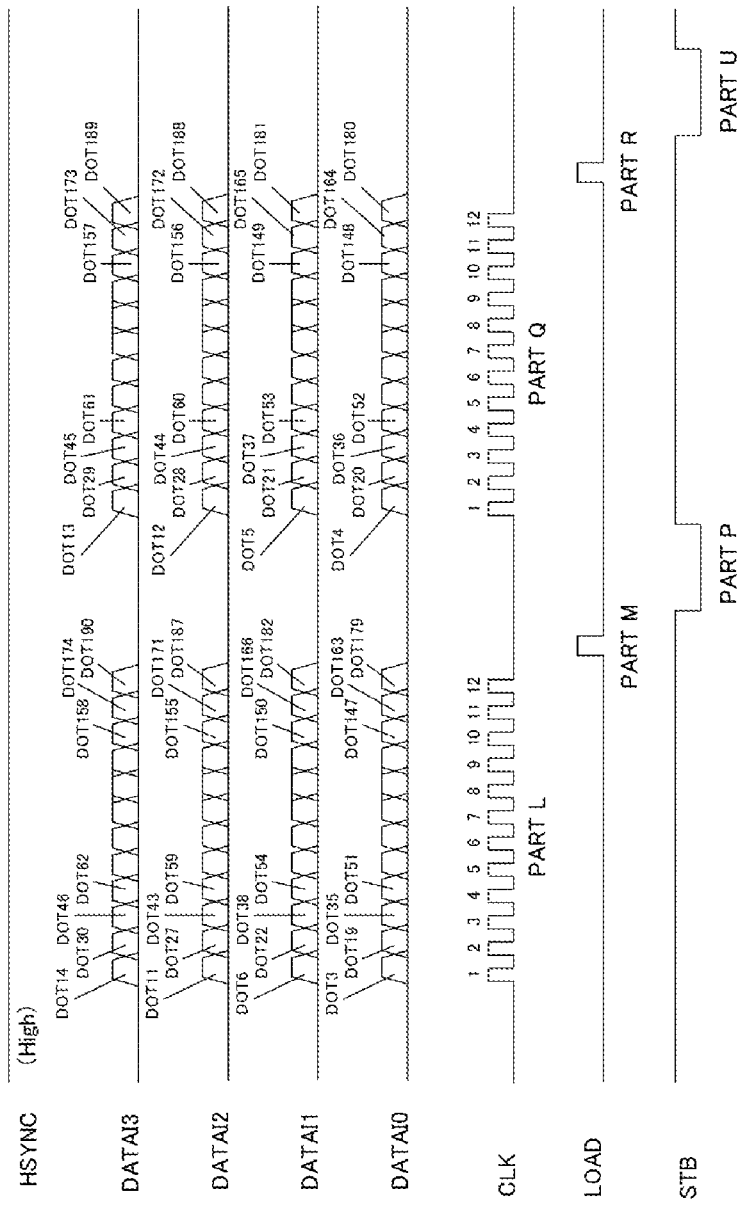
FIG. 10 is an enlarged view of essential parts in FIG. 8.

FIGS. 9 and 10 illustrate the driver IC DRV1 to explain in detail the operation of the driver IC shown in FIG. 8. With respect to the signals to be input into the terminals DATAI3~0, the printing data signals of dots 1, 8, 9, 16 are input in the LED head 31, the printing data signals being in synchronization with the first pulse wave of the clock signal HD-CLK. Subsequently, the printing data signals of dots 17, 24, 25, 32 are input into the LED head 31, the printing data signals being in synchronization with a trailing edge of the second pulse wave. Since the shift register of the driver IC DRV1 has 12 stages, input of the printing data signals DATA3~0 is completed upon input of the twelfth pulse wave. The print controller 1 inputs the latch signal HD-LOAD into the LED head 31 and latches the printing data signals DATA3~0 into the latch circuits LTA1~LTA12, LTB1~LTB12, LTC1~LTC12, LTD1~LTD12. Next, the print controller 1 inputs the strobe signal HD-STB-N into the LED head 31 and starts driving of the LED elements belonging to the first group from among the LED elements LED1, LED2, . . . , LED 192. At this time, the driver IC DRV1 causes the signal output from the terminal KDRV to transition to its high-level state, thereby switching the N-type MOS transistor 36 to an ON-state. At this time, the LED elements LED1, LED8, LED9, LED16, LED17, LED24, LED25, LED32, and the like are selectively driven when explained using the example shown in FIG. 9.

Herein, the drivers IC DRV1, DRV2, . . . , DRV26 are formed on a silicon substrate. However, FIGS. 11 to 13 show a conventional method for positioning each of circuit elements.

Figure 11:
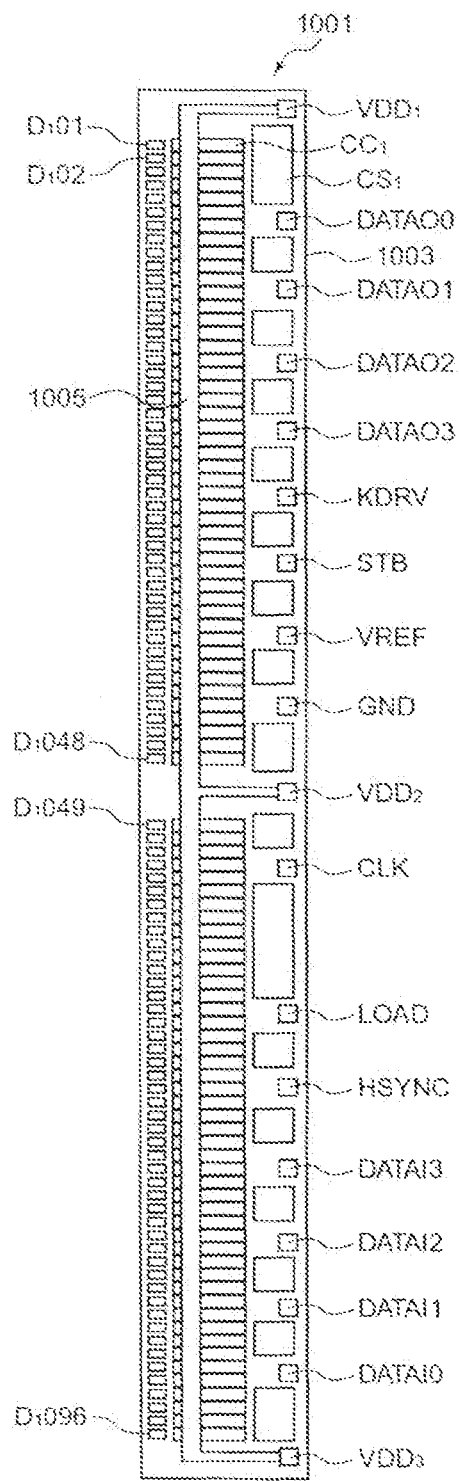
FIG. 11 is a top view of a driver IC of a conventional LED head, for illustrating a structure of the LED head.
Figure 12:
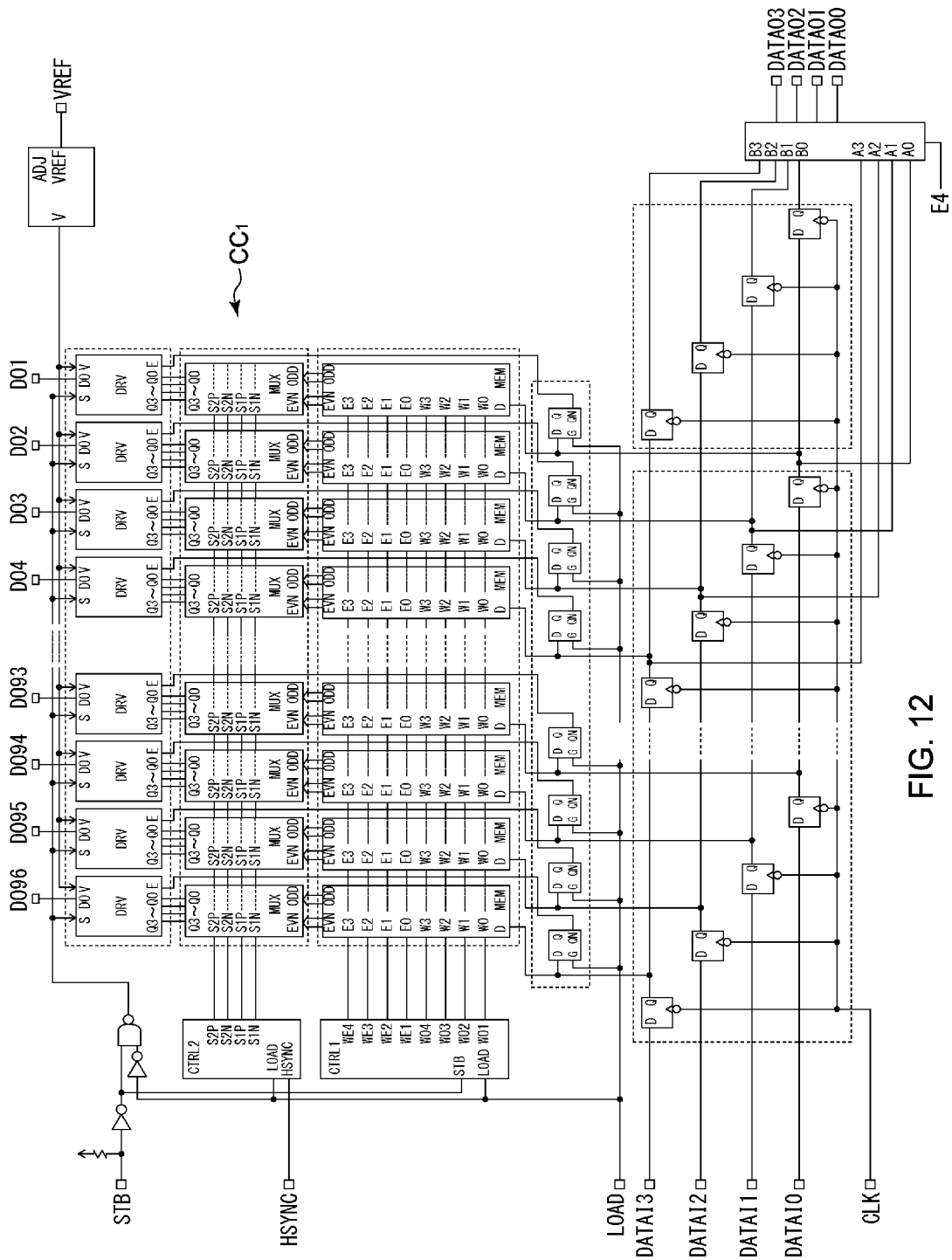
FIG. 12 is a circuit diagram of a driver IC of the LED head.

A driver IC 1001 shown in FIGS. 11 and 12 is a drive device for driving the 192 LED elements time-divisionally, which are divided into two groups, an odd-number group and an even number group. The driver IC 1001 is formed by arranging output terminals $D_1 01, D_1 02, \ldots, D_1 096$ along one of long sides of an IC chip 1003. The driver IC 1001 is provided with 96 control circuits $CC_1$ corresponding to the output terminals $D_1 01, D_1 02, \ldots, D_1 096$. The control circuits $CC_1$ control the signals output from these output terminals, respectively. Each of control circuits $CC_1$ is composed of the latch circuit LTD1, the memory cell circuit 61 arranged in correspondence with the latch circuit LTD1, the multiplexer array 49 arranged in correspondence with the memory cell circuit 61, a circuit corresponding to the drive circuit 51, and the like. These output terminals $D_1 01, D_1 02, \ldots, D_1 096$ the and control circuits $CC_1$ are arranged at equal intervals in a direction of long sides of the IC chip 1003. The terminals VDD, the terminals DATAI3~0, the terminal KDRV, the terminal STB, the terminal VREF, the terminal GND, and the like are arranged at the vicinity of the other long side of the IC chip 1003. A plurality of circuit sections $CS_1$ each composed of the writing control circuit 43 necessary for driving of the driver IC 1045, the control circuit 57, and the like are formed between those terminals. A power-source wire 1005 is laid on an upper layer of the 96 control circuits $CC_1$ arranged on the IC chip 1003. Terminals $VDD_1, VDD_2, VDD_3$ are formed on the IC chip 1003 and are connected to the power-source wire 1005. Therefore, the power-source wire 1005 is formed in letter E shape so as to be connectable to these terminals.

Figure 13:
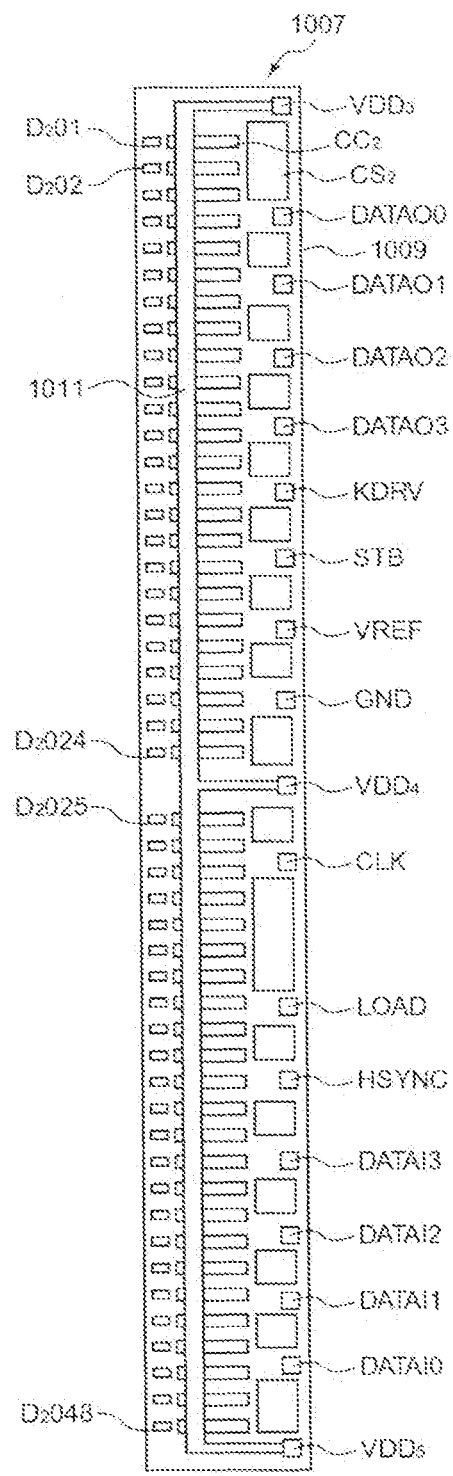
FIG. 13 is a top view of a driver IC of the conventional LED head, for illustrating a structure of the LED head.

FIG. 13 shows a driver IC 1007 as a conventional example, which is different from the driver IC 1001. The driver IC 1007 is a drive device for driving the 192 LED elements, which are divided into four groups, time-divisionally in a manner similar to the driver IC DRV1, DRV2, ..., DRV26. The driver IC 1007 is formed by arranging output terminals $D_2 01, D_2 02, \ldots, D_2 048$ corresponding to the aforementioned D01, D02, ..., D048 along one of long sides of an IC chip 1009 formed in a substantially rectangular shape. The driver IC 1007 has 48 control circuits $CC_2$ corresponding to the output terminals $D_2 01, D_2 02, \ldots, D_2 048$. The control circuits $CC_2$ controls the signals output from these output terminals, respectively. Each of the control circuits $CC_2$ is composed of the latch circuit LTD1, the memory cell circuit 61 arranged in correspondence with the latch circuit LTD1, the multiplexer array 49 to be connected to the memory cell circuit 61, a circuit corresponding to the drive circuit 51, and the like. These output terminals $D_2 01, D_2 02, \ldots, D_2 048$ and control circuits $CC_2$ are arranged at equal intervals along one of long sides of the IC chip. The terminals $VDD_4 \sim VDD_6$, the terminals DATAI3~0, the terminal DATAO3~0, the terminal KDRV, the terminal STB, the terminal VREF, the terminal GND, and the like are arranged at the vicinity of the long side in a direction of long sides of the IC chip. A plurality of circuit sections $CS_2$ each composed of a circuit necessary for driving the IC driver 1007 such as the writing control circuit 43, the control circuit 57, and the like are formed between those terminals. A power-source wire 1011 is laid on an upper layer of 48 control circuits $CC_2$ arranged on the IC chip. The power-source wire 1011 is connected to the terminal VDD connected to the power source and is connected to the terminals $VDD_4 \sim VDD_6$. Therefore, the power-source wire 1011 is formed in a letter E shape so as to be connected to these terminals. Terminals $VDD_1, VDD_2, VDD_3$ are formed on the IC chip 1003 and are connected to the power-source wire 1005. Therefore, the power-source wire 1005 is shaped in letter E shape so as to be connectable to these terminals.

Figure 14:
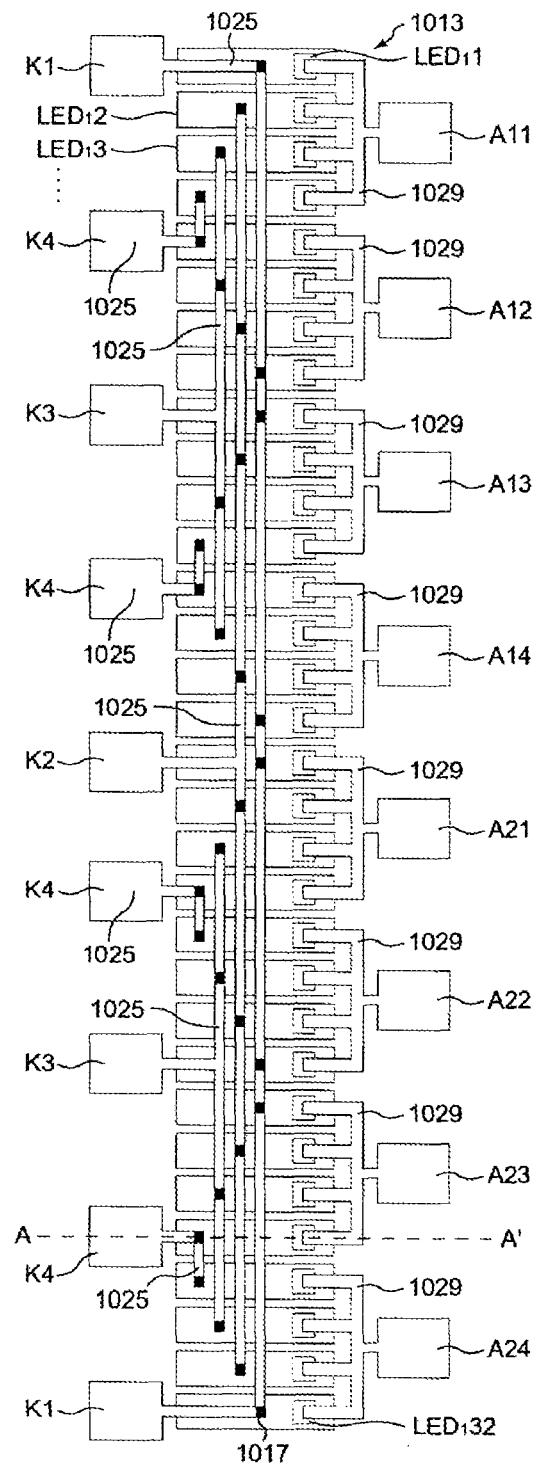
FIG. 14 is a top view of an LED array of the conventional LED head, for illustrating a structure of the LED array.
Figure 15:
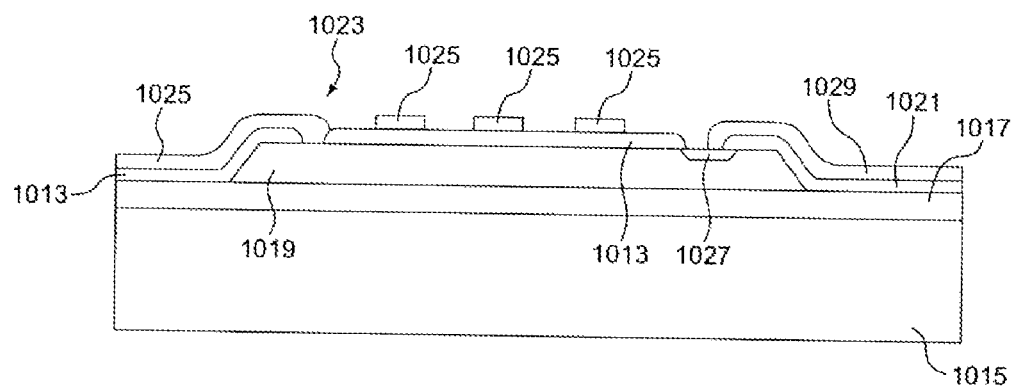
FIG. 15 is a cross-sectional view of the LED array along the line AA'.

The driver IC 1007 as described above is connected to an LED array 1013 such as shown in FIG. 14. FIG. 14 is a top view of the LED array 1013 driven by the driver IC 1007.

The LED array 1013 has the 192 LED elements, $LED_1 1$, $LED_1 2, \ldots, LED_1 192$, arranged at equal intervals. For convenience of explanation, FIG. 14 shows only the LED elements $LED_1 1, LED_2 2, \ldots, LED_1 32$ and corresponding parts.

The anode terminals of the LED elements $LED_1 1$, $LED_2 2, \ldots, LED_1 32$ are connected to anode terminal pads A11, A12, A13, A14, A21, A22, A23, A24 in a manner that the anode terminals of the four adjacent LED elements are connected to the common anode terminal pad. These anode terminal pads A11, A12, A13, A14, A21, A22, A23, A24 are connected to the output terminals $D_2 01, D_2 02, \ldots, D_2 08$ shown in FIG. 13. Cathode terminal pads K1, K2, K3, K4 connected to a common cathode wire of the LED elements $LED_1 1, LED_2 2, \ldots, LED_1 32$ are arranged at a position opposite to the anode terminal pads A11, A12, A13, A14, A21, A22, A23, A24. In the LED array 1013, the LED elements $LED_1 1, LED_2 2, \ldots, LED_1 32$, the anode terminal pads A11, A12, A13, A14, A21, A22, A23, A24, and the cathode terminal pads K1, K2, K3, K4 are formed by being arranged on a highly-resistive wafer substrate 1015 as shown in FIG. 14. The LED elements $LED_1 1, LED_2 2, \ldots, LED_1 32$ are structured by forming a current blocking layer 1017 and an n-type diffusion region 1019 made from an n-type AlGaAs layer on the whole surface of the highly-resistive wafer substrate by an MOCVD (Metalorganic Chemical Vapor Deposition) method and thereafter diffusing p-type impurities at positions to be provided with the LED elements. The LED elements are separated by grooving the p-type impurities by etching after diffusion of the p-type impurities. After separating the LED elements, an interlayer insulating layer 1021 is formed on the current blocking layer 1017, and a plurality of contact holes 1023 provided to the n-type diffusion region 1019 are simply connected to the cathode terminal pads via a metal wire 1025. Furthermore, a p-type diffusion region 1027 of the LED element is connected to the anode terminal pad using a metal wire 1029.

Figure 16:
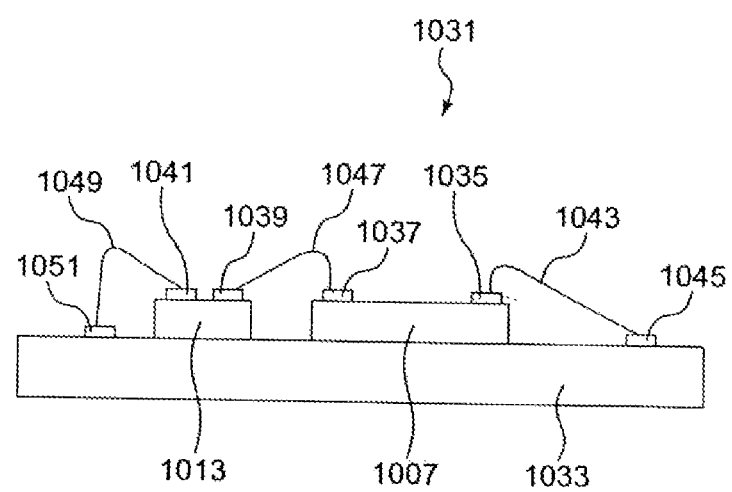
FIG. 16 is a side view of the LED head.
Figure 17:
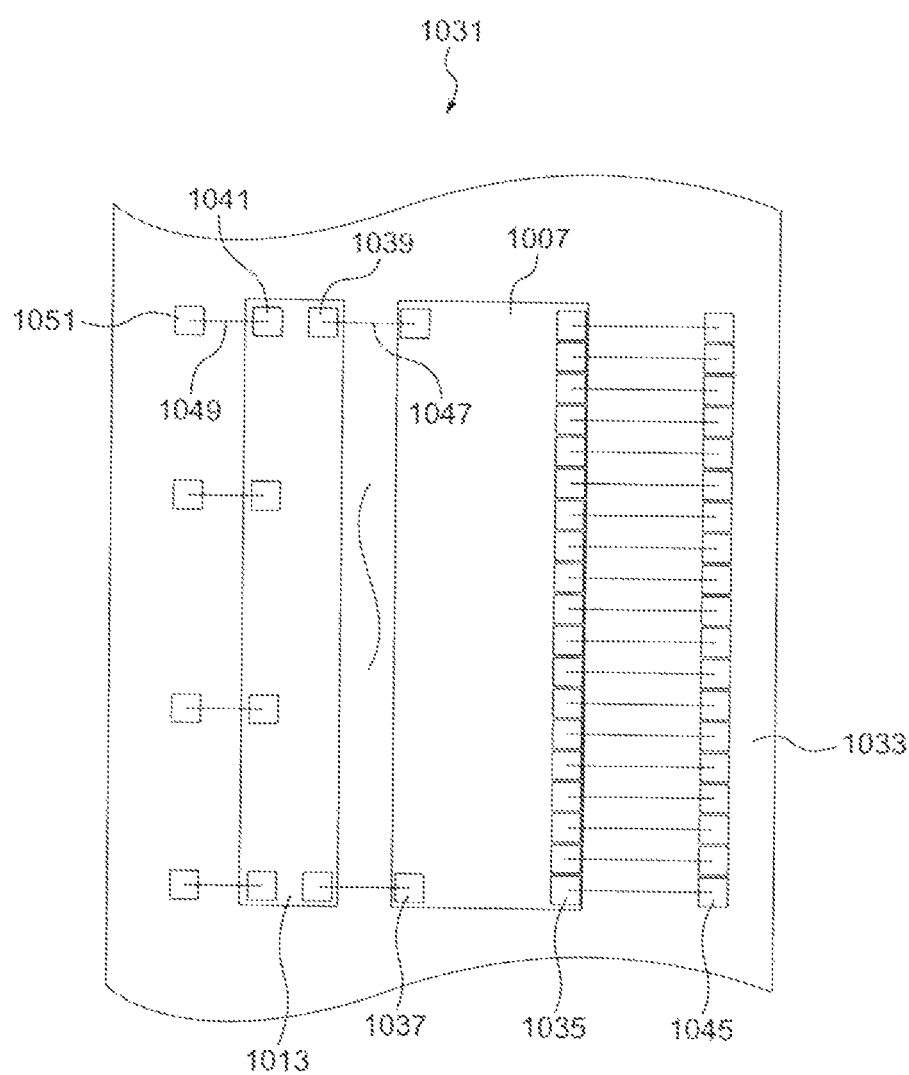
FIG. 17 is a top view of the LED head.

The driver IC 1007 and the LED array 1013 described above are connected to each other by wire bonding as shown in FIGS. 16 and 17, thereby forming an LED head 1031.

The LED head 1031 is formed by arranging the driver IC 1007 and the LED array 1013 on a print wire substrate 1003. The driver IC 1007 has a surface thereof provided with an input/output pad array 1035 and an LED drive pad array 1037. The LED head 1031 has a surface thereof provided with an anode pad array 1039 composed of the anode terminal pads A11, A12, ..., and a cathode pad array 1041 composed of the cathode terminal pads K1, K2, K3, K4. The input/output pad array 1035 is connected to a terminal pad array 1045 formed on the print wiring substrate 1033 via the bonding wire 1043. The LED pad array 1037 is connected to an anode pad array 1039 via bonding wires 1047. The cathode pad array 1041 is connected to a terminal pad array 1051 formed on the print wiring substrate 1033 via bonding wire 1049.

As is clear from the conventional driver ICs 1001, 1007, use of the driver IC 1007 that performs driving divisionally four times can reduce the number of the circuits for driving the LED elements to half of the number in the case of using the driver IC 1001 that performs driving divisionally two times. With the driver IC 1007 having the half-reduced control circuits compared with the driver IC 1001, however, spaces appear between the control circuits $CC_2$ but are too small to be effectively utilized. In other words, the drive IC 1007 achieves a reduction of the number of control circuits but does not come down in size, leading to a problem that the drive device cannot realize neither downsizing nor production-cost reduction.

Figure 18:
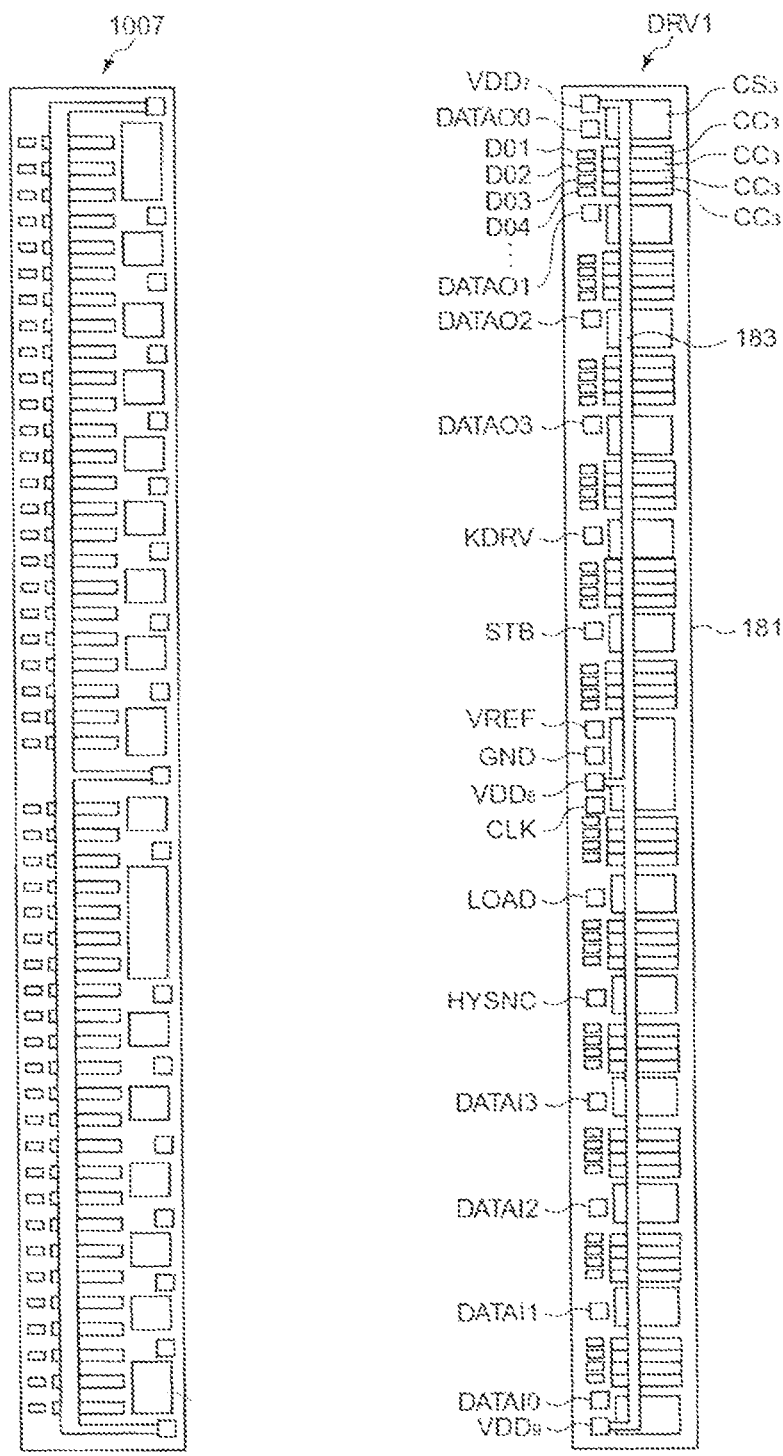
FIG. 18 is a top view of the driver IC provided to the image forming apparatus according to the first embodiment, for illustrating a structure of the driver IC.

With the structure according to this embodiment, as shown in FIG. 18, the size of the driver IC can be reduced by changing layout of control circuits or the like provided to the driver IC DRV1, DRV2, . . . , DRV26. In FIG. 18, the driver IC 1007 described above and the driver IC DRV1 with the structure according to this embodiment are illustrated side by side to the same scale in order to clarify the effect of the size reduction.

The driver IC DRV1 has terminals $VDD_R$, $VDD_R$, $VDD_9$, the output terminals D01, D02, . . . , D048, the printing data output terminals DATAO3~0, the terminal KDRV, the terminal STB, the terminal VREF, the terminal GND, the terminal CLK, the terminal LOAD, the terminal HSYNC, and the printing data input terminals DATAI3~0 all arranged along one of long sides of an IC chip 181. It is preferable that those terminals be arranged such that an input terminal group and an output terminal group are placed in a substantially alternating manner, the input terminal group being composed of the terminals $VDD_7$, $VDD_8$, $VDD_9$, the printing data output terminals DATAO3~0, the terminal KDRV, the terminal STB, the terminal VREF, the terminal GND, the terminal CLK, the terminal LOAD, the terminal HSYNC, and the printing data input terminals SATAI3~0, the output terminal group being composed of the output terminals D01, D02, . . . , D048. It is preferable that the output terminals D01, D02, . . . , D048 be arranged in a manner to be divided into as many as the number of times the LED head 31 is driven during a time-divisional driving operation, that is, the number of time-divisions.

With respect to the driver IC DRV1, as shown in FIG. 18, the wiring control circuit 43, the control circuit 57, and the reference current circuit 59 are arranged in a divided manner so as to fit in the plurality of circuit sections $CS_3$ on the IC chip 181. The driver IC DRV1 has 48 control circuits $CC_3$ including at least flip-flop circuits FFAn, FFBn, FFCn, FFDn, latch circuits LTAn, LTBn, LTCn, LTDn, a memory cell circuit, a multiplexer array 49 corresponding to the memory cell circuit 61, and the LED drive circuit 147 corresponding to the multiplexer array 49. The driver IC DRV1 is formed by arranging substantially in a line those control circuits $CC_3$ and the circuit sections $CS_3$ in a direction of long sides of the IC chip 181. The driver IC DRV1 has a power source wire for inputting electric power acquired from the terminals $VDD_7$, $VDD_8$, $VDD_9$ to the control circuits $CC_3$ and the circuit section $CS_3$. The power source wire 183 is formed in letter E shape so as to be connectable to the control circuits $CC_3$, the control sections $CS_3$, the terminals $VDD_7$, $VDD_8$, and $VDD_9$.

To be more specific, the driver IC DRV1 has 12 groups of the control circuits $CC_3$, each group being composed of the four adjacent control circuits $CC_3$. The 12 groups of the control circuits $CC_3$ are arranged at equal intervals substantially in a line on the IC chip 181. The driver IC DRV1 has the control sections $CS_3$ in spaces formed between those groups. As described above, the control circuits $CC_3$ are divided into groups on the IC chip 181 so that spaces formed between the groups can be made wider than those of the driver IC 1007. Thus, the control circuits $CC_3$ and the control sections $CS_3$ can be arranged in the same line by placing the control section $CS_3$ in those spaces. Furthermore, the control circuits $CC_3$ and the control sections $CS_3$ are arranged in the same line, which enables a length of the IC chip 181 in a direction of short sides to be shortened by a length corresponding to the input/output pad array 1035 or the control circuits $CS_2$ of the driver IC 1007.

Figure 19:
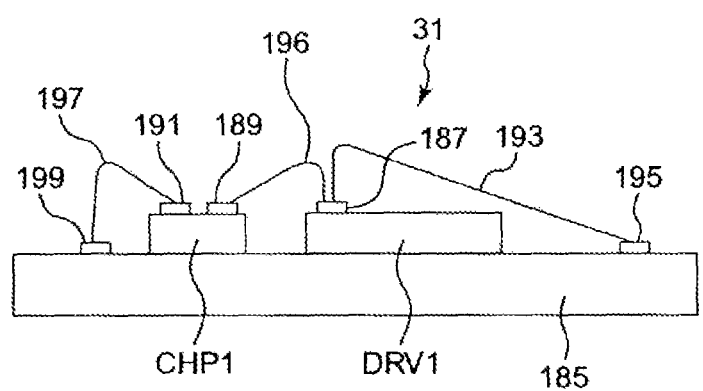
FIG. 19 is a side view of the LED head of the image forming apparatus, for illustrating a structure of the LED head.
Figure 20:
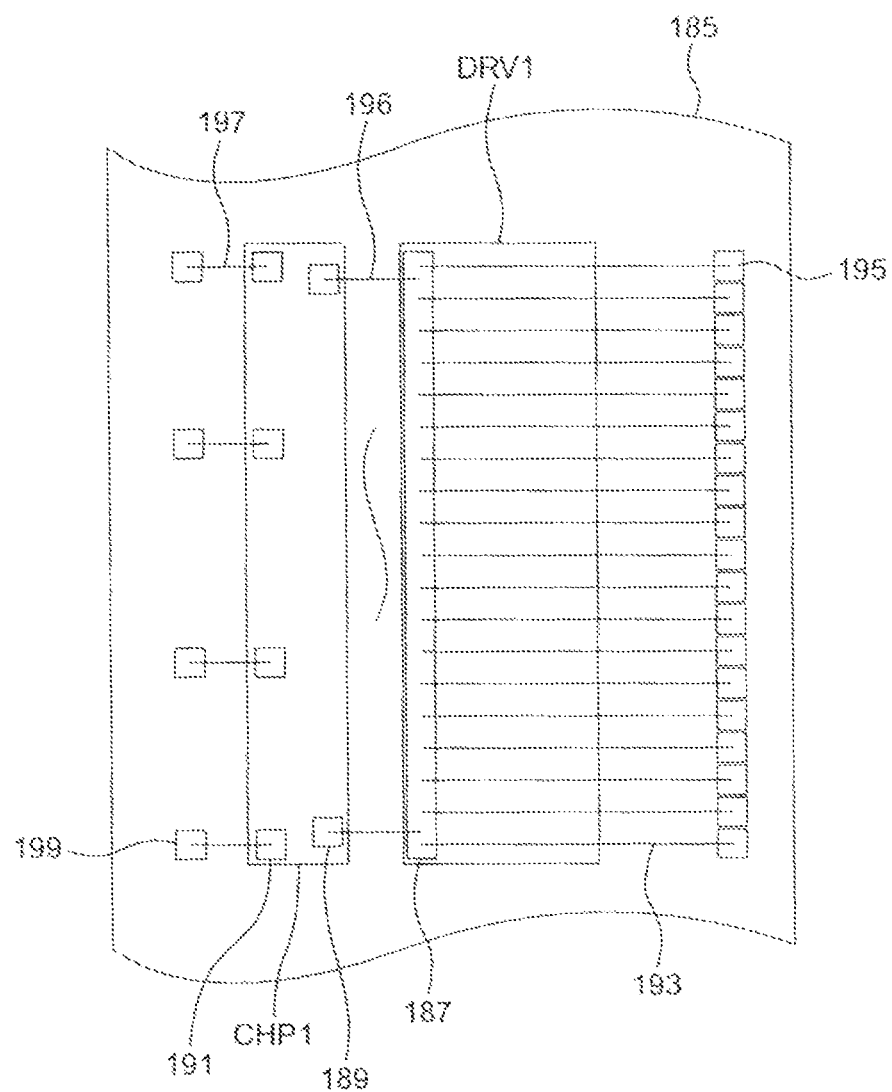
FIG. 20 is a top view of the LED head, for illustrating the structure of the LED head.

The LED head 31 is structured such that the LED chip CHP1 corresponding to the driver IC DRV1 described above is connected as shown in FIGS. 19 and 20. FIG. 19 is a cross-sectional view of the LED head 31 and FIG. 20 is a top view of the LED head 31.

The LED head 31 is structured by arranging the driver IC DRV1 and the LED chip CHP1 on a print wiring substrate 185. The driver IC DRV1 has along one of long sides thereof an LED drive terminal array 187. The LED drive terminal array 187 contains at least the terminals $VDD_7$, $VDD_8$, $VDD_9$, the output terminals D01, D02, . . . , D048, the print data output terminals DATAO3~0, the terminal KDRV, the terminal STB, the terminal VREF, the terminal GND, the terminal CLK, the terminal LOAD, the terminal HSYNC, and the printing data input terminals DATAI3~0. The LED chip CHP1 has along one of long sides thereof the anode pad array 189 connected to the anode terminal pads of the LED elements LED1, LED2, . . . , LED 192 and a cathode pad array 191 connected to the cathode terminal pads. The LED drive terminal array 187 is connected to the terminal pad array 105 formed on the print wiring substrate 185 via a bonding wire 193. The anode pad array 189 is connected to the LED drive terminal array 187 via a bonding wire 196. The cathode pad array 191 is connected to the terminal pad array 199 formed on the print wiring substrate 185 via a bonding wire 197.

As described above, according to the first embodiment of the present invention, a length of the drive IC as a drive device can be shortened in a direction of short sides of the IC chip 181, thereby coming down in size by arranging the LED drive terminal array 187 along one of long sides of the IC chip 181 and arranging the control circuits $CC_3$ and the circuit section $CS_3$ along the other long side, the LED drive terminal array 187 including at least the terminals $VDD_7$, $VDD_8$, $VDD_9$, the output terminals D01, D02, . . . , D048, the print data output terminals DATAO3~0, the terminal KDRV, the terminal STB, the terminal VREF, the terminal GND, the terminal CLK, the terminal LOAD, the terminal HSYNC, and the printing data input terminals DATAI3~0. Therefore, the number of chips per IC wafer can be decreased at the time of production of the IC chips 181, so that the production cost of the driver IC can be reduced.

According to the first embodiment of the present invention, a width of the IC chip 181 can be narrowed in a direction of the short sides thereof, thereby narrowing a width of the print wiring plate 185 in a direction of the short sides, on which the IC chip 181 is mounted, leading to downsizing of the LED head 31.

The above first embodiment was explained in detail with reference to the driver IC DRV1 and the LED chip CHP1 but it goes without saying that the other driver ICs and LED chips have the similar structure.

Hereinafter, a second embodiment of the present invention will be explained in detail. The second embodiment is explained in detail with reference to the LED head 1031 described above in order to clarify the effect. In the second embodiment, elements with the same structure as those of the first embodiment are assigned with the same reference numerals and detailed explanation for these elements is omitted.

Figure 21:
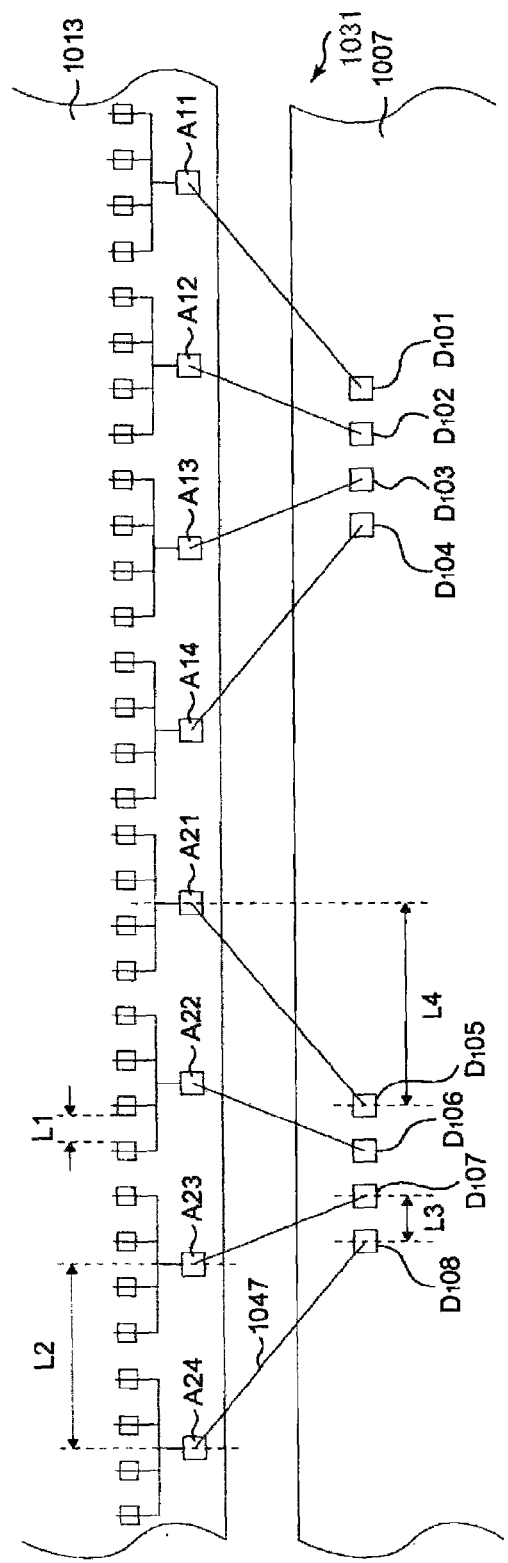
FIG. 21 is a top view of essential parts of the conventional LED head, for illustrating the structure of the LED head.

As shown in FIG. 21, in the LED head 1031, the anode terminal pads A11, A12, . . . , that are arranged at equal intervals, are connected via the bonding wire 1047 to the output terminals $D_101, D_102, . . . , D_108$ that are also arranged at equal intervals.

The LED head 1031 has a 600 dpi resolution, in which a dot pitch L1 between the LED elements is set to about 42.2 μm while a pad pitch between the anode terminal pads $A11$, $A12, \ldots$, is set to 168.8 μm. On the other hand, a pad pitch $L3$ between the output terminals $D_101, D_202, \ldots, D_108$ of the driver IC 1001 is set to about 81 μm. Since there is a large difference between the pad pitch $L2$ and the pad pitch $L3$, the LED head 1031 described above requires the bonding wire 1047 connecting the output terminals $D_101, D_202, \ldots, D_108$ to the anode terminal pads $A11$, $A12, \ldots$, to be placed diagonally to a direction of the array of output terminals $D_101, D_202, \ldots, D_108$ and anode terminal pads $A11$, $A12, \ldots$. In this case, a deviation amount $L4$ between the anode terminal pad $A21$ and the output terminal $D_105$, for example, is determined to be 131.7 μm by an equation of $(168.8 \times 3 - 81 \times 3)$.

However, placing the bonding wire 1047 diagonally to the direction of the array of the output terminals $D_101$, $D_202, \ldots, D_108$ and anode terminal pads $A11, A12, \ldots$ makes it difficult to leave spaces between wires of the bonding wire 1047, leading to a short circuit in the wire. This case poses problems that a shift velocity of bonding tools cannot be developed at the time of production of the LED head 103, thereby not being able to achieve productivity improvement.

Figure 22:
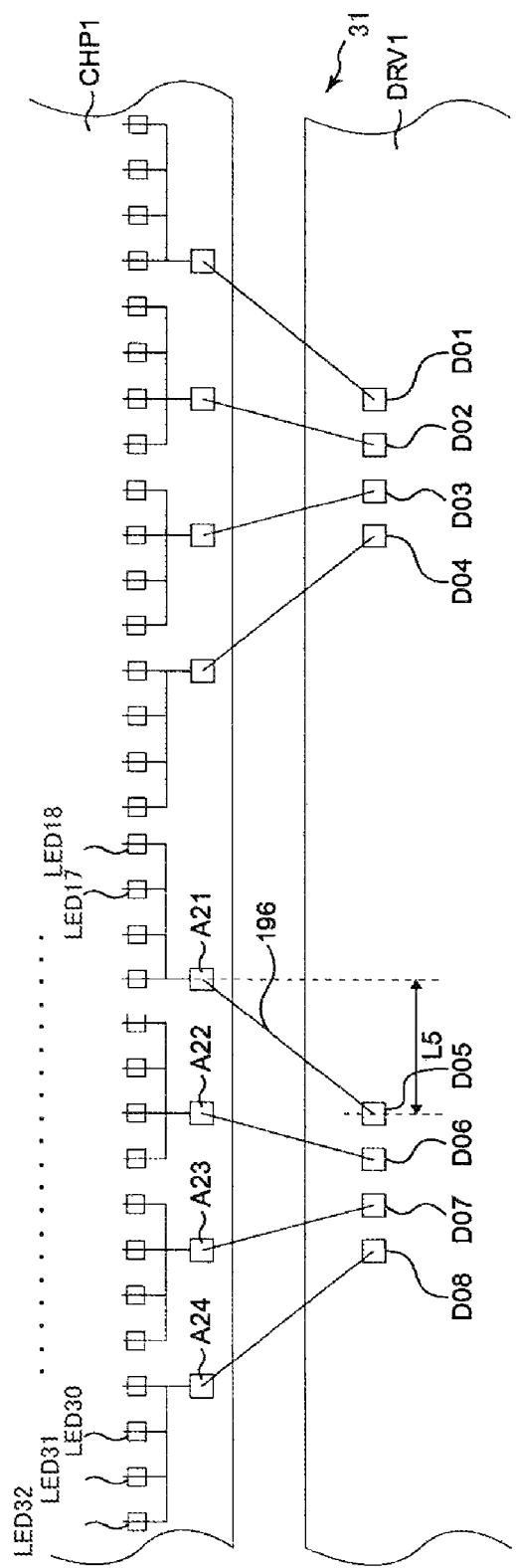
FIG. 22 is a top view of essential parts of an LED head according to a second embodiment, for illustrating a structure of the LED head.

Herein, in the second embodiment, the LED chip CHP1 composing the LED head 31 is structured as shown in FIG. 22.

The LED chip CHP1 has the anode terminal pad array composed of the plural number S of anode terminals $A11$, $A12, \ldots$, in a manner to correspond to output terminals of the output terminal array composed of the same plural number S of output terminals $D01, D02, \ldots$, as the number of time-divisions. The plural number S of output terminals $D01$, $D02, \ldots$, and the plural number S of anode terminal pads $A11$, $A12, \ldots$, are connected to each other via the bonding wire 196, respectively. The plural number S of anode terminal pads $A1, A12, \ldots$, are connected to the same plural number S of LED elements $LED1, LED2, \ldots$, as the number of time-divisions.

The LED chip CHP1 is structured such that centers of the anode pad array, the output terminal array, and the LED array are corresponding to one another and further, that an interval L between the anode terminal pads $A11, A12, \ldots$ is determined by an equation of $L=(N-1) \times P$ as an interval between the output terminals $D01, D02, \ldots$. The LED chip CHP1 allows the anode terminal pad and the output terminal pad to be placed in substantially parallel to each other by setting a distance between the anode terminal pads $A11, A12, \ldots$, thereby greatly reducing the deviation amount.

To be more specific, on the condition that the number of time-divisions is set to four, the electrode pad group is composed of four anode terminal pads, and the output terminal group is composed of four output terminals, the anode terminal pads $A11, A12, \ldots$, are placed with a substantially three times wider pitch than that of the LED elements $LED1$, $LED2, \ldots$.

Since the LED head 31 is divisionally driven four times, the anode terminal pad group is composed of, for example, the anode terminals pads $A24, A23, A22, A21$ corresponding to the LED elements $LED32$, LED 31, ..., LED 17 while the output terminal group is composed of the output terminals $D08, D07, D06, D05$, and these groups are connected by the method described above.

This embodiment is explained using the above example, the anode terminal pad $A24$ is placed at the vicinity of the anode terminal of the LED element $LED29$ from among four LED elements $LED32, LED31, LED30, LED29$ each connected to the anode terminal pad $A24$. The anode terminal pad $A23$ is placed at the vicinity of the LED element $LED26$. The anode terminal pad $A22$ is placed at the vicinity of the LED element $LED23$. The anode terminal pad $A21$ is placed at the vicinity of the LED terminal $LED20$.

In the case of arrangement of the anode terminal pads $A11$, $A12, \ldots$, in this way, an interval $L5$ between the anode terminal pad $A21$ and the output terminal $D05$, for example, in a direction of arrays of the anode terminal pads $A11$, $A12, \ldots$, is determined to be 68.9 μm by an equation of $(126.9 \times 3 - 81 \times 3)/2$.

As described above, according to the second embodiment, the anode terminal pads and the output terminals can be placed in a substantially parallel to each other, thereby greatly reducing the deviation amount. Accordingly, it becomes easy to leave an interval between the wires of the bonding wire 196, thereby preventing a short circuit from occurring in the wires. Furthermore, according to this case, the mobile velocity of the bonding tools can be developed compared with the conventional case, at the time of production of the LED head 103, thereby being able to achieve productivity improvement of the LED head 31.

Hereinafter, an LED head 203 according to a third embodiment of the present invention will be explained in detail. In the third embodiment, elements with the same structure as those of the second embodiment are also assigned with the same reference numerals and detailed explanation for these elements is omitted.

As explained with reference to FIGS. 9 and 10, the LED array 1013 and the driver IC 1007 for driving the LED array 1013, which have been conventionally used, require the printing data signals $DATA3\sim0$ to be input as the random data series such as the dots 1, 8, 9, 16, for example, thereby requiring a data converter for converting the data into a random printing data signal array. The data converter performs this conversion based on a conversion table provided to the print controller, not shown. To be more specific, the print controller, not shown is required to convert the printing data signals $DATA3\sim0$ correspondingly to the data array to be input into the driver IC 1007, when inputting the data into the driver IC 1001.

The third embodiment simplifies the process for randomizing the data transfer sequence.

Figure 23:
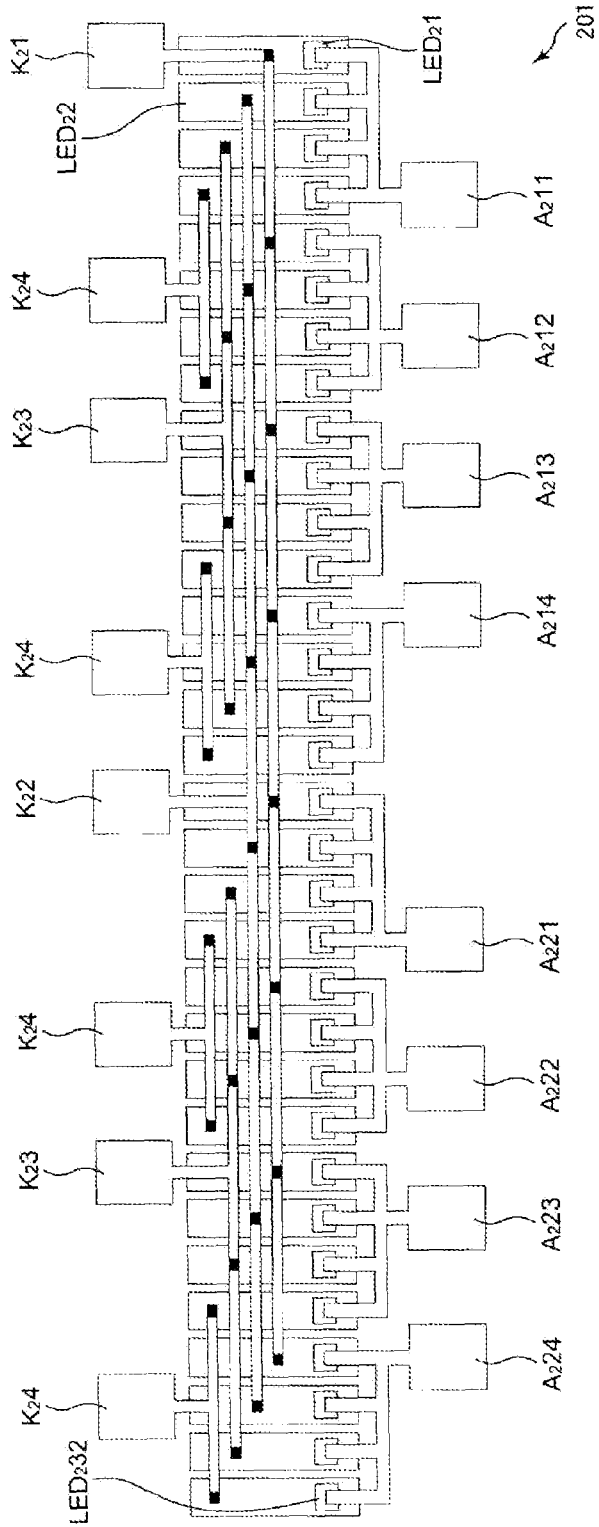
FIG. 23 is a top view of essential parts of an LED array according to a third embodiment, for illustrating a structure of the LED head.

The LED array 201 according to the third embodiment has 192 LED elements $LED_21, LED_22, \ldots, LED_2192$, arranged at equal intervals, as shown in FIG. 23. For convenience of explanation, FIG. 23 illustrates the LED elements $LED_21$, $LED_22, \ldots, LED_232$ and corresponding parts only, which are explained hereinafter.

The LED elements $LED_21, LED_22, \ldots, LED_232$ are connected to 8 anode terminal pads $A_211, A_212, A_213, A_214$, $A_221, A_222, A_223, A_224$, and cathode terminal pads $K_21$, $K_22, K_23, K_24$. The anode terminals $A_211, A_212, A_213, A_214$, $A_221, A_222, A_223, A_224$, are connected to the output terminals of the driver ICs, not shown.

To be more specific, the LED array 201 is structured such that the LED elements are connected to the anode terminal pads $A_211, A_212, A_213, A_214, A_221, A_222, A_223, A_224$ in a manner that the anode terminals of the four adjacent LED elements are connected to the common anode terminal pad. The cathode terminals of the LED elements $LED_21, LED_25$, $LED_29, LED_213, LED_217, LED_221, LED_225, LED_229$ from among the LED elements $LED_21, LED_22, \ldots, LED_232$ are connected to the cathode terminal pad $K_21$ connected to the N-type MOS transistor 36. The cathode terminals of the LED elements $LED_22, LED_26, LED_210, LED_214, LED_218$, $LED_222, LED_226, LED_230$ are connected to the cathode terminal pad $K_22$ connected to the N-type MOS transistor 35. The cathode terminals of the LED elements $LED_23, LED_27$, $LED_211, LED_215, LED_219, LED_223, LED_227, LED_231$ are connected to either one of two cathode terminal pads $K_2 3$ connected to the N-type MOS transistor 34. The cathode terminals of the LED elements $LED_2 4$, $LED_2 8$, $LED_2 12$, $LED_2 16$, $LED_2 20$, $LED_2 24$, $LED_2 28$, $LED_2 32$ are connected to any of cathode terminal pads $K_2 4$ connected to the N-type MOS transistor 33.

FIG. 23 is a top view of the partial LED array 201. The whole of LED array 201 has six times more cathode terminal pads than those in FIG. 23, that is, the 48 cathode terminal pads $K_2 1$, $K_2 2$, $K_2 3$, $K_2 4$.

Figure 24:
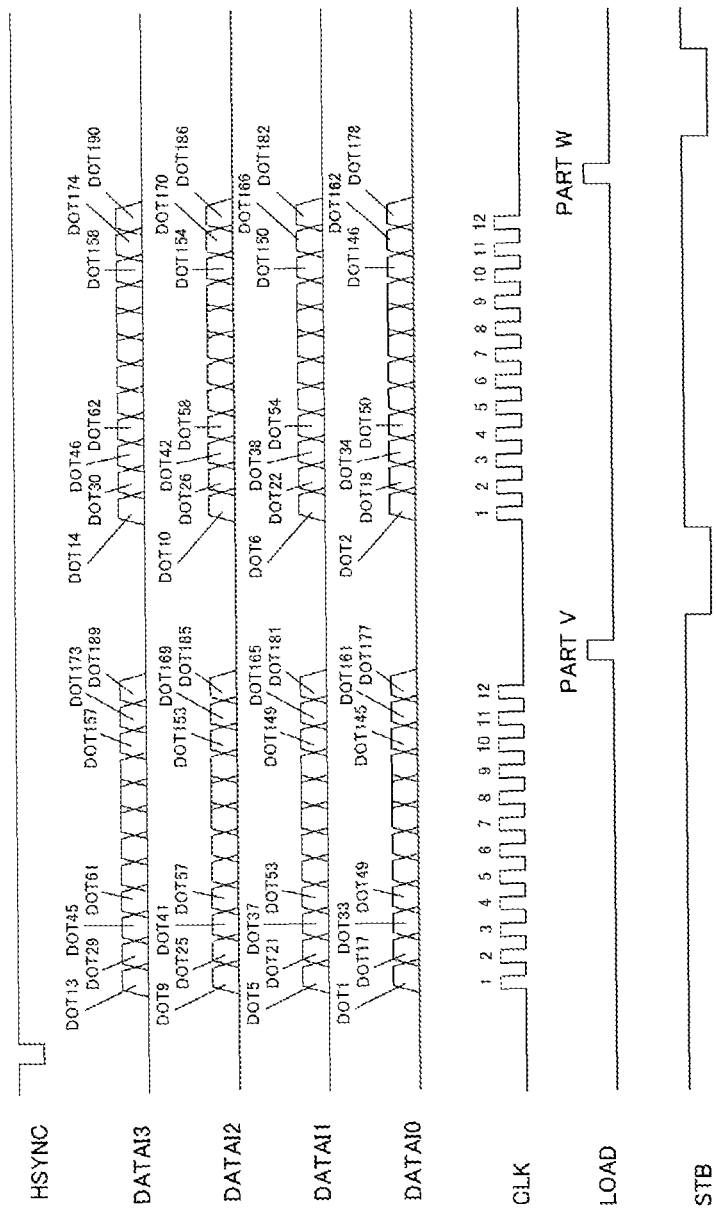
FIG. 24 is a view illustrating operation of the LED head processing a printing data signal.
Figure 25:
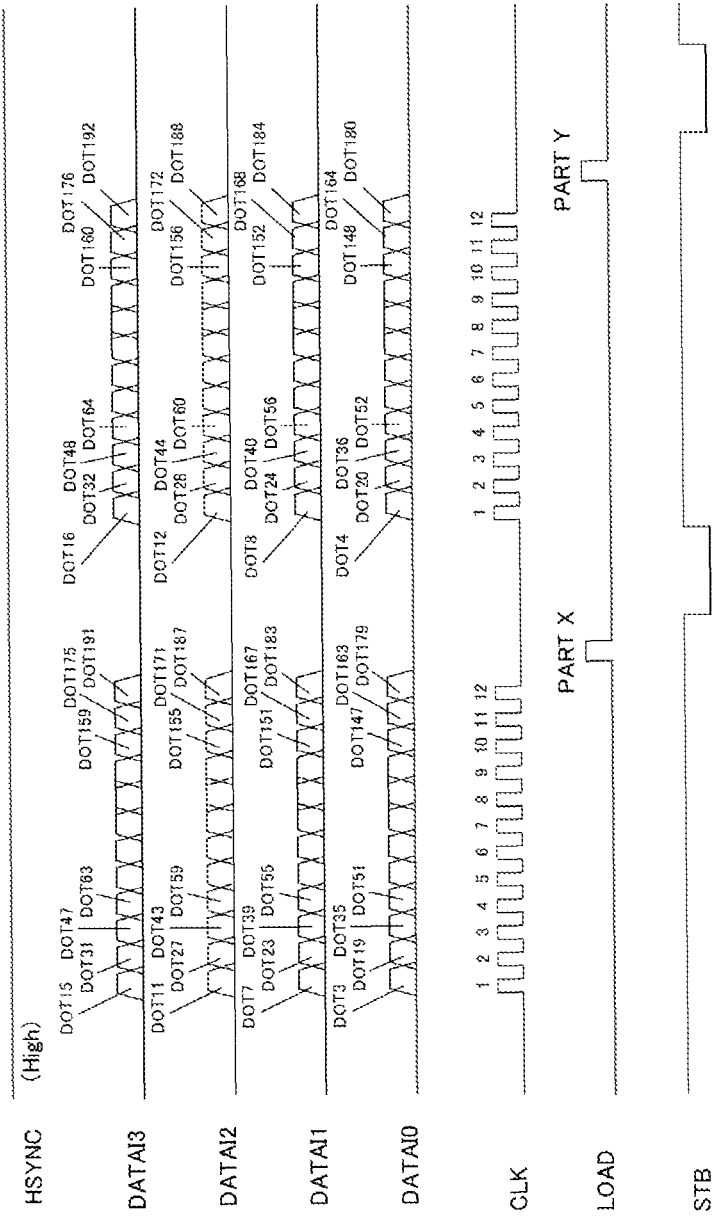
FIG. 25 is a view illustrating operation of the LED head processing the printing data signal.

The LED head 203 composed of the LED array 201 and the driver IC DRV1 connected to the LED array 201 processes the printing data signals DATA3~0 through operation shown in FIGS. 24 and 25. For convenience of explanation, FIGS. 24 and 25 illustrate the driver IC DRV1 to explain in detail the operation of the driver IC DRV1.

The print controller 1 inputs the synchronization signal HD-HSYNC into the LED head in association with the start of input of the printing data signals DATA3~0. The print controller 1 then inputs the printing data signals of the dots 1, 5, 9, 13, into the LED head 203, the signals being in synchronization with the first clock of the clock signal HD-CLK. The print controller 1 inputs the printing data signals of the dots 17, 21, 25, 29, into the LED head 203, the signals being in synchronization with the second clock. Herein, since the shift register is composed of 12 stages, input of the printing data signals DATA3~0 corresponding to the single driver IC is completed when the twelfth clock is input. Thereafter, in part V, the print controller 1 inputs the latch signal HD-LOAD-P into the LED head 203 and latches the printing data signals DATA 3~0 into the latch circuits LTA1~12, LTB1~LTB12, LTC1~LTC12, LTD1~LTD12. Next, the print controller 1 inputs the strobe signals HD-STB-N into the LED head 203 to start driving of the LED elements. At this time, the drive IC DRV1 causes the signal output from the terminal KDRV to transition to its high-level state, thereby switching the N-type MOS transistor 36 to an ON-state. In explanation using the example in FIG. 24, the LED elements $LED_2 1$, $LED_2 5$, $LED_2 9$, $LED_2 13$, $LED_2 17$, $LED_2 21$, $LED_2 25$, $LED_2 29$, are to be driven.

Next, the print controller 1 inputs the printing data signals of the dots 2, 6, 10, 14 into the LED head 203, the signals being in synchronization with the first clock of the clock signal HD-CLK. The print controller 1 inputs the printing data signals of the dots 18, 22, 26, 30 into the LED head 203, the signals being in synchronization with the second clock. Input of the printing data signals DATA3~0 corresponding the single driver IC is completed when the twelfth clock is input. Thereafter, the print controller 1 inputs the latch signal HD-LOAD-P into the LED head 203 and latches the printing data signals DATA3~0 into the latch circuits LTA1~12, LTB1~LTB12, LTC1~LTC12, LTD1~LTD12. The print controller 1 inputs the strobe signal HD-STB-N to start driving of the LED elements. At this time, the drive IC DRV2, not shown, causes the signal output from the terminal KDRV to transition to its high-level state, thereby switching the N-type MOS transistor 35 to an ON state. In explanation using the example in FIG. 24, the LED elements $LED_2 2$, $LED_2 6$, $LED_2 10$, $LED_2 14$, $LED_2 18$, $LED_2 22$, $LED_2 26$, $LED_2 30$, are to be driven.

In subsequent FIG. 25, the print controller 1 inputs the printing data signals of the dots 3, 7, 11, 15 into the LED head 203, the signals being in synchronization with the first clock of the clock signal HD-CLK. The print controller 1 inputs the printing data of the dots 19, 22, 27, 31 into the LED head 203, the signals being in synchronization with the second clock.

Input of the printing data signals DATA3~0 corresponding to the single driver IC is completed when the twelfth clock is input. Thereafter, in part X, the print controller 1 inputs the latch signal HD-LOAD-P into the LED head 203 and latches the printing data signals DATA 3~0 into the latch circuits LTA1~12, LTB1~LTB12, LTC1~LTC12, LTD1~LTD12. The print controller 1 then inputs the strobe signal HD-STB-N into the LED head 203 to start driving of the LED elements. At this time, the drive IC DRV3 causes the signal output from the terminal KDRV to transition to its high-level state, thereby switching the N-type MOS transistor 34 to an ON state. In explanation using the example in FIG. 24, the LED elements $LED_2 3$, $LED_2 7$, $LED_2 11$, $LED_2 15$, $LED_2 19$, $LED_2 23$, $LED_2 27$, $LED_2 31$, are to be driven.

The print controller 1 inputs the printing data signals of the dots 4, 8, 12, 16 into the LED head 203, the signals being in synchronization with the first clock of the clock signal HD-CLK. The print controller 1 inputs the printing data of the dots 20, 24, 28, 32, into the LED head 203, the signals being in synchronization with the second clock. Input of the printing data signals DATA3~0 corresponding to one of the driver ICs DRV1, DRV2, . . . , DRV26 is completed when the twelfth clock is input. Thereafter, in part Y, the print controller 1 inputs the latch signal HD-LOAD-P into the LED head 203 and latches the printing data signals DATA 3~0 into the latch circuits LTA1~12, LTB1~LTB12, LTC1~LTC12, LTD1~LTD12. The print controller 1 then inputs the strobe signal HD-STB-N into the LED head 203 to start driving of the LED elements. At this time, the drive IC DRV4 causes the signal output from the terminal KDRV to transition to its high-level state, thereby switching the N-type MOS transistor 33 to an ON state. In explanation using the example in FIG. 24, the LED elements $LED_2 4$, $LED_2 8$, $LED_2 12$, $LED_2 16$, $LED_2 20$, $LED_2 24$, $LED_2 28$, $LED_2 32$, are to be driven.

The print controller 1 and the LED head subsequently repeat the same operation so that the image carrier, not shown, holds an electrostatic latent image thereon based on the print data signals DATA3~0.

Figure 26:
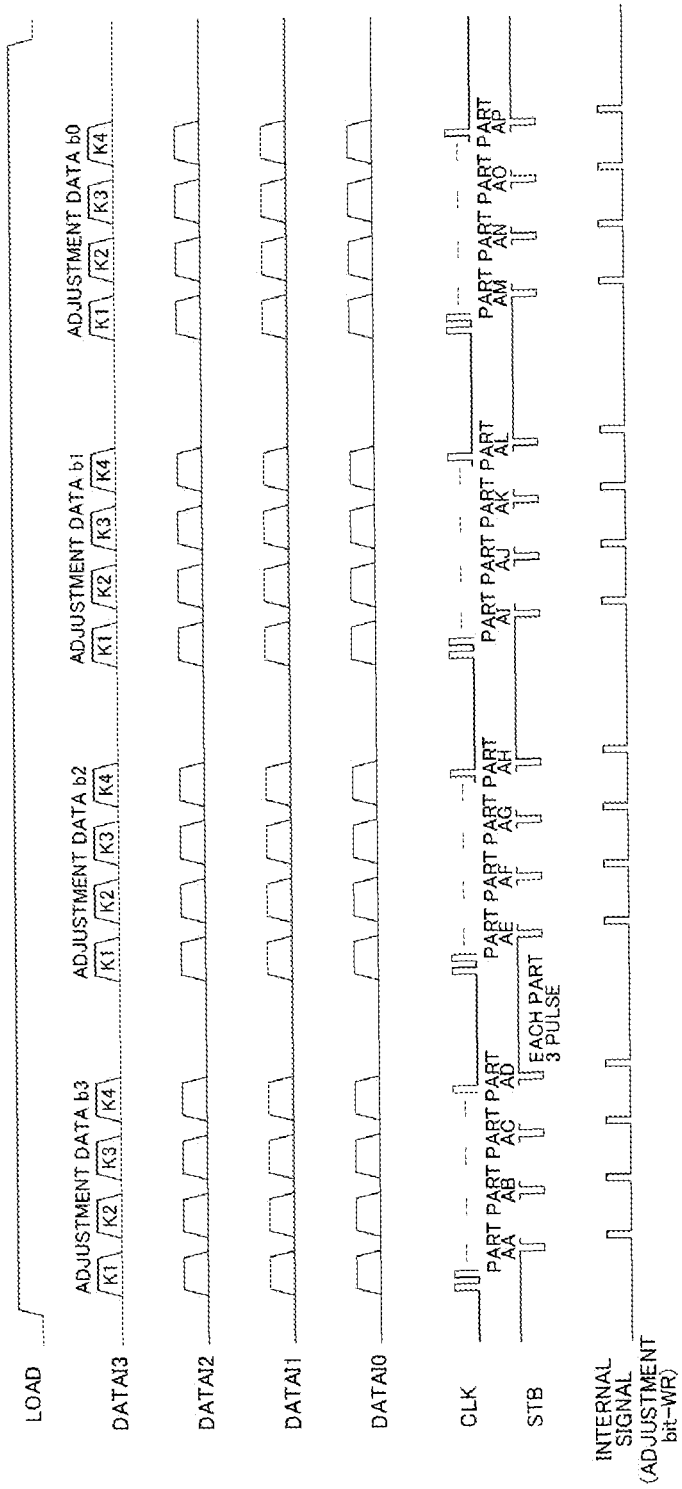
FIG. 26 is a view illustrating operation of the LED head processing an adjustment data signal.
Figure 27:
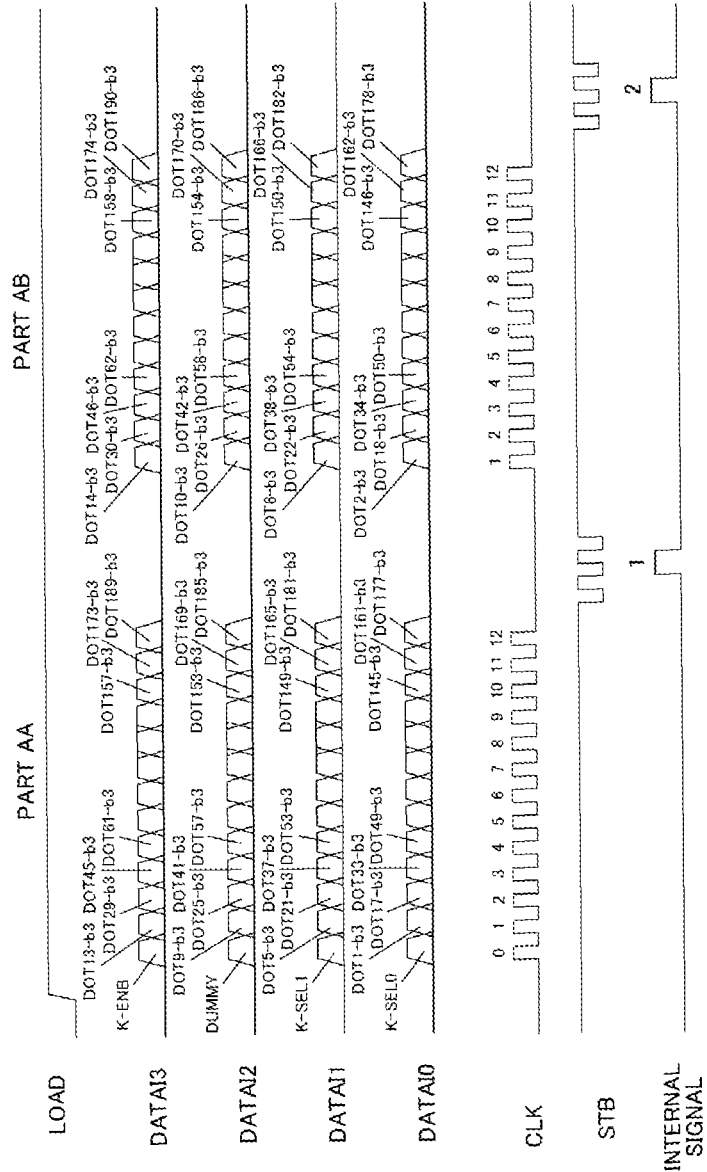
FIG. 27 is an enlarged view of essential parts in FIG. 26.

Explained next with reference to FIGS. 26 to 34 is how the print controller 1 inputs the adjustment data signal into the LED array 201. FIG. 26 is a schematic view of the adjustment data signal to be input. FIGS. 27 to 34 are each a view showing details of each of elements shown in FIG. 26.

The print controller 1 inputs four-bit signal per dot into the LED head, in which the four-bit signal is defined as an adjustment data signal and is composed of adjustment data signals bit3, bit2, bit 1, bit0. To be more specific, the print controller 1 causes the LOAD signal to transition to its high-level state prior to input of the adjustment data signals bit3, bit2, bit 1, bit0 into the LED head 203.

The print controller 1 next inputs an enable signal K-ENB and select signals K-SEL0, K-SEL1 arranged in the starting position of the adjustment data signal bit3. At this time, the terminal DATA12 is assigned with a dummy signal DUMMY since there is no signal to be input.

The print controller 1 inputs adjustment data K1 out of the adjustment data signal bit3 into the LED head 203 subsequently to those signals, the data K1 being in synchronization with the clock signal CLK. The adjustment data signal bit3 to be input into the LED head 203 is defined as an adjustment data signal related to the dots 1, 5, 9, . . . , 185, 189. The print controller 1 inputs the strobe signal HD-STB-N with three pulses into the LED head 203 so that the memory cell array 47 memorizes the adjustment data signal bit3. Upon reception of input of the strobe signal HD-STB-N, the writing control circuit 43 of the LED head 203 outputs a writing command with respect to the memory cell circuit 61 using the terminals W3, W2, W1, W0 and the terminals E3, E2, E1, E0. The memory cell circuit 61 memorizes the adjustment data signal having been input through the shift register.

Next, in part AB, the print controller 1 inputs adjustment data K2 out of the adjustment data signal bit3 into the LED head 203 subsequently to those signals, the data K2 being in synchronization with the clock signal CLK. The adjustment data signal bit3 to be input into the LED head 203 is defined as an adjustment data signal related to the dots 2, 6, 10, . . . , 186, 190. The print controller 1 inputs the strobe signal HD-STB-N with three pulses into the LED head 203 so that the memory cell array 47 memorizes the adjustment data signal bit3. Upon reception of input of the strobe signal HD-STB-N, the writing control circuit 43 of the LED head 203 outputs the writing command with respect to the memory cell circuit 61 using the terminals W3, W2, W1, W0 and the terminals E3, E2, E1, E0. The memory cell circuit 61 memorizes the adjustment data signal having been input through the shift register.

Figure 28:
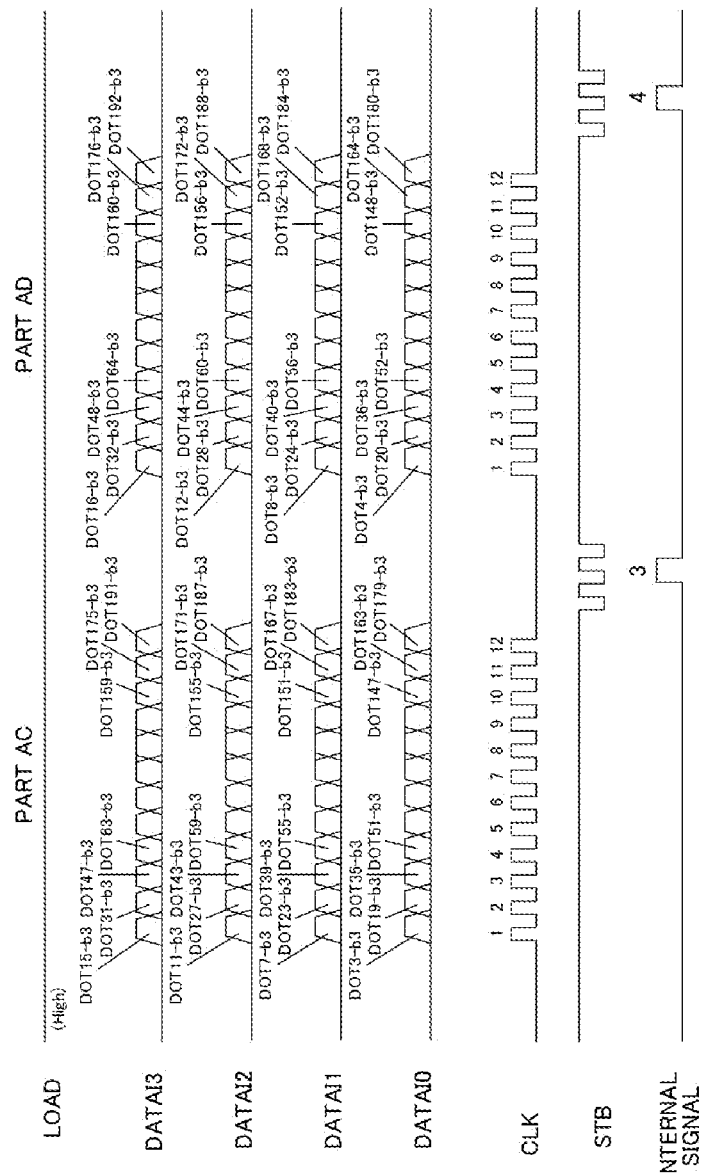
FIG. 28 is an enlarged view of the essential parts in FIG. 26.

Subsequently, as shown in FIG. 28, in part AC, the print controller 1 inputs the adjustment data K1 out of the adjustment data signal bit3 into the LED head 203 subsequently to those signals, the data K1 being in synchronization with the clock signal CLK. The adjustment data signal bit3 to be input into the LED head 203 is defined as an adjustment data signal related to the dots 3, 7, 11, . . . , 187, 191. The print controller 1 inputs the strobe signal HD-STB-N with three pulses into the LED head 203 so that the memory cell array 47 memorizes the adjustment data signal bit3. Upon reception of input of the strobe signal HD-STB-N, the writing control circuit 43 of the LED head 203 outputs the writing command with respect to the memory cell circuit 61 using the terminals W3, W2, W1, W0 and the terminals E3, E2, E1, E0. The memory cell circuit 61 memorizes the adjustment data signal having been input through the shift register.

Next, in part AD, the print controller 1 inputs the adjustment data K0 out of the adjustment data signal bit3 into the LED head 203 subsequently to those signals, the data K0 being in synchronization with the clock signal CLK. The adjustment data signal bit3 to be input into the LED head 203 is defined as an adjustment data signal related to the dots 4, 8, 12, . . . , 188, 192. The print controller 1 inputs the strobe signal HD-STB-N with three pulses into the LED head 203 so that the memory cell array 47 memorizes the adjustment data signal bit3. Upon reception of input of the strobe signal HD-STB-N, the writing control circuit 43 of the LED head 203 outputs the writing command with respect to the memory cell circuit 61 using the terminals W3, W2, W1, W0 and the terminals E3, E2, E1, E0. The memory cell circuit 61 memorizes the adjustment data signal having been input through the shift register.

Figure 29:
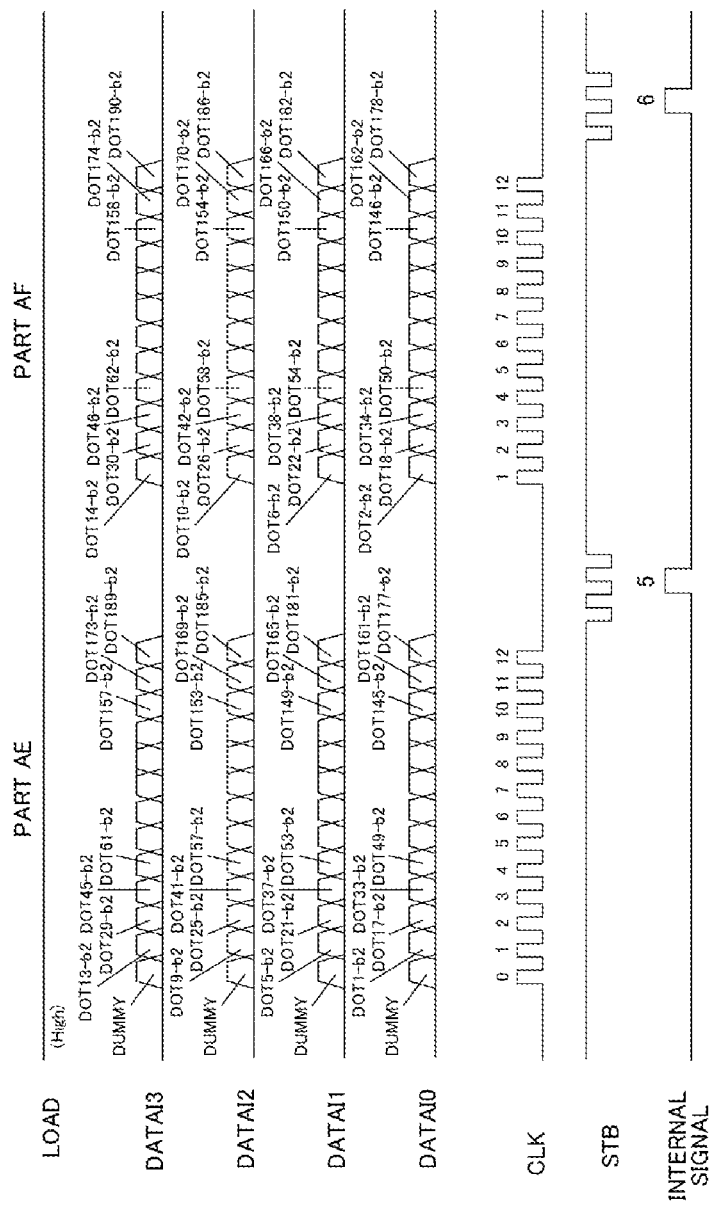
FIG. 29 is an enlarged view of the essential parts in FIG. 26.

The print controller 1 shown in FIG. 29 then assigns dummy data DUMMY to the starting position of the adjustment data signal bit2 and thereafter inputs the adjustment data signal bit2 array into the LED head 203.

The print controller 1 inputs the adjust data K1 out of the adjustment data signal bit2 into the LED head 203 subsequently to those signals, the data K1 being in synchronization with the clock signal CLK. The adjustment data signal bit2 to be input into the LED head 203 is defined as an adjustment data signal related to the dots 1, 5, 9, . . . , 185, 189. The print controller 1 inputs the strobe signal HD-STB-N with three pulses into the LED head 203 so that the memory cell array 47 memorizes the adjustment data signal bit2. Upon reception of input of the strobe signal HD-STB-N, the writing control circuit 43 of the LED head 203 outputs the writing command with respect to the memory cell circuit 61 using the terminals W3, W2, W1, W0 and the terminals E3, E2, E1, E0. The memory cell circuit 61 memorizes the adjustment data signal having been input through the shift register.

In part AF, the print controller 1 then inputs the adjust data K2 out of the adjustment data signal bit2 into the LED head 203 subsequently to those signals, the data K2 being in synchronization with the clock signal CLK. The adjustment data signal bit2 to be input into the LED head 203 is defined as an adjustment data signal related to the dots 2, 6, 10, . . . , 186, 190. The print controller 1 inputs the strobe signal HD-STB-N with three pulses into the LED head 203 so that the memory cell array 47 memorizes the adjustment data signal bit2. Upon reception of input of the strobe signal HD-STB-N, the writing control circuit 43 of the LED head 203 outputs the writing command with respect to the memory cell circuit 61 using the terminals W3, W2, W1, W0 and the terminals E3, E2, E1, E0. The memory cell circuit 61 memorizes the adjustment data signal having been input through the shift register.

Figure 30:
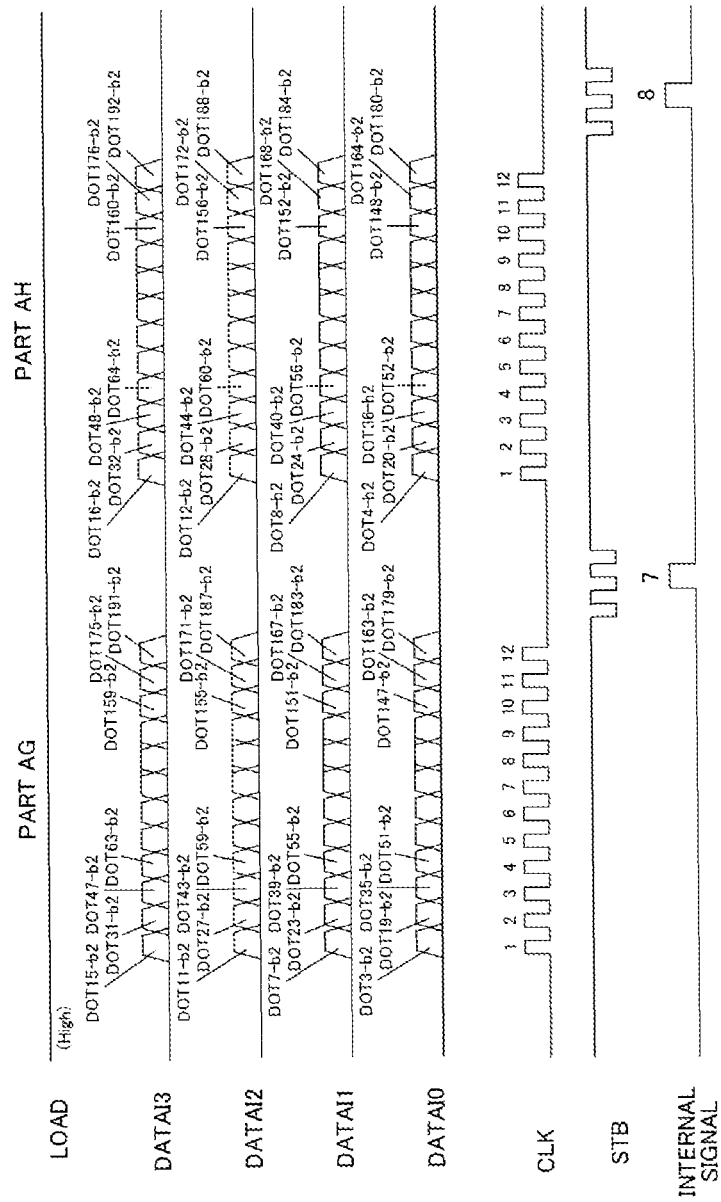
FIG. 30 is an enlarged view of the essential parts in FIG. 26.

Next, as shown in FIG. 30, in part AG, the print controller 1 then inputs the adjust data K1 out of the adjustment data signal bit2 into the LED head 203 subsequently to those signals, the data K1 being in synchronization with the clock signal CLK. The adjustment data signal bit2 to be input into the LED head 203 is defined as an adjustment data signal related to the dots 3, 7, 11, . . . , 187, 191. The print controller 1 inputs the strobe signal HD-STB-N with three pulses into the LED head 203 so that the memory cell array 47 memorizes the adjustment data signal bit2. Upon reception of input of the strobe signal HD-STB-N, the writing control circuit 43 of the LED head 203 outputs the writing command with respect to the memory cell circuit 61 using the terminals W3, W2, W1, W0 and the terminals E3, E2, E1, E0. The memory cell circuit 61 memorizes the adjustment data signal having been input through the shift register.

In part AH, the print controller 1 then inputs the adjust data K0 out of the adjustment data signal bit2 into the LED head 203 subsequently to those signals, the data K0 being in synchronization with the clock signal CLK. The adjustment data signal bit2 to be input into the LED head 203 is defined as an adjustment data signal related to the dots 4, 8, 12, . . . , 188, 192. The print controller 1 inputs the strobe signal HD-STB-N with three pulses into the LED head 203 so that the memory cell array 47 memorizes the adjustment data signal bit2. Upon reception of input of the strobe signal HD-STB-N, the writing control circuit 43 of the LED head 203 outputs the writing command with respect to the memory cell circuit 61 using the terminals W3, W2, W1, W0 and the terminals E3, E2, E1, E0. The memory cell circuit 61 memorizes the adjustment data signal having been input through the shift register.

Figure 31:
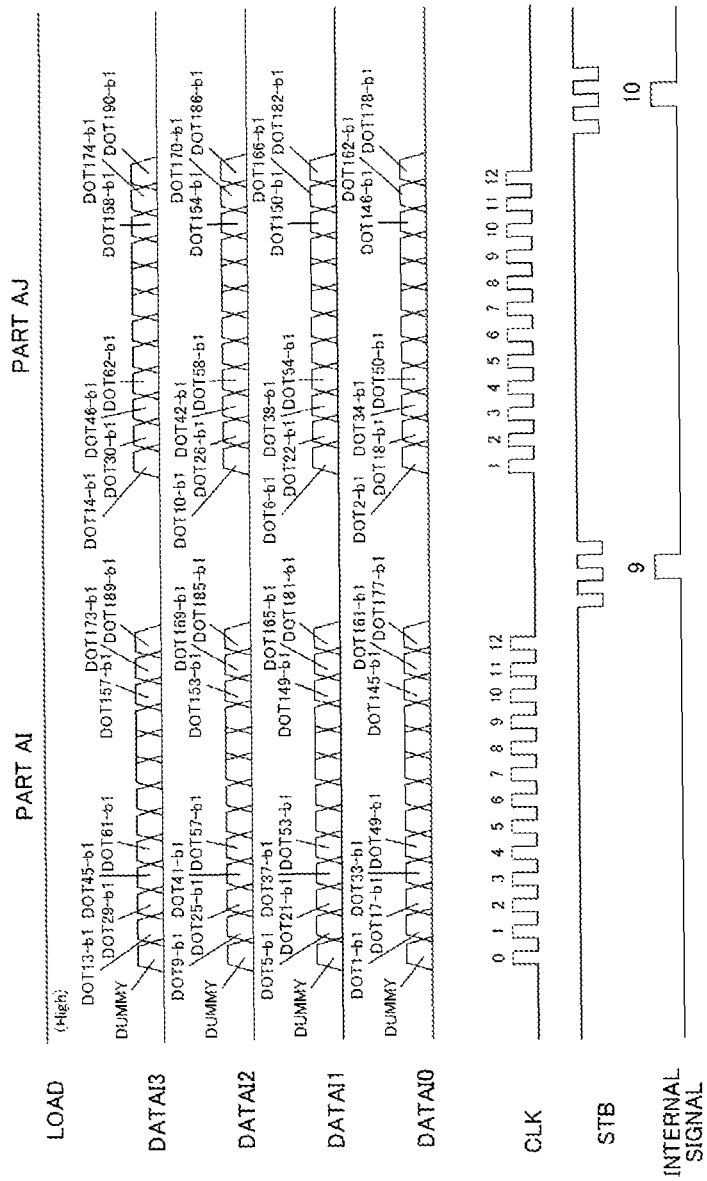
FIG. 31 is an enlarged view of the essential parts in FIG. 26.

Next, the print controller 1, in part AI as shown in FIG. 31, assigns the dummy data DUMMY to the starting position of the adjustment data signal bit1 and thereafter inputs the adjustment data signal bit1 array into the LED head 203.

The print controller 1 then inputs the adjust data K1 out of the adjustment data signal bit1 into the LED head 203 subsequently to those signals, the data K1 being in synchronization with the clock signal CLK. The adjustment data signal bit1 to be input into the LED head 203 is defined as an adjustment data signal related to the dots 1, 5, 9, . . . , 185, 189. The print controller 1 inputs the strobe signal HD-STB-N with three pulses into the LED head 203 so that the memory cell array 47 memorizes the adjustment data signal bit1. Upon reception of input of the strobe signal HD-STB-N, the writing control circuit 43 of the LED head 203 outputs the writing command with respect to the memory cell circuit 61 using the terminals W3, W2, W1, W0 and the terminals E3, E2, E1, E0. The memory cell circuit 61 memorizes the adjustment data signal having been input through the shift register.

In part AJ, the print controller 1 then inputs the adjust data K2 out of the adjustment data signal bit1 into the LED head 203 subsequently to those signals, the data K2 being in synchronization with the clock signal CLK. The adjustment data signal bit1 to be input into the LED head 203 is defined as an adjustment data signal related to the dots 2, 6, 10, ..., 186, 190. The print controller 1 inputs the strobe signal HD-STB-N with three pulses into the LED head 203 so that the memory cell array 47 memorizes the adjustment data signal bit1. Upon reception of input of the strobe signal HD-STB-N, the writing control circuit 43 of the LED head 203 outputs the writing command with respect to the memory cell circuit 61 using the terminals W3, W2, W1, W0 and the terminals E3, E2, E1, E0. The memory cell circuit 61 memorizes the adjustment data signal having been input through the shift register.

Figure 32:
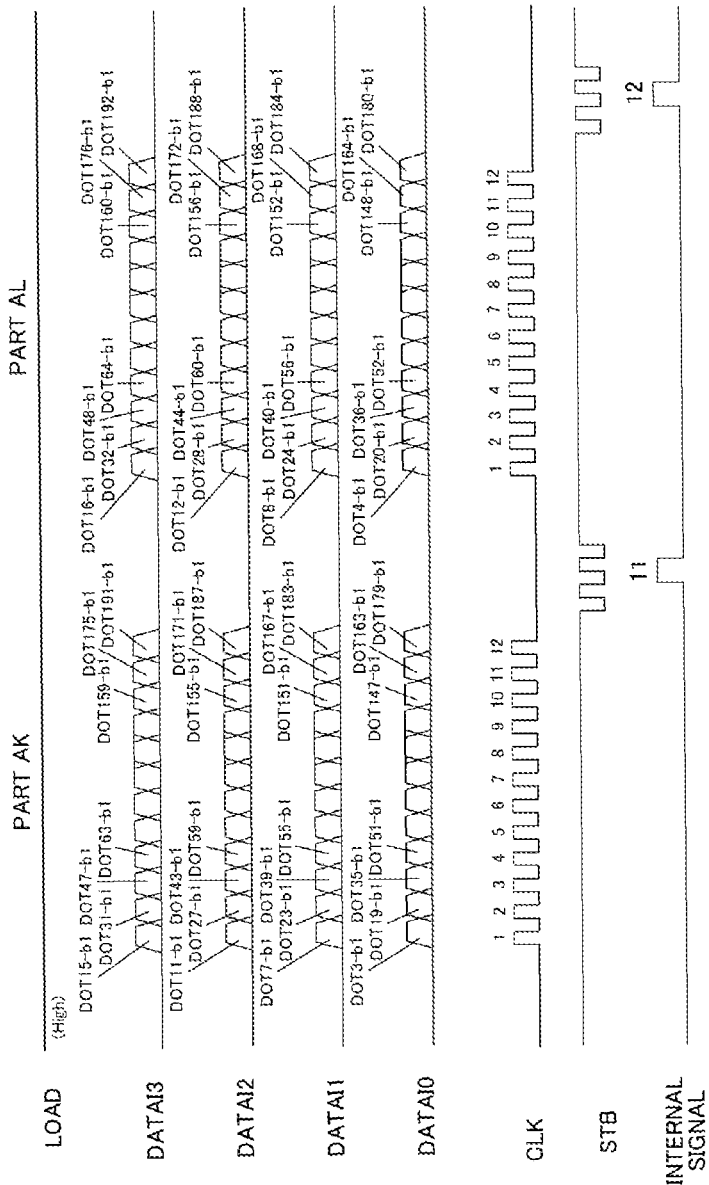
FIG. 32 is an enlarged view of the essential parts in FIG. 26.

As shown in FIG. 32, in part AK, the print controller 1 then inputs the adjust data K1 out of the adjustment data signal bit1 into the LED head 203 subsequently to those signals, the data K1 being in synchronization with the clock signal CLK. The adjustment data signal bit1 to be input into the LED head 203 is defined as an adjustment data signal related to the dots 3, 7, 11, ..., 187, 191. The print controller 1 inputs the strobe signal HD-STB-N with three pulses into the LED head 203 so that the memory cell array 47 memorizes the adjustment data signal bit1. Upon reception of input of the strobe signal HD-STB-N, the writing control circuit 43 of the LED head 203 outputs the writing command with respect to the memory cell circuit 61 using the terminals W3, W2, W1, W0 and the terminals E3, E2, E1, E0. The memory cell circuit 61 memorizes the adjustment data signal having been input through the shift register.

Next, in part AL, the print controller 1 then inputs the adjust data K0 out of the adjustment data signal bit1 into the LED head 203 subsequently to those signals, the data K0 being in synchronization with the clock signal CLK. The adjustment data signal bit1 to be input into the LED head 203 is defined as an adjustment data signal related to the dots 4, 8, 12, ..., 188, 192. The print controller 1 inputs the strobe signal HD-STB-N with three pulses into the LED head 203 so that the memory cell array 47 memorizes the adjustment data signal bit1. Upon reception of input of the strobe signal HD-STB-N, the writing control circuit 43 of the LED head 203 outputs the writing command with respect to the memory cell circuit 61 using the terminals W3, W2, W1, W0 and the terminals E3, E2, E1, E0. The memory cell circuit 61 memorizes the adjustment data signal having been input through the shift register.

Figure 33:
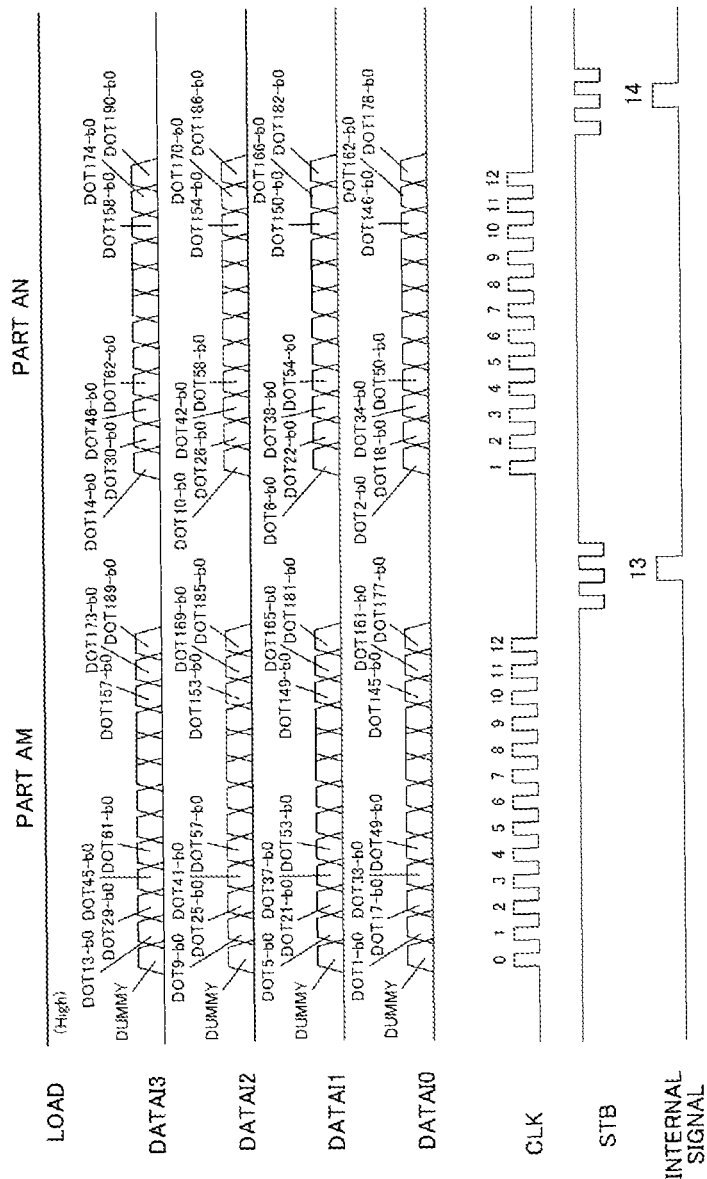
FIG. 33 is an enlarged view of the essential parts in FIG. 26.

Next, the print controller 1, in part AM as shown in FIG. 33, assigns the dummy data DUMMY to the starting position of the adjustment data signal bit0 and thereafter inputs the adjustment data signal bit0 into the LED head 203.

The print controller 1 then inputs the adjust data K1 out of the adjustment data signal bit0 into the LED head 203 subsequently to those signals, the data K1 being in synchronization with the clock signal CLK. The adjustment data signal bit0 to be input into the LED head 203 is defined as an adjustment data signal related to the dots 1, 5, 9, ..., 185, 189. The print controller 1 inputs the strobe signal HD-STB-N with three pulses into the LED head 203 so that the memory cell array 47 memorizes the adjustment data signal bit0. Upon reception of input of the strobe signal HD-STB-N, the writing control circuit 43 of the LED head 203 outputs the writing command with respect to the memory cell circuit 61 using the terminals W3, W2, W1, W0 and the terminals E3, E2, E1, E0. The memory cell circuit 61 memorizes the adjustment data signal having been input through the shift register.

In part AN, the print controller 1 inputs the adjust data K2 out of the adjustment data signal bit0 into the LED head 203 subsequently to those signals, the data K2 being in synchronization with the clock signal CLK. The adjustment data signal bit0 to be input into the LED head 203 is defined as an adjustment data signal related to the dots 2, 6, 10, ..., 186, 190. The print controller 1 inputs the strobe signal HD-STB-N with three pulses into the LED head 203 so that the memory cell array 47 memorizes the adjustment data signal bit0. Upon reception of input of the strobe signal HD-STB-N, the writing control circuit 43 of the LED head 203 outputs the writing command with respect to the memory cell circuit 61 using the terminals W3, W2, W1, W0 and the terminals E3, E2, E1, E0. The memory cell circuit 61 memorizes the adjustment data signal having been input through the shift register.

Figure 34:
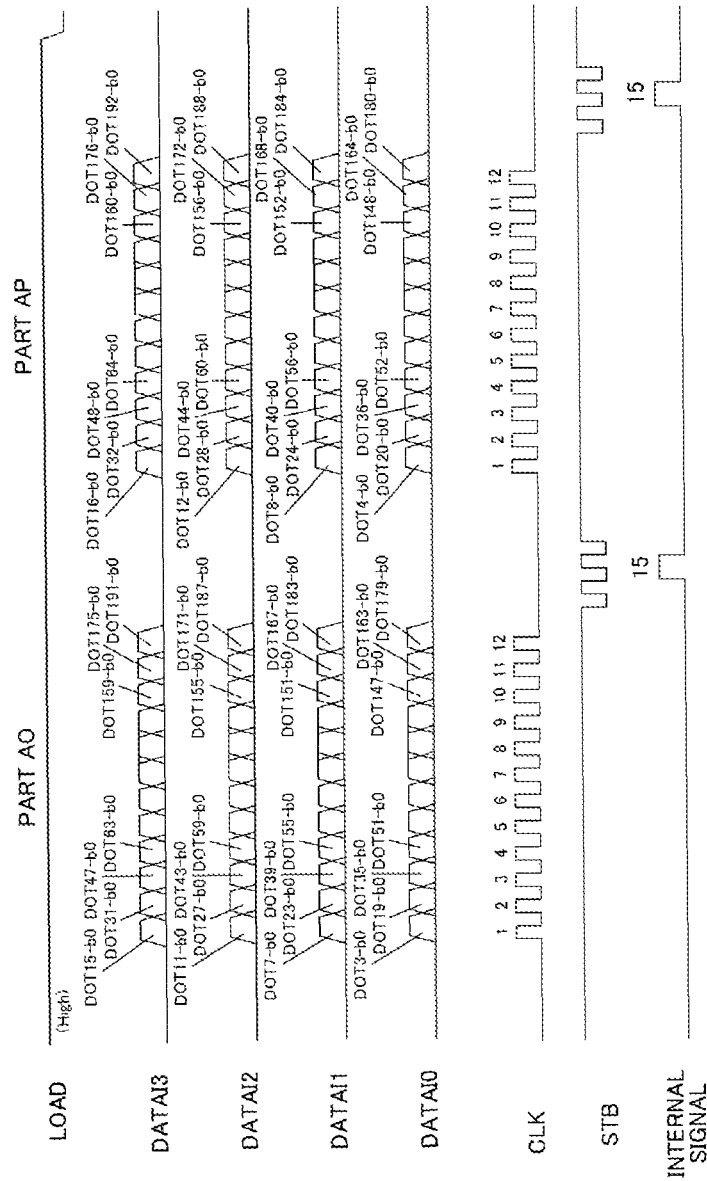
FIG. 34 is an enlarged view of the essential parts in FIG. 26.

As shown in FIG. 34, the print controller 1 then inputs the adjust data K1 out of the adjustment data signal bit0 into the LED head 203 subsequently to those signals, the data K1 being in synchronization with the clock signal CLK. The adjustment data signal bit0 to be input into the LED head 203 is defined as an adjustment data signal related to the dots 3, 7, 11, ..., 187, 191. The print controller 1 inputs the strobe signal HD-STB-N with three pulses into the LED head 203 so that the memory cell array 47 memorizes the adjustment data signal bit0. Upon reception of input of the strobe signal HD-STB-N, the writing control circuit 43 of the LED head 203 outputs the writing command with respect to the memory cell circuit 61 using the terminals W3, W2, W1, W0 and the terminals E3, E2, E1, E0. The memory cell circuit 61 memorizes the adjustment data signal having been input through the shift register.

In part AP, the print controller 1 inputs the adjust data K0 out of the adjustment data signal bit0 into the LED head 203 subsequently to those signals, the data K0 being in synchronization with the clock signal CLK. The adjustment data signal bit0 to be input into the LED head 203 is defined as an adjustment data signal related to the dots 4, 8, 12, ..., 188, 192. The print controller 1 inputs the strobe signal HD-STB-N with three pulses into the LED head 203 so that the memory cell array 47 memorizes the adjustment data signal bit0. Upon reception of input of the strobe signal HD-STB-N, the writing control circuit 43 of the LED head 203 outputs the writing command with respect to the memory cell circuit 61 using the terminals W3, W2, W1, W0 and the terminals E3, E2, E1, E0. The memory cell circuit 61 memorizes the adjustment data signal having been input through the shift register.

Next, a relation among the adjustment signals bits3, bit2, bit1, bit0, the enable signal K-ENB, and the select signals K-SELE0, K-SDEL1 is explained in detail.

Explained first is a case where the enable signal K-ENB and the select signals K-SEL1, K-SEL0 are each set to a low-level signal. The latch signal HD-LOAD transits to its high-level state prior to input of adjustment data signals bit3, bit2, bit1, bit0, from the print controller 1 to the LED head 203, and signals output from the flip-flop circuits FFA13, FFB13, FFD13 become low-level signals. At this time, the operation for writing the adjustment data signal into the memory cell circuit 61 is being executed, which causes the signal output from the terminal W3 of the wiring control circuit 43 to transition to its high-level state and the signal output from the terminal E1 also to transition to its high-level state, so that the memory cell circuit 61 memorizes the enable signal K-ENB and the select signals K-SEL1, K-SEL0 as low-level signals.

Explained next is a case where the enable signal K-ENB is set to a high-level signal and the select signals K-SEL1, K-SEL0 are set to a low-level signal. The latch signal HD-LOAD transits to its high-level state prior to input of adjustment data signals bit3, bit2, bit1, bit0, from the print controller 1 to the LED head 203, and signals output from the flip-flop circuits FFA13, FFB13 become low-level signals while a signal output from the flip-flop circuit FFD13 is set to a high-level signal. At this time, the operation for writing the adjustment data signal into the memory cell circuit 61 is being executed, which causes the signal output from the terminal W3 of the wiring control circuit 43 to transition to its high-level state and the signal output from the terminal E1 also to transition to its high-level state, so that the memory cell circuit 61 memorizes the enable signal K-ENB as a high-level signal and the select signals K-SEL1, K-SEL0 as low-level signals.

Explained next is a case where the enable signal K-ENB and the select signal K-SEL0 are each set to a high-level signal and the select signal K-SEL1 is set to a low-level signal. The latch signal HD-LOAD transits to its high-level state prior to input of adjustment data signals bit3, bit2, bit1, bit0, from the print controller 1 to the LED head 203, and signals output from the flip-flop circuits FFA13, FFD3 become low-level signals while a signal output from the flip-flop circuit FFB3 becomes a low-level signal. At this time, the operation for writing the adjustment data signal into the memory cell circuit 61 is being executed, which causes the signal output from the terminal W3 of the wiring control circuit 43 to transition to its high-level state and the signal output from the terminal E1 also to transition to its high-level state, so that the memory cell circuit 61 memorizes the enable signal K-ENB and the select signal K-SEL0 as high-level signals and the select signal K-SEL1 as a low level signal.

Next, a case where the enable signal K-ENB and the select signals K-SEL1, K-SEL0 are each set to a high-level signal is explained. The latch signal HD-LOAD transits to its high-level state prior to input of adjustment data signals bit3, bit2, bit1, bit0, from the print controller 1 to the LED head 203, and signals output from the flip-flop circuits FFA13, FFB13, FFD13 become high-level signals while a signal output from the flip-flop circuit FFB3 becomes a low-level signal. At this time, the operation for writing the adjustment data signal into the memory cell circuit 61 is being executed, which causes the signal output from the terminal W3 of the wiring control circuit 43 to transition to its high-level state and the signal output from the terminal E1 also to transition to its high-level state, so that the memory cell circuit 61 memorizes the enable signal K-ENB and the select signals K-SEL1, K-SEL0 as high-level signals.

Explained next is a case where the enable signal K-ENB and the select signal K-SEL1 are each set to a high-level signal while the signal K-SEL0 is set to a low-level signal. The latch signal HD-LOAD transits to its high-level state prior to input of adjustment data signals bit3, bit2, bit1, bit0, from the print controller 1 to the LED head 203, and a signal output from the flip-flop circuit FFA13 becomes a low-level signal while signals output from the flip-flop circuits FFB13, FFD13 become high-level signals. At this time, the operation for writing the adjustment data signal into the memory cell circuit 61 is being executed, which causes the signal output from the terminal W3 of the wiring control circuit 43 to transition to its high-level state and the signal output from the terminal E1 also to transition to its high-level state, so that the memory cell circuit 61 memorizes the enable signal K-ENB and the select signal K-SEL1 as high-level signals and K-SEL0 as a low-level signal.

As described above, the LED head 203 according to the third embodiment enables the print controller 1 to input the enable signal K-ENB and the elect signals K-SEL1, K-SEL0 together with the adjust data signals bit3, bit2, bit1, bit0 of the LED element $LED_21$, $LED_22$, ..., $LED_2192$ at the time of input of thereof. The LED head 203 is capable of selecting a signal to be output from the terminal KDRV based on those signals, thereby being able to generate four different control signals for controlling the N-type MOS transistors 33, 34, 35, 36.

With the LED head 203, the printing data signals DATA3~0, which are to be input by being synchronized with the clock signal CLK and the adjustment data signals bit3, bit2, bit1, bit0, can be arranged in a regular array with monotonous regularity. As a result, the print controller 1 is not required any more to have a conversion table for converting an array sequence of the printing data signals DATA3~0 and the adjustment data signals bit3, bit2, bit1, bit0, thereby preventing increase in the production cost of the LED head 203.

The LED head 203 fulfills a function by the aid of the 48 cathode terminals $K_11$, $K_12$, $K_13$, $K_14$. Compared with the conventional LED head, which requires the 54 cathode terminal pads, the LED head 203 saves the effort of connecting the bonding wire, thereby leading to shortening of the assembly time.

With the LED head 203 according to the third embodiment, it becomes possible to change arrays of the anode terminal pads $A_311$, $A_312$, $A_313$, $A_314$, $A_321$, $A_322$, $A_323$, $A_324$, the LED head elements $LED_31$, $LED_32$, ..., $LED_332$, and the cathode pads $K_31$, $K_32$, $K_33$, $K_34$.

Figure 35:
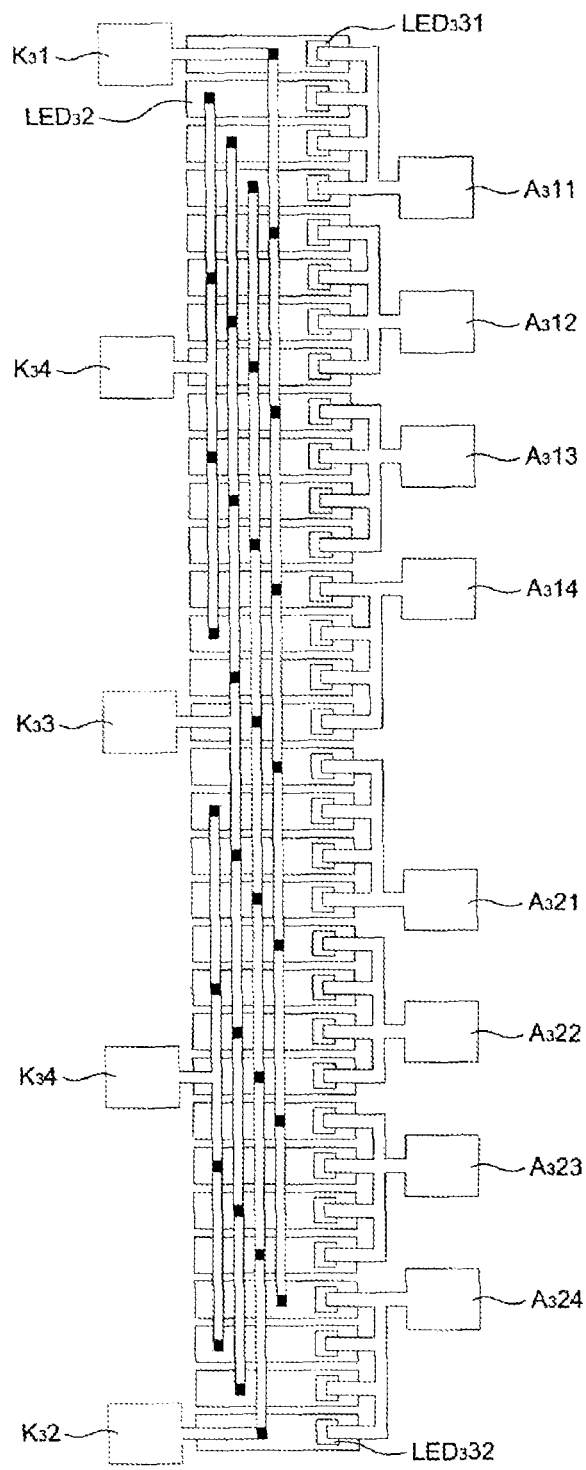
FIG. 35 is a top view of essential parts of a modification example of the LED array according to the third embodiment.

The LED head 205 shown in FIG. 35 is structured such that the anode terminals of the four adjacent LED elements are respectively connected to the anode terminal pad.

The cathode terminals of the LED elements $LED_21$, $LED_25$, $LED_29$, $LED_213$, $LED_217$, $LED_221$, $LED_225$, $LED_229$ from among the LED elements $LED_21$, $LED_22$, ..., $LED_232$ are connected to the cathode terminal pad $K_31$ connected to the N-type MOS transistor 36. The cathode terminals of the LED elements $LED_22$, $LED_26$, $LED_210$, $LED_214$, $LED_218$, $LED_222$, $LED_226$, $LED_230$ are connected to the two cathode terminal pads $K_32$ connected to the N-type MOS transistor 35. The cathode terminals of the LED elements $LED_23$, $LED_27$, $LED_211$, $LED_215$, $LED_219$, $LED_223$, $LED_227$, $LED_231$ are connected to the cathode terminal pad $K_33$ of the N-type MOS transistor 34. The cathode terminals of the LED elements $LED_24$, $LED_28$, $LED_212$, $LED_216$, $LED_220$, $LED_224$, $LED_228$, $LED_232$ are connected to the cathode terminal pad $K_34$ of the N-type MOS transistor 33.

The LED head 205 fulfills a function as a whole by the aid of the thirty cathode terminal pads, thereby remarkably enhancing the effects described above.

Hereinafter, a fourth embodiment will be explained in detail.

The conventional LED array 1013 shown in FIG. 14 requires matrix wiring in order to connect the cathode terminals of the LED elements $LED_11$, $LED_12$, ..., $LED_1192$ to the cathode terminal pads K1, K2, K3, K4. In such a case as using the matrix wiring, a plurality of wiring layers are required such that each of the wires remains independence in an intersecting part between the wires. In the case of forming the plurality of metal wiring layers, however, the number of masks at the time of manufacture is increased while the number of times a photolithography process is executed is also increased, which makes it difficult to reduce the production cost of the LED head having the LED arrays. With the structure shown in FIG. 13, the LED head is engineered such that the number of masks required at the time of manufacturing can be reduced by providing a single metal wiring layer and connecting the metal wires by an n-type semiconductor diffusion layer. In the case of four-divisional matrix driving, such a wiring structure as shown in FIG. 14 has been publicly known but a method for achieving an eight-divisional matrix driving has been previously unknown.

In consideration of the above situation, the fourth embodiment relates to the LED head, in which a metal wire inside the LED array is composed of a layer made of the same uncrossed wire, the LED head being capable of decreasing the number of times a photolithography process is excused at the time of manufacture.

Figure 36:
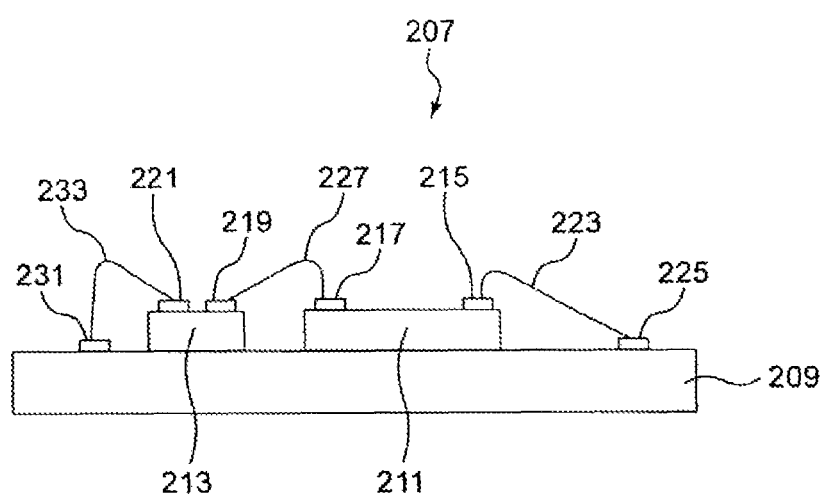
FIG. 36 is a side view of an LED head according to a fourth embodiment, for illustrating a structure of the LED head.
Figure 37:
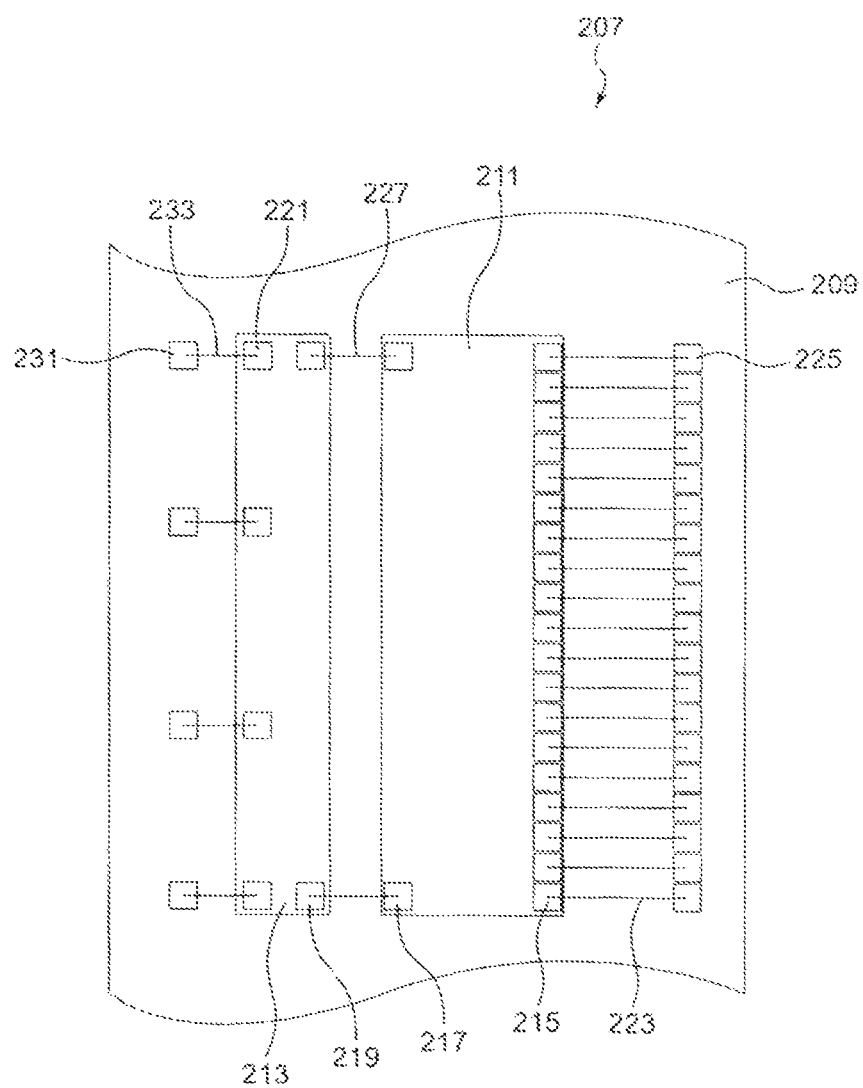
FIG. 37 is a top view of essential parts of the LED head.
Figure 38:
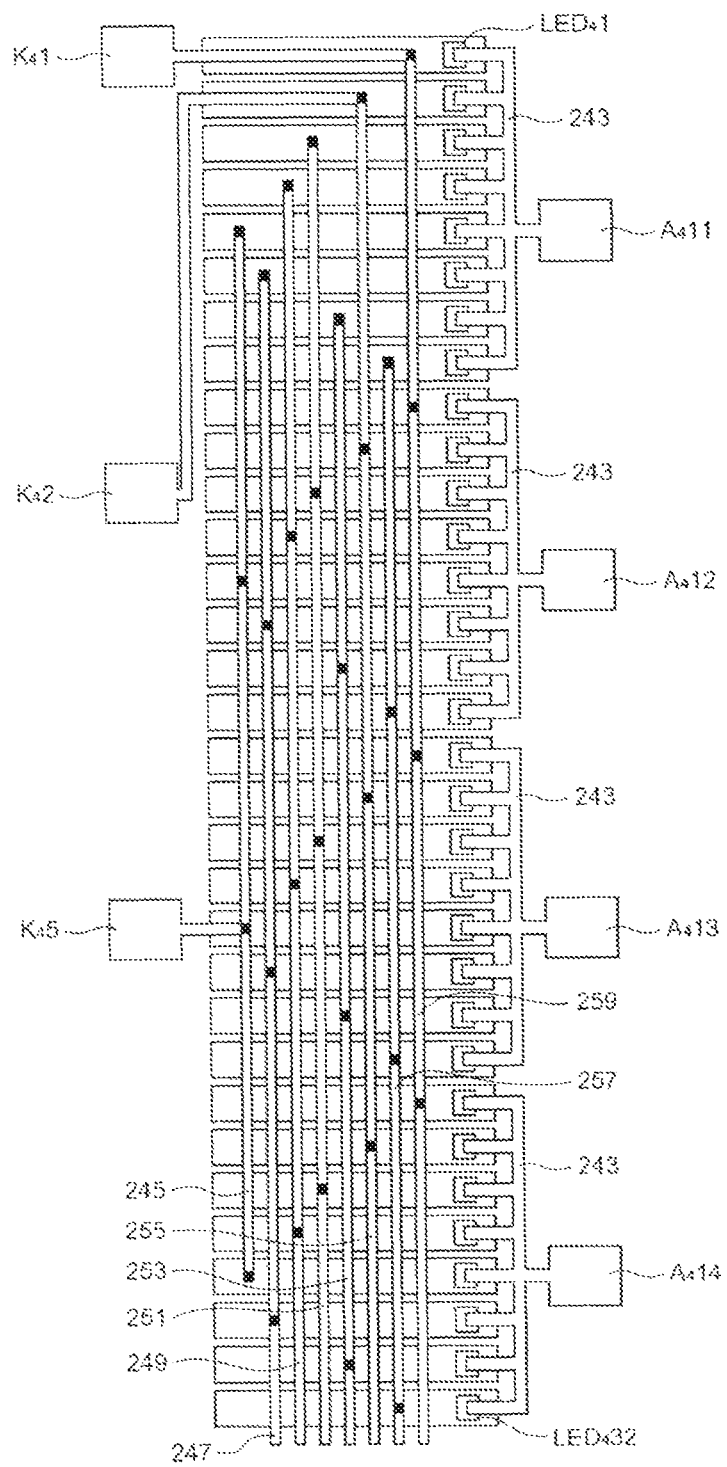
FIG. 38 is a top view of essential parts of an LED array of the LED head, for illustrating a structure of the LED array.
Figure 39:
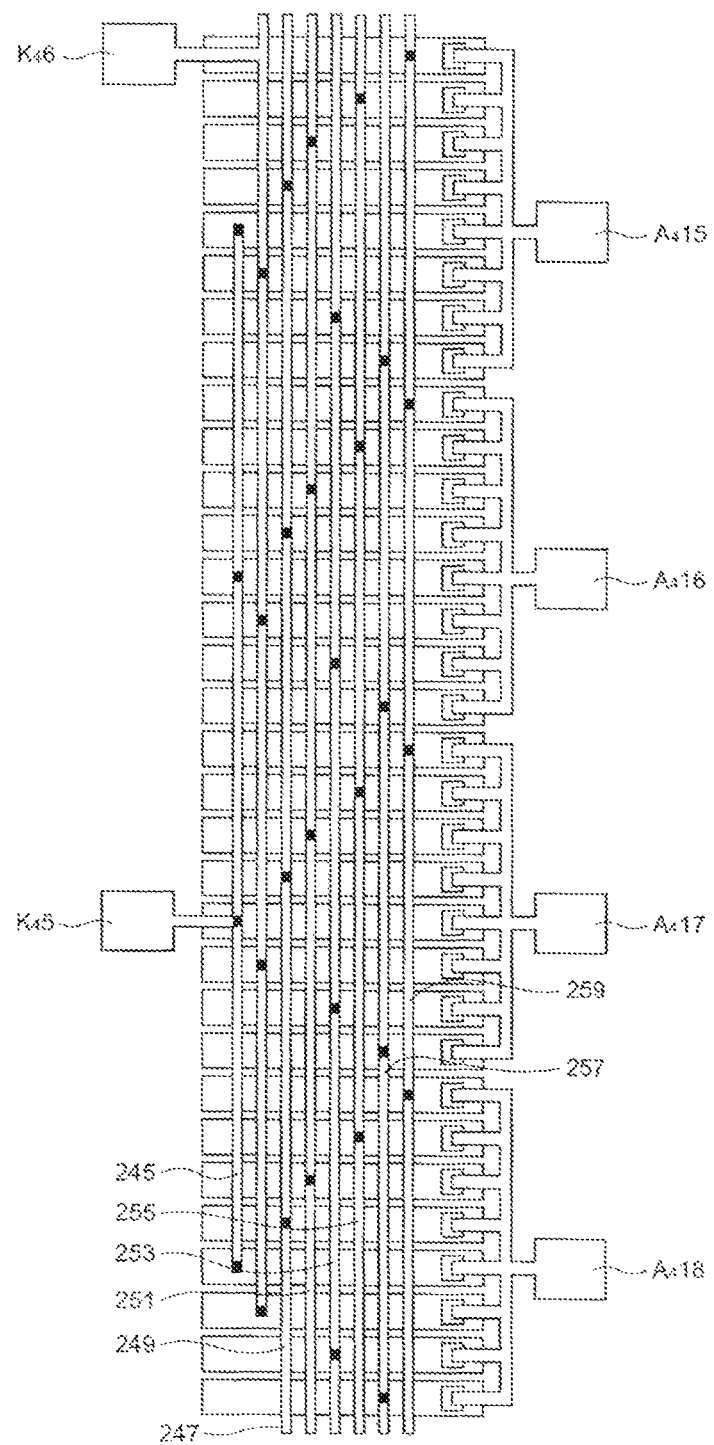
FIG. 39 is a top view of the essential parts of the LED array of the LED head, for illustrating the structure of the LED array.
Figure 40:
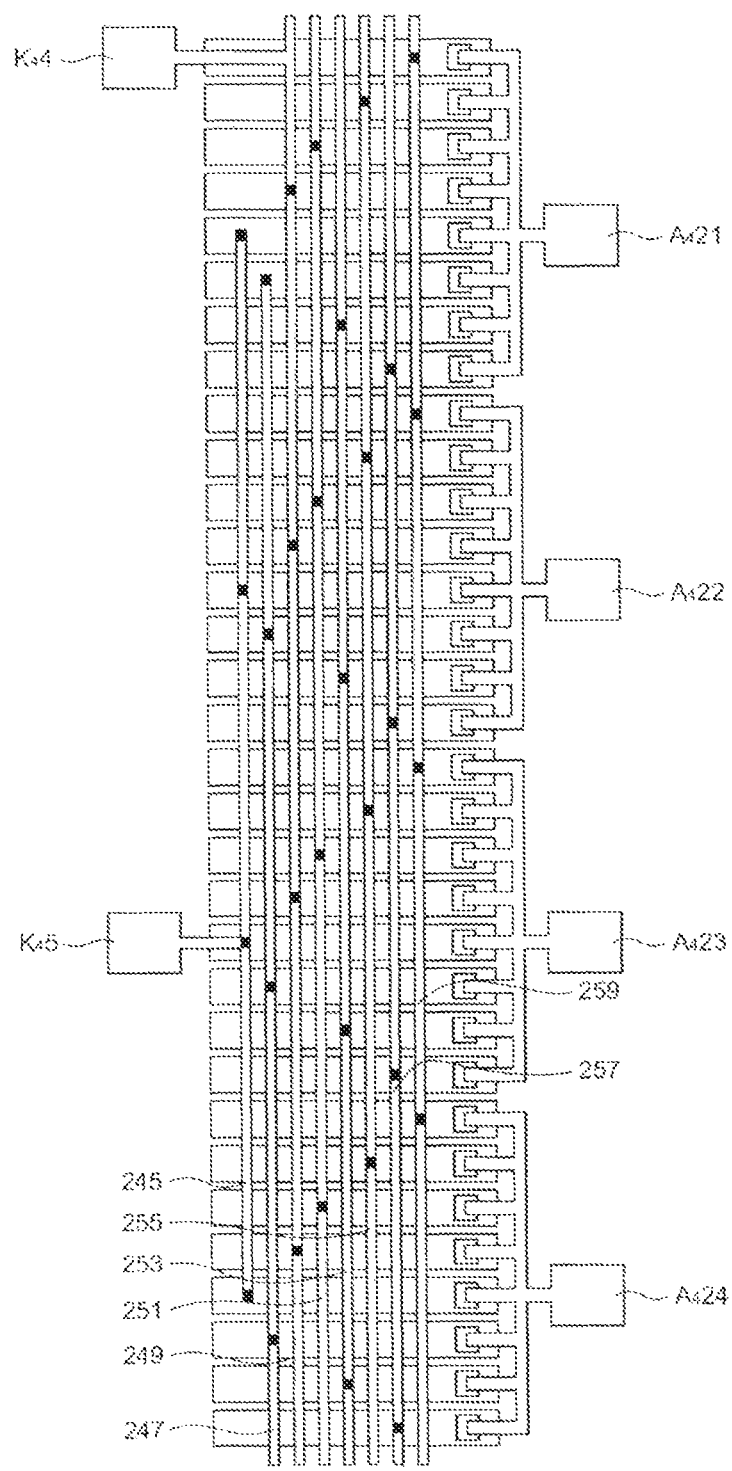
FIG. 40 is a top view of the essential parts of the LED array of the LED head, for illustrating the structure of the LED array.
Figure 41:
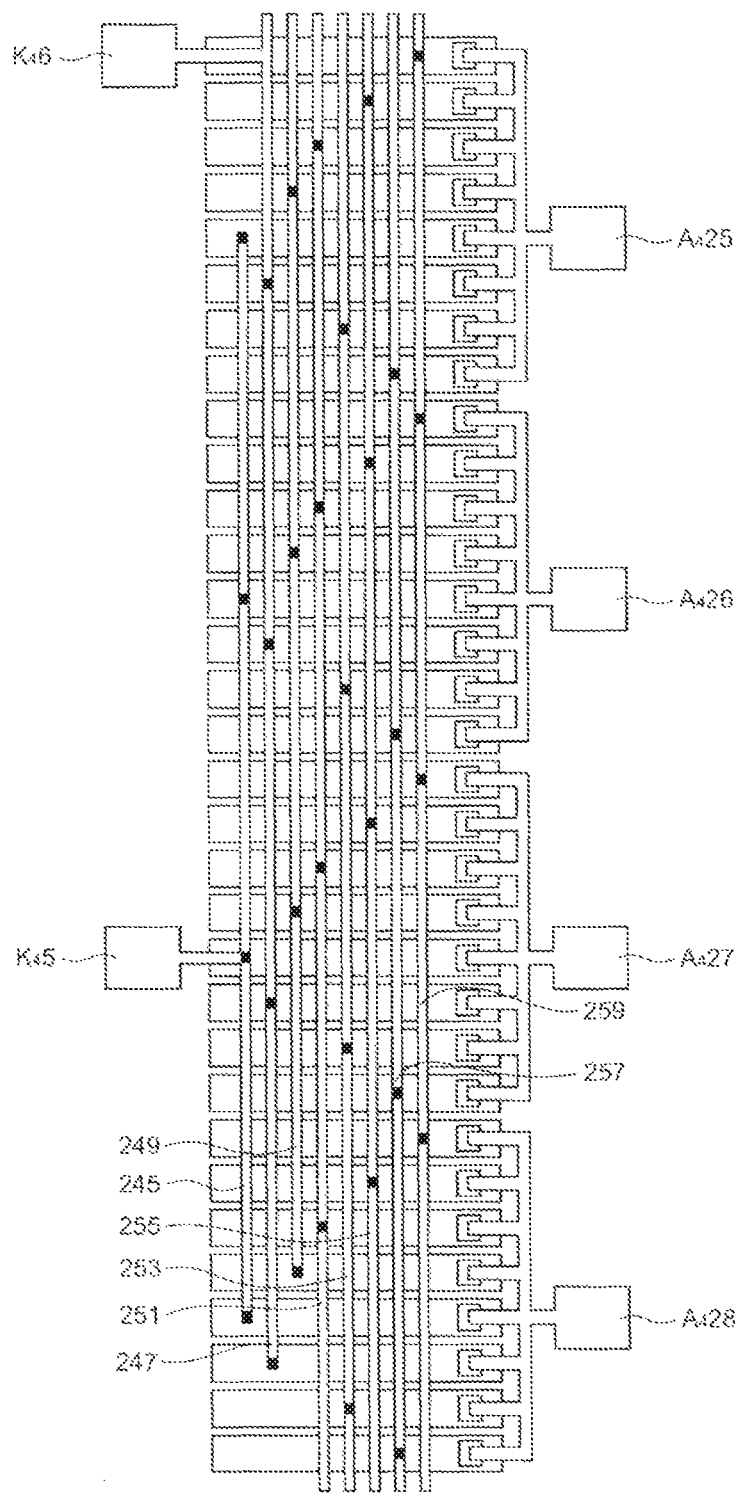
FIG. 41 is a top view of the essential parts of the LED array of the LED head, for illustrating the structure of the LED array.
Figure 42:
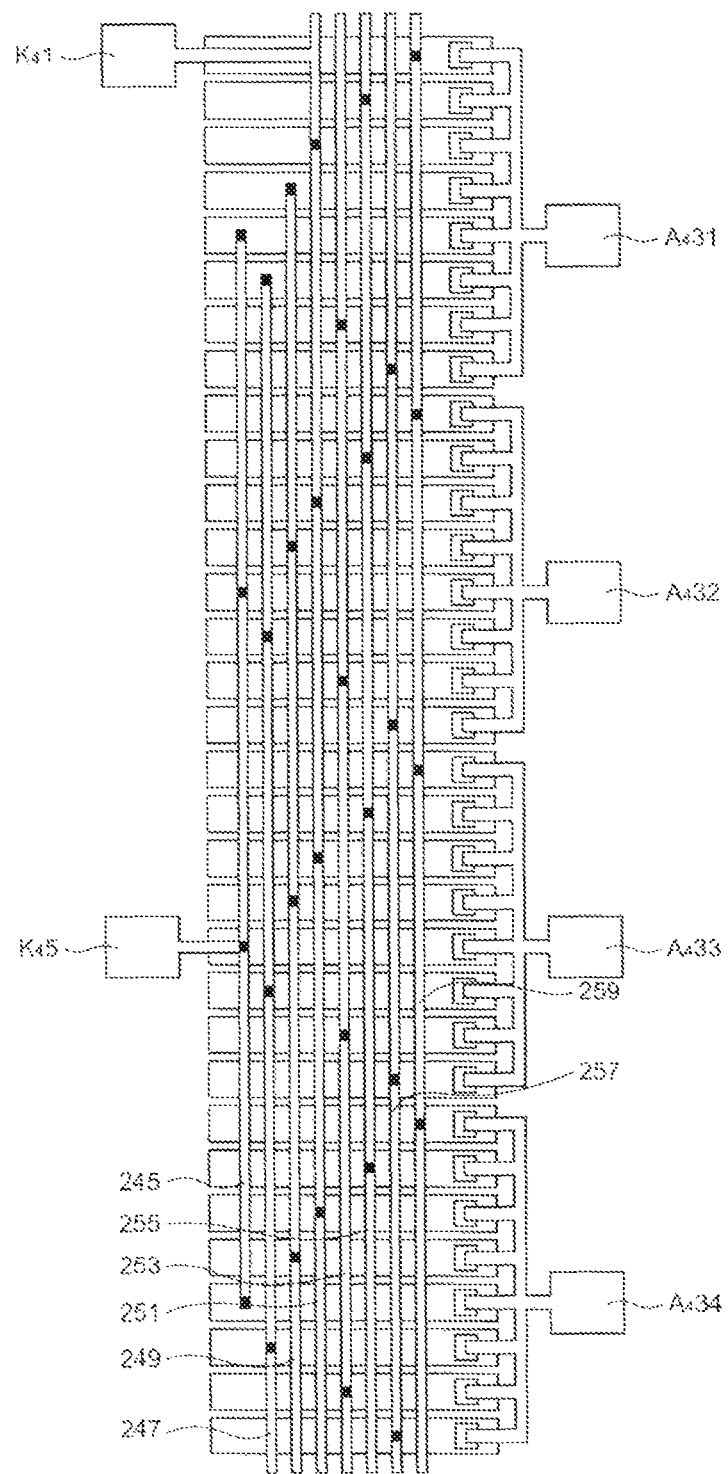
FIG. 42 is a top view of the essential parts of the LED array of the LED head, for illustrating the structure of the LED array.
Figure 43:
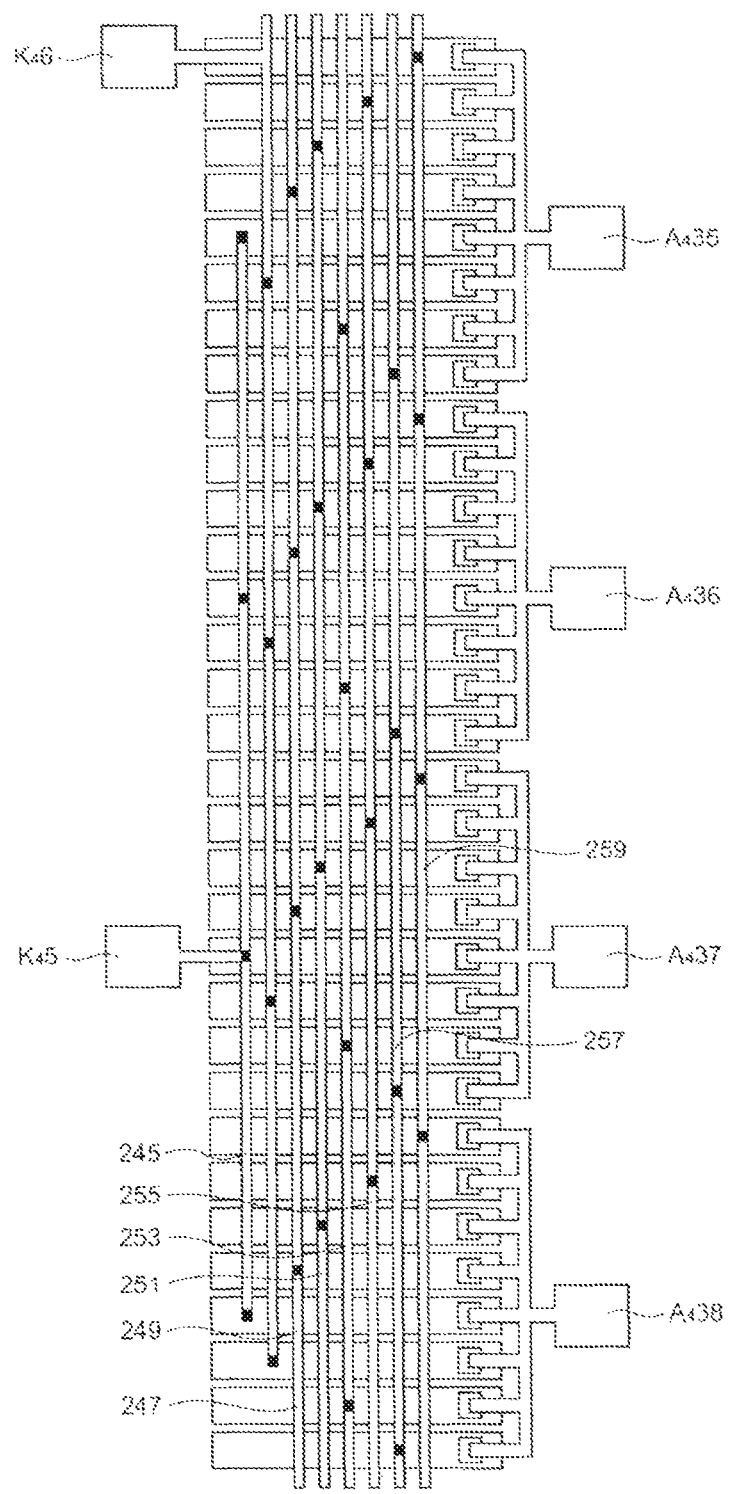
FIG. 43 is a top view of the essential parts of the LED array of the LED head, for illustrating the structure of the LED array.
Figure 44:
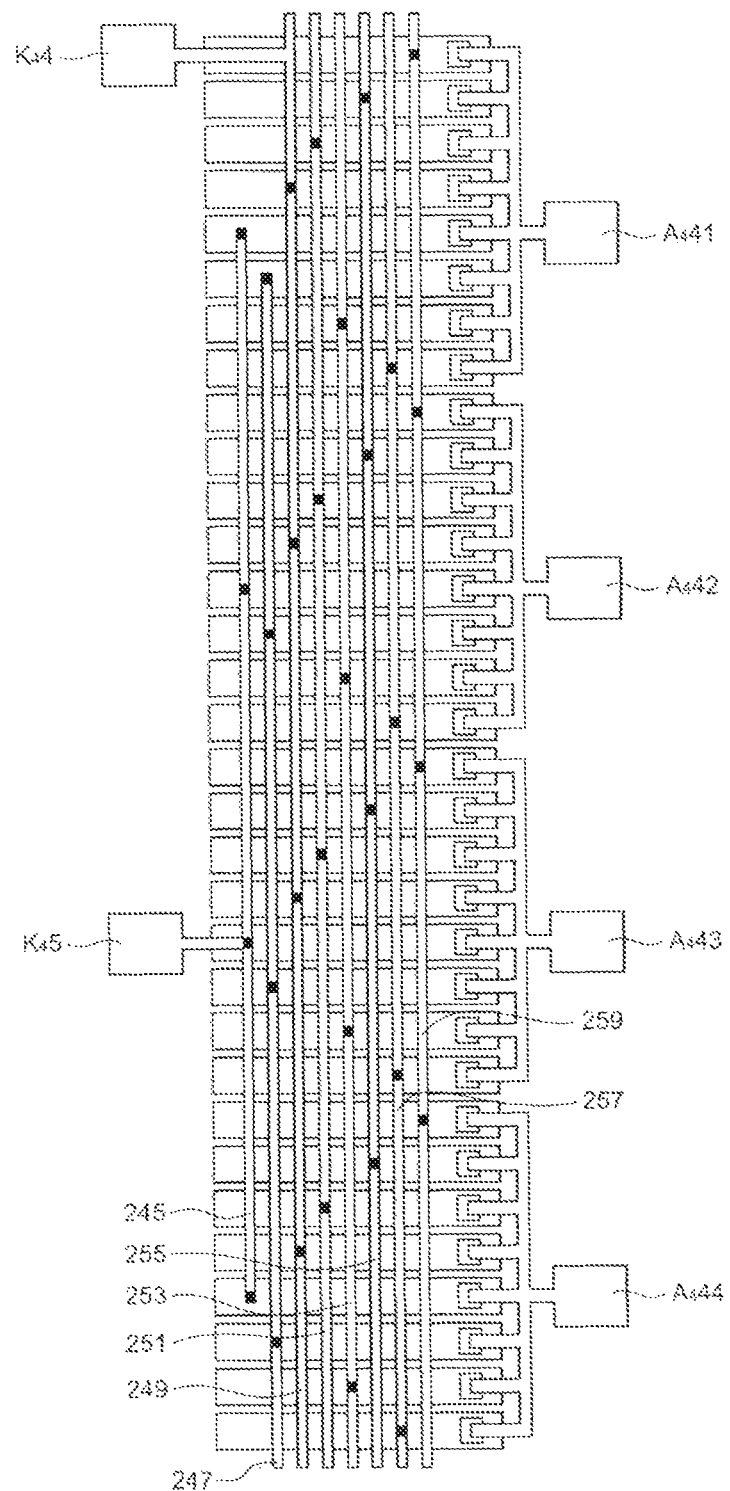
FIG. 44 is a top view of the essential parts of the LED array of the LED head, for illustrating the structure of the LED array.
Figure 45:
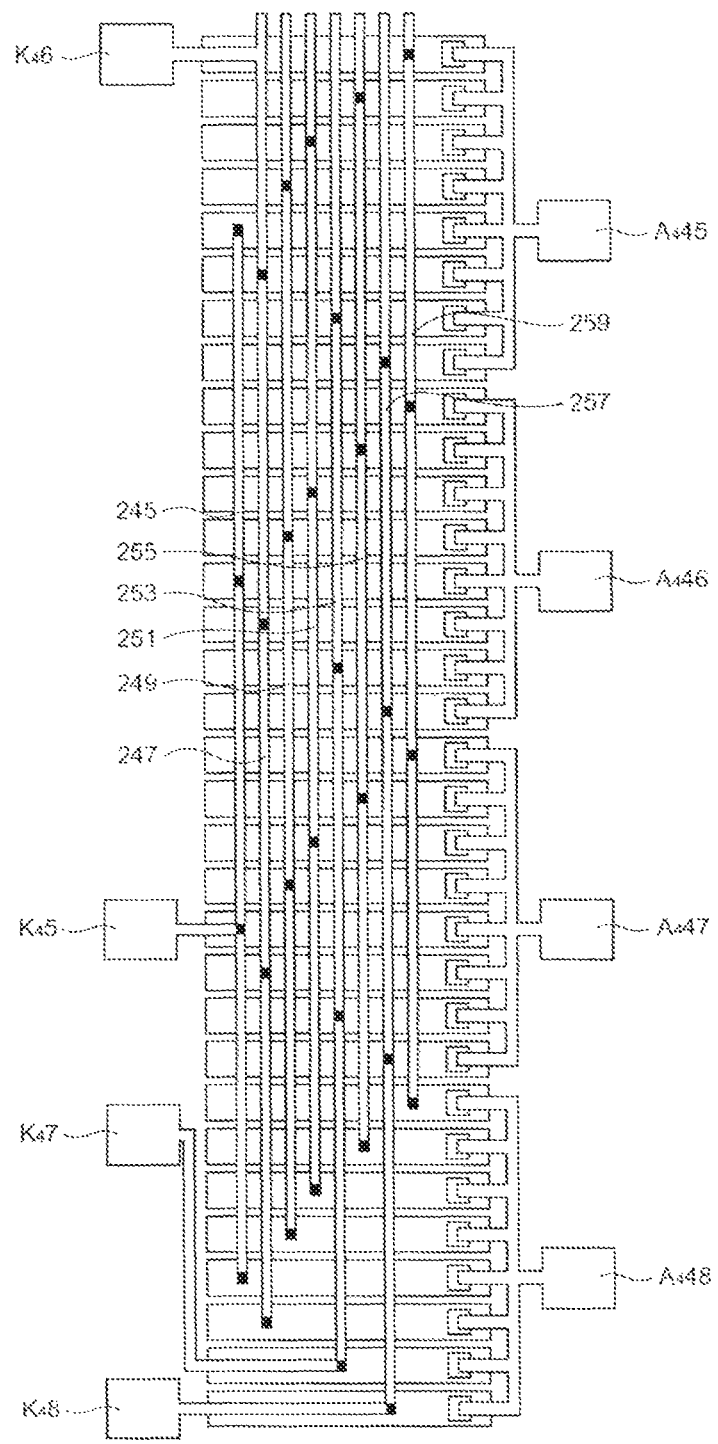
FIG. 45 is a top view of the essential parts of the LED array of the LED head, for illustrating the structure of the LED array.

As shown in FIGS. 36, 37, the LED head 207 is structured by arranging a drive IC 211 and an LED array 213 on a predetermined printed substrate 209. The drive IC 211 has a surface thereof provided with an input/output pad array 215 and an LED drive pad array 217. Furthermore, the LED array 213 has a surface provided with an anode pad array 219 composed of 96 anode terminal pads, $A_411, A_412, \ldots$, and a cathode pad array 221 composed of cathode terminal pads $K_41, K_42, K_43, K_44$. The input/output pad array 215 is connected to the terminal pad array 225 formed on the printed wiring board 209 via a bonding wire 223. A cathode pad array 221 is connected to a terminal pad array 231 formed on the printed wiring substrate 209 via a bonding wire 233. The LED head 207 as described above is capable of printing A4-sized papers. The LED array 213 provided to the LED head 207 has 768 LED heads, $LED_41, LED_42, \ldots, LED_4768$, and has a 2400 dpi resolution. The LED head 207 is formed by arranging the 26 LED arrays and the 26 drive ICs, and has the 19968 LED elements, $LED_41, LED_42, \ldots$. For convenience of explanation, the following is a detailed description of one part of the single LED array 213 in the fourth embodiment. To be more specific, as shown in FIGS. 38 to 45, one-third of the single LED array 213 is extracted for detailed explanation.

The anode terminals of the 768 LED elements, $LED_41, LED_42, \ldots, LED_4768$, composing the LED array 213 are connected to each other and to the anode terminal pads $A_411, A_412, \ldots$, in a manner that the anode terminals of the eight adjacent LED elements are connected to each other and connected to the common anode terminal pad. The LED array 213 is structured such that the cathode terminals of the first LED elements in the groups composed of the eight LED elements connected to the anode terminal pads $A_411, A_412, \ldots$, that is, the cathode terminals of the LED elements $LED_41, LED_49, LED_417, \ldots, LED_4764, LED_4771$ are connected to the cathode terminal pad $K_41$ connected to the N-type MOS transistor, not shown. In a manner similar to the above, the cathode terminals of the LED elements $LED_42, LED_410, LED_418, \ldots, LED_4765, LED_4762$, the cathode terminals of the LED elements $LED_43, LED_411, LED_419, \ldots, LED_4766, LED_4773$, the cathode terminals of the LED elements $LED_44, LED_412, LED_420, \ldots, LED_4767, LED_4774$, the cathode terminals of the LED elements $LED_45, LED_413, LED_421, \ldots, LED_4768, LED_4775$, the cathode terminals of the LED elements $LED_46, LED_414, LED_422, \ldots, LED_4769, LED_4776$, the cathode terminals of the LED elements $LED_47, LED_415, LED_423, \ldots, LED_4770, LED_4777$, and the cathode terminals of the LED elements $LED_48, LED_416, LED_424, \ldots, LED_4771, LED_4778$, are connected to the cathode terminal pads $K_42, K_43, K_44, K_45, K_46, K_47, K_48$ connected to the seven N-type MOS transistors, not shown, respectively. The LED elements $LED_41$, $LED_42, \ldots, LED_4768$ can be driven time-divisionally by alternatively turning the N-type MOS transistor on or off based on a drive signal output from the driver IC 211.

Figure 46:
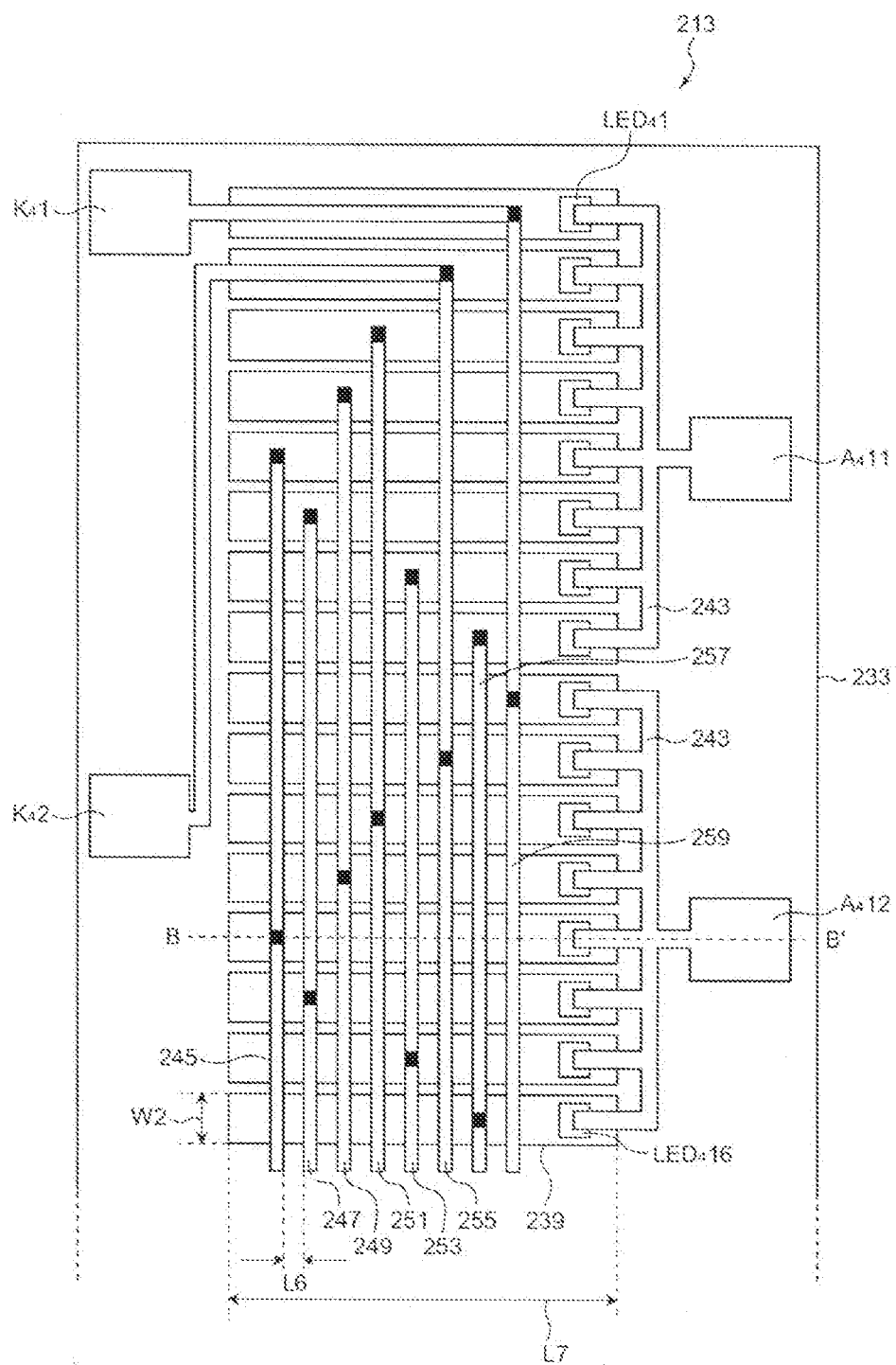
FIG. 46 is a further enlarged view of one part of the LED array shown in FIG. 38.
Figure 47:
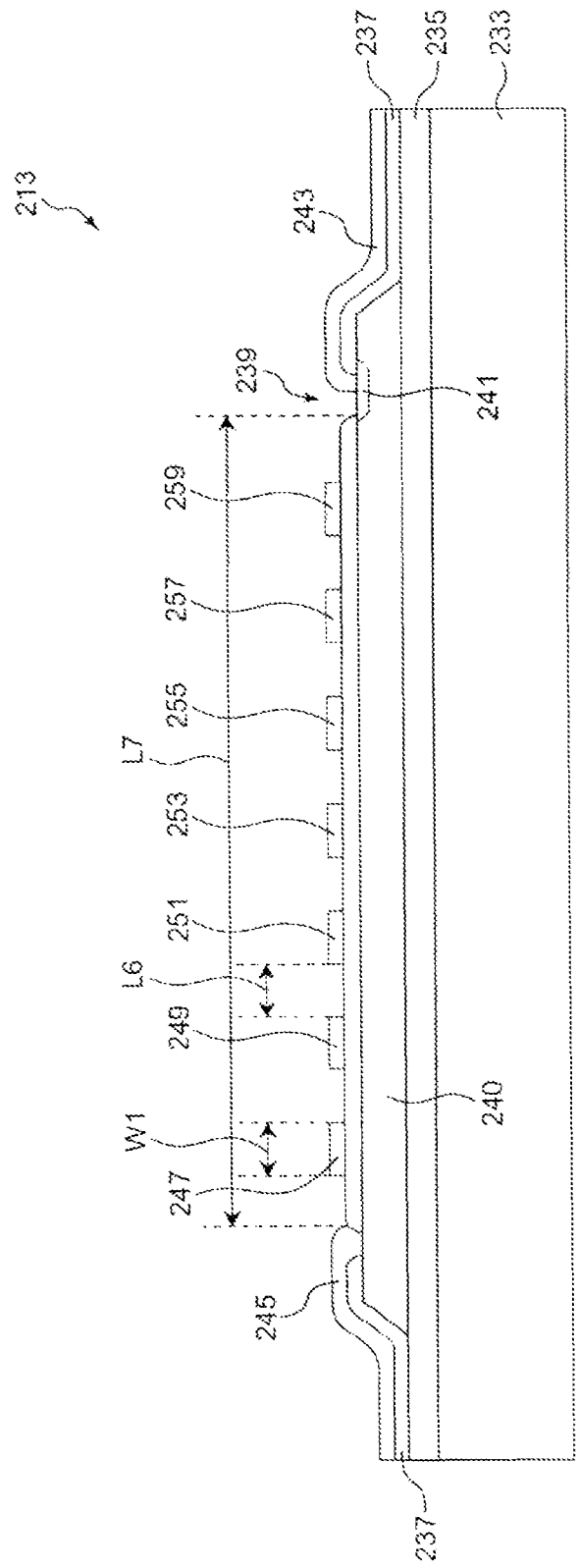
FIG. 47 is a cross-sectional view of the LED array along the line BB'.

FIGS. 46 and 47 show the LED array 213 described above. FIG. 46 is a top view of the LED array 211 while FIG. 47 is a cross-sectional view of the LED array 213 along the line B-B'. The LED array 213 is formed on a wafer substrate 233 made from materials such as GaAs, and individual chips are formed by a dicing method.

To form the LED elements $LED_41, LED_42, \ldots, LED_4768$, a current blocking layer 235 and an n-type diffusion region 240 made from an n-type AlGaAs layer are formed on the wafer substrate 233 by the MOCVD method, and then p-type impurities are diffused at positions to be provide with the LED elements by the photolithography method. The LED elements $LED_41, LED_42, \ldots, LED_4768$ are thereafter separated individually by grooving the p-type impurities down to a level of the current blocking layer 235 or the wafer substrate 233 by etching. Next, an interlayer insulating layer 237 is formed on surfaces of the LED elements $LED_41$, $LED_42, \ldots, LED_4768$, and a contact hole 239 is provided to a predetermined position by etching. Next, anode wires 243 for connecting the anode terminal pads $A_411 \sim A_418$, $A_421 \sim A_428, A_431 \sim A_438, \ldots, A_491 \sim A_498, A_41 \sim A_48$, $A_4B1 \sim A_4B8, A_4C1 \sim A_4C8$ to a p-type diffusion region 241 is laid on the LED elements $LED_41, LED_42, \ldots, LED_4768$ via the contact hole 239. Common wires 245, 247, 249, 251, 253, 255, 257, 259 connected to the n-type diffusion region 240 of the LED elements $LED_41, LED_42, \ldots, LED_4768$ of the LED are laid on the LED elements $LED_41, LED_42, \ldots, LED_4768$ of the LED.

Herein, on the condition that each of widths of the common wires 245, 247, 249, 251, 253, 255, 257, 259 is set to W1 while an interval therebetween is set to L6, an interval L7 between an inner end of the common wire 245 and the contact hole 239 is determined by an equation of $L7=7 \times W1+8 \times L6$. For example, in the case where drive current is supplied from the driver IC 211 connected to the anode terminal of the LED element $_413$ and the anode terminal pad $A_412$ via the anode wire 243 on the condition that electric potential of the common wire 245 required to drive the LED element $LED_413$ is set to approximately 0V while electric potential of the cathode terminal pad $K_45$ connected to the common wire 245 is set to approximately 0V, the drive current input into the LED element $LED_413$ flows the distance L7 via the n-type diffusion region 240 and reaches up to the common wire 245. The drive current reaches to the cathode terminal 261 via the common wire 245, thereby flowing out of the cathode terminal pad $K_45$, so that the LED element $LED_413$ emits light.

The drive current flows from the output terminal D0 of the driver IC 211 through the anode terminal pads $A_412$ into the LED element $LED_413$ but resistance of the anode wire 243, the common wire 245, and the cathode wire 261 is substantially vanishingly low compared with resist of the n-type diffusion area 240. That is, sheet resistance in the n-type diffusion region 240 has the biggest effect on flow of the drive current while the drive current flows through the LED element $LED_413$.

With the LED array 213, resistance R of the sheet resist in the whole n-type diffusion region 240 is set to following value.

Since the LED array 213 according to this embodiment has a 2400 dpi resolution, a dot pitch between the LED elements is set to about 10.6 μm in the case of 25.4 mm/2400. Where the n-type diffusion region 240 has W2 of 9.6 μm, W1 of 9.6 μm, and L6 of 1 μm, the aforementioned L7 is set to 50 μm. Sheet resistance Rs of the n-type diffusion region 240 is set to 70Ω/□, the resistance R while the drive current flows through the n-type diffusion region 240 is determined by an equation of R=Rs×L/W2, thereby being set to 365Ω.

As described above, in the LED array 213, the metal wires are connected using the n-type diffusion region 240 to form the matrix wire, thereby eliminating the necessity of forming the plurality of metal wiring layers to ensure connectivity in the intersecting part between the wires. Since formation of the plurality of metal wires is not necessary anymore, the required number of masks can be reduced and the number of times the photolithography process is executed can also be reduced. As a result, the production cost of the LED head having the LED arrays can be reduced.

Hereinafter, a fifth embodiment will be explained in detail.

A modification example of the LED array 213 according to the fourth embodiment will be explained in the fifth embodiment. The LED head according to the fifth embodiment is improved in the light extraction efficiency compared with the LED array 213.

Figure 48:
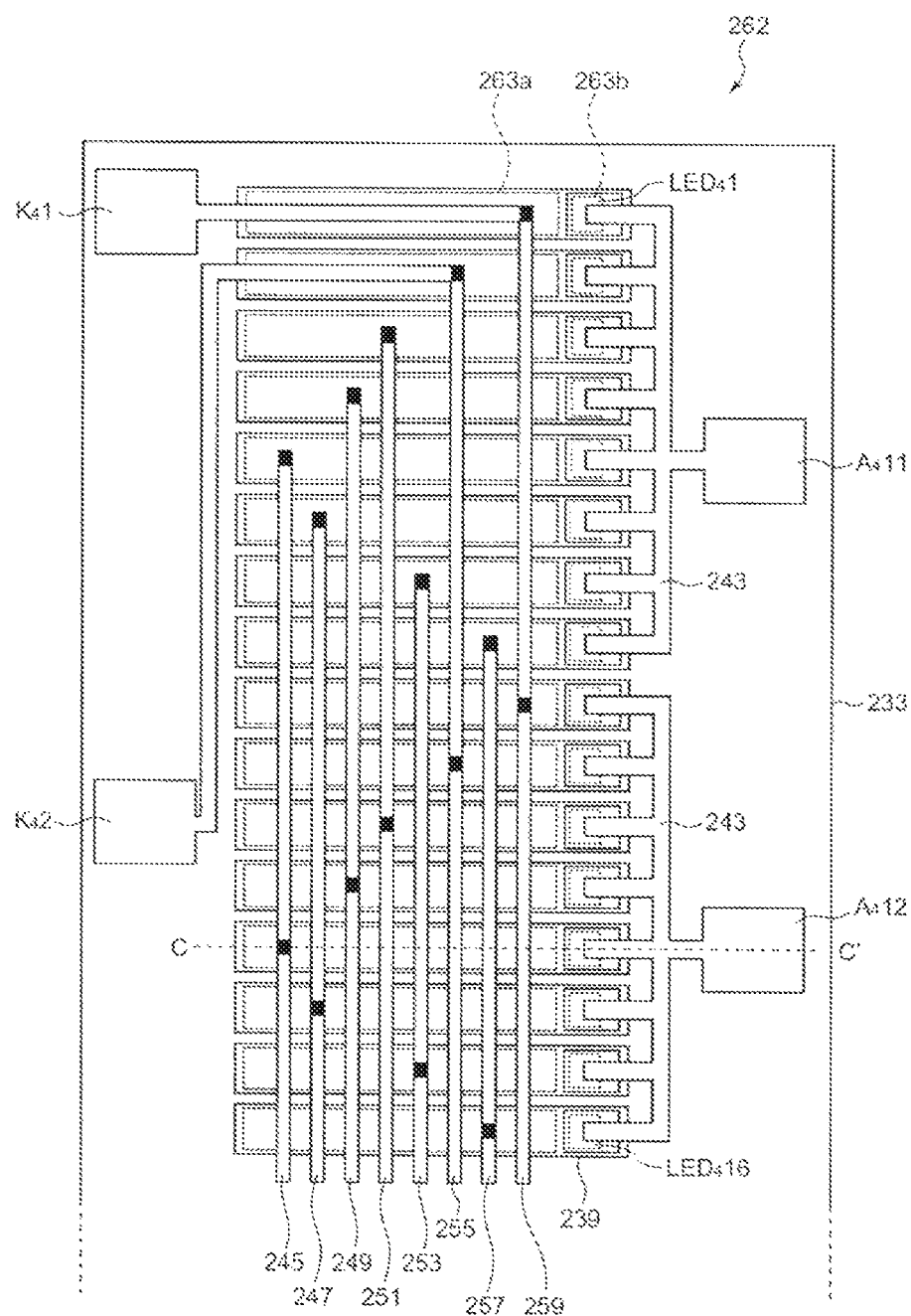
FIG. 48 is a top view of essential parts of an LED array according to a fifth embodiment, for illustrating a structure of the LED array.
Figure 49:
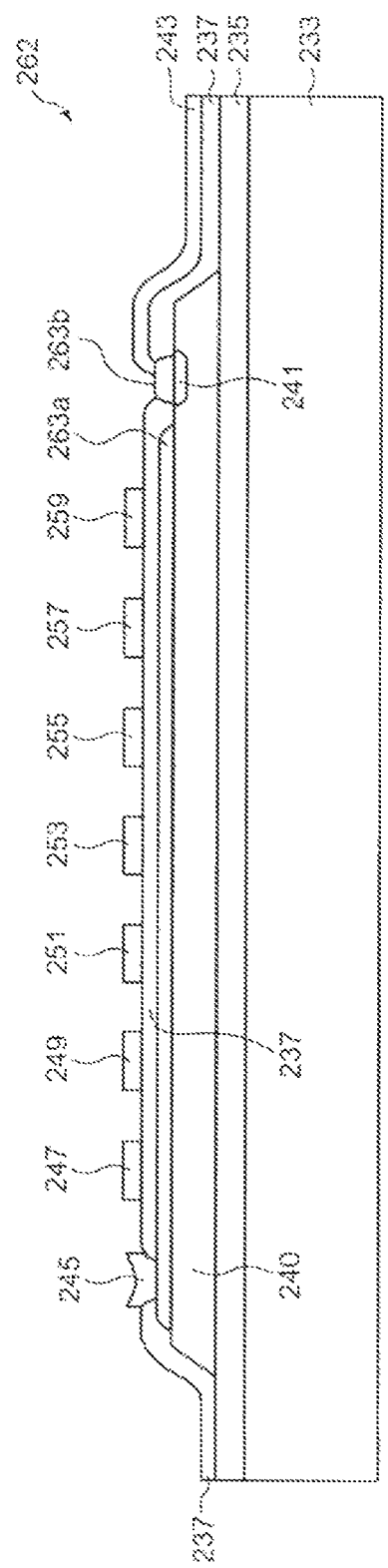
FIG. 49 is a cross-sectional view of the LED array along the line CC'.

As shown in FIGS. 48 and 49, an LED array 262 according to the fifth embodiment has a transparent electrode 263a between the n-type diffusion region 240 and the interlayer insulating layer 237 and a transparent electrode 263b between the p-type diffusion region 241 and the anode wire 243. It is to be noted that FIG. 48 is a top view of the LED array 262 while FIG. 49 is a cross-sectional view of the LED array 262 along the line C-C'. Hereinafter, the transparent electrodes 263a, 263b are collectively referred to as the transparent electrode 263 except the case of making a distinction therebetween.

It is desirable that materials with comparatively high transparency such as ITO (indium tin oxide) film or the like be used as the transparent electrode 263. Where a film thickness of the transparent electrode included in the LED array 262 is set to about 150 nm, the transparent electrode 263 can obtain the optical transparency of 80% or greater. The sheet resistance R of the transparent electrode 263 is set to about 10Ω/□.

To form the LED elements $LED_41$, $LED_42$, ..., $LED_4768$, the current blocking layer 235 and the n-type diffusion region 240 made from an n-type AlGaAs layer are formed on the wafer substrate 233 by the MOCVD method, and then the p-type impurities are diffused at positions to be provide with the LED elements $LED_41$, $LED_42$, ..., $LED_4768$ by the photolithography method. The LED elements $LED_41$, $LED_42$, ..., $LED_4768$ are thereafter separated individually by grooving the p-type impurities down to a level of the current blocking layer 235 or the wafer substrate 233 by etching. Next, an interlayer insulating layer 237 is formed on surfaces of the LED elements $LED_41$, $LED_42$, ..., $LED_4768$, and a contact hole 239 is provided to a predetermined position by etching. Next, the anode wires 243 for connecting the anode terminal pads $A_411$~$A_418$, $A_421$~$A_428$, $A_431$~$A_438$, ..., $A_491$~$A_498$, $A_41$~$A_48$, $A_4B1$~$A_4B8$, $A_4C1$~$A_4C8$ to the p-type diffusion region 241 is laid on the LED elements $LED_41$, $LED_42$, ..., $LED_4768$ via the contact hole 239. The common wires 245, 247, 249, 251, 253, 255, 257, 259 connected to the n-type diffusion region 240 of the LED elements $LED_41$, $LED_42$, ..., $LED_4768$ are laid on the LED elements $LED_41$, $LED_42$, ..., $LED_4768$.

The transparent electrode 263a is formed on an upper layer of the n-type diffusion region 240 while the transparent electrode 263b is formed on an upper layer of the p-type diffusion region 241. Those transparent electrodes 263 is formed by forming a film by sputtering method after formation of the p-type diffusion region 241 and then shaping the film in a predetermined form by the photolithography method. It is not particularly illustrated in this embodiment but it is also possible to form an Au layer with a thickness of between 10 nm and 20 nm between the transparent electrode 263a and the n-type diffusion region 240 or between the transparent electrode 263b and the p-type diffusion region 241. The aforementioned Au layer is formed before formation of the transparent electrodes 263. Formation of the Au layer described above enables good ohmic connection to be ensured without losing transparency between the transparent electrode 263a and the n-type diffusion region 240 or between the transparent electrode 263b and the p-type diffusion region 241.

Herein, on the condition that each of widths of the common wires 245, 247, 249, 251, 253, 255, 257, 259 is set to W1 while an interval therebetween is set to L6, an interval L7 between the inner end of the common wire 245 and the contact hole 239 is determined by the equation of L7=7×W1+8×L6. For example, in the case where drive current is supplied from the driver IC 211 connected to the anode terminal of the LED element $_413$ and the anode terminal pad $A_412$ via the anode wire 243 on the condition that electric potential of the common wire 245 required to drive the LED element $LED_413$ is set to approximately 0V while electric potential of the cathode terminal pad $K_45$ connected to the common wire 245 is set to approximately 0V, the drive current input into the LED element $LED_413$ flows the distance L7 via the n-type diffusion region 240 and reaches up to the common wire 245. The drive current reaches to the cathode terminal 261 via the common wire 245, thereby flowing out of the cathode terminal pad $K_45$, so that the LED element $LED_413$ emits light.

The drive current flows from the output terminal D0 of the driver IC 211 through the anode terminal pads $A_412$ into the LED element $LED_413$ but resistance of the anode wire 243, the common wire 245, and the cathode wire 261 is substantially vanishingly low compared with resist of the n-type diffusion area 240. Where a comparison as to sheet resistance is made between the n-type diffusion region 240 formed in a trapezoid shape and the transparent electrode 263a, the sheet resistance of the transparent electrode 263a is smaller. The cathode current of the main LED elements is to flow through the transparent electrode 263a. That is, the sheet resistance in the n-type diffusion region 240 has the biggest effect on flow of the drive current while the drive current flows through the LED element $LED_413$.

The resistance R of the sheet resist in the whole transparent electrode 263a is set to the following value.

Since the LED array according to this embodiment has a 2400 dpi resolution, a dot pitch between the LED elements is set to about 10.6 μm in the case of 25.4 mm/2400. Where the transparent electrode 263a has W2 of 9.6 μm, W1 of 9.6 μm, and L6 of 1 μm, the aforementioned L7 is set to 50 μm. The sheet resistance Rs of the n-type diffusion region 240 is set to 10Ω/□, the resistance R while the drive current flows through the n-type diffusion region 240 is determined by an equation of R=Rs×L/W2, thereby being set to 56Ω.

Placing the transparent electrodes 263 on the upper layers of the n-type diffusion region 240 and the p-type diffusion region 241 inside the LED array 262 achieves reduction in an area of an overlapped portion between the anode wires 243 and the p-type diffusion region 241 compared with an area of the corresponding part in the LED array 201, thereby facilitating upward extraction of the light which is emitted at a surface boundary between the n-type diffusion region 240 and the p-type diffusion region 241. Additionally, the transparent electrode 263 is placed on the upper layer of the n-type diffusion region 240 to electrically connect the transparent electrodes 263, leading to reduction in wire resistance therebetween, so that a voltage variation can be reduced inside the chip at the time of turning on LED.

This invention is not limited to the above-embodiment but can be modified without departing from the spirit of the invention.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention should not be limited by the specification, but be defined by the claims set forth below.

What is claimed is:

1. A light emitting element head having a drive device for driving a plurality of light emitting elements, the drive device comprising:
   a semiconductor substrate having a longitudinal shape;
   data input terminals for inputting turning on and off information for turning the plurality of light emitting elements on and off;
   a power terminal for connecting to a power supply;
   a clock terminal for inputting a clock signal for transmitting sequentially the turning on and off information;
   a plurality of drive control circuits arranged on the semiconductor substrate, the plurality of drive control circuits including a plurality of drive circuits for driving the plurality of light emitting elements; and
   a plurality of circuit sections, the plurality of circuit sections including a plurality of writing control circuits for outputting a writing command;
   wherein the data input terminals, the power terminal, and the clock terminal are arranged at an edge portion side of the semiconductor substrate, and
   the plurality of drive control circuits are arranged substantially in line with the plurality of circuit sections along a longitudinal direction of the substrate.

2. The light emitting element head according to claim 1, wherein the edge portion is an end portion of a transverse direction with respect to a longitudinal direction of the semiconductor substrate.

3. The light emitting element head according to claim 2, wherein the data input terminals, the power terminal, and the clock terminal are arranged along a longitudinal direction of the semiconductor substrate.

4. The light emitting element head according to claim 3, wherein the clock terminal is arranged on a side inside the data input terminals on the semiconductor substrate.

5. The light emitting element head according to claim 3, wherein the clock terminal and the power terminal are arranged in an adjacent manner to each other.

6. The light emitting element head according to claim 1, further comprising a power-source wire extending from the power terminal, the power-source wire arranged on the semiconductor substrate in a manner extending in a longitudinal direction of the semiconductor substrate.

7. An image forming apparatus comprising the light emitting element head according to claim 1.

8. The light emitting element head according to claim 1, wherein the semiconductor substrate includes a plurality of power terminals at an edge portion and at a center portion in a longitudinal direction of the semiconductor substrate.

9. The light emitting element head according to claim 8, wherein the power terminal arranged at the edge portion is a first power terminal supplying electric power and the power terminal arranged at the center portion is a second power terminal serving as a ground.

10. The light emitting element head according to claim 1, wherein the drive control circuits are arranged between the circuit sections.

11. The light emitting element head according to claim 1, further comprising:
    data output terminals; and
    data input terminals,
    wherein the data input terminals are arranged at one end in the longitudinal direction of the semiconductor substrate and the data output terminals are arranged at the other end in the longitudinal direction of the semiconductor substrate.

12. A light emitting element head having a drive device having at least one substrate mounted with a plurality of light emitting elements and a plurality of drive circuits for driving the plurality of light emitting elements thereon, the drive device comprising:
    data input terminals for inputting turning on and off information for turning the plurality of light emitting elements on and off;
    a power terminal for connecting to a power supply;
    a clock terminal for inputting a clock signal for transmitting sequentially the turning on and off information;
    a plurality of circuit sections including a plurality of writing control circuits for outputting a writing command; and
    a plurality of drive control circuits including a plurality of drive circuits for driving the plurality of light emitting elements;
    wherein the substrate has a longitudinal shape,
    wherein the data input terminals, the power terminal, and the clock terminal are arranged at an edge portion side of the substrate,
    wherein the plurality of light emitting elements and the plurality of drive control circuits are arranged along a longitudinal direction of the substrate, and
    wherein the plurality of drive control circuits are arranged substantially in line with the plurality of circuit sections along a longitudinal direction of the substrate.

13. The light emitting element head according to claim 12, wherein the edge portion is an end portion of a transverse direction with respect to a longitudinal direction of the substrate.

14. The light emitting element head according to claim 13, wherein the data input terminals, the power terminal, and the clock terminal are arranged along a longitudinal direction of the substrate.

15. The light emitting element head according to claim 12, wherein the clock terminal is arranged on a side inside the data input terminals on the substrate.

16. The light emitting element head according to claim 12, wherein the clock terminal and the power terminal are arranged in an adjacent manner to each other.

17. The light emitting element head according to claim 12, further comprising a power-source wire extending from the power terminal, the power-source wire arranged on the substrate in a manner extending in a longitudinal direction of the substrate.

18. The light emitting element head according to claim 12, wherein the substrate comprises a first substrate mounting the plurality of the light emitting elements thereon, a second substrate mounting the plurality of drive control circuits thereon, and a third substrate mounting the first and the second substrates thereon.

19. An image forming apparatus comprising the light emitting element head according to claim 12.

20. The light emitting element head according to claim 12, wherein the semiconductor substrate includes a plurality of power terminals at an edge portion and at a center portion in a longitudinal direction of the substrate.

21. The light emitting element head according to claim 20, wherein the power terminal arranged at the edge portion is a first power terminal supplying electric power and the power terminal arranged at the center portion is a second power terminal serving as a ground.

22. The light emitting element head according to claim 12, wherein the drive control circuits are arranged between the circuit sections.

23. The light emitting element head according to claim 12, further comprising:
   data output terminals; and
   data input terminals,
   wherein the data input terminals are arranged at one end in the longitudinal direction of the substrate and the data output terminals are arranged at the other end in the longitudinal direction of the substrate.

* * * * *